(12) United States Patent
Kuroda et al.

(10) Patent No.: US 8,222,348 B2
(45) Date of Patent: Jul. 17, 2012

(54) EPOXY SILICONE AND PROCESS FOR PRODUCING SAME, AND CURABLE MIX COMPOSITION USING SAME AND USE THEREOF

(75) Inventors: Yoshito Kuroda, Tokyo (JP); Masako Yokoyama, Tokyo (JP); Hiroji Oda, Tokyo (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 119 days.

(21) Appl. No.: 12/593,170

(22) PCT Filed: Apr. 15, 2008

(86) PCT No.: PCT/JP2008/057344
§ 371 (c)(1),
(2), (4) Date: Jan. 8, 2010

(87) PCT Pub. No.: WO2008/133108
PCT Pub. Date: Nov. 6, 2008

(65) Prior Publication Data
US 2010/0120975 A1    May 13, 2010

(30) Foreign Application Priority Data

Apr. 17, 2007   (JP) ................. 2007-107713
Apr. 17, 2007   (JP) ................. 2007-107714

(51) Int. Cl.
*C08G 59/60*   (2006.01)
*C08G 67/00*   (2006.01)
*C08G 77/04*   (2006.01)

(52) U.S. Cl. ............... 525/446; 524/588; 528/27

(58) Field of Classification Search .......... 525/446; 524/588; 528/27
See application file for complete search history.

(56) References Cited

U.S. PATENT DOCUMENTS

| | | | |
|---|---|---|---|
| 5,397,813 A | 3/1995 | Eckberg et al. | |
| 5,523,374 A | 6/1996 | Bard et al. | |
| 5,952,439 A | 9/1999 | Morita et al. | |
| 6,245,828 B1 | 6/2001 | Weinmann et al. | |
| 6,313,255 B1 | 11/2001 | Rubinsztajn | |
| 7,429,636 B2 | 9/2008 | Asch et al. | |
| 2005/0123776 A1 | 6/2005 | Yoshikawa | |
| 2006/0111491 A1 | 5/2006 | Asch et al. | |

FOREIGN PATENT DOCUMENTS

| | | |
|---|---|---|
| EP | 1 947 128 A1 | 7/2008 |
| JP | 04-084444 A | 3/1992 |
| JP | 6-263989 A | 9/1994 |
| JP | 7-216308 A | 8/1995 |
| JP | 10-182826 A | 7/1998 |
| JP | 3263177 B | 12/2001 |
| JP | 2005-093569 A | 4/2005 |
| JP | 2005-171021 A | 6/2005 |
| JP | 2005-523980 | 8/2005 |
| JP | 2005-523980 A | 8/2005 |
| JP | 2005-529989 A | 10/2005 |
| JP | 2006013347 A * | 1/2006 |
| JP | 2006-213760 A | 8/2006 |
| JP | 2006-213761 A | 8/2006 |
| JP | 2006-213762 A | 8/2006 |
| JP | 2007-246602 A | 9/2007 |
| WO | WO 98/22521 | 5/1998 |
| WO | WO 2007/046399 A1 | 4/2007 |

OTHER PUBLICATIONS

Izvestiya Akademii Nauk SSSR, Seriya Khimicheskaya, (1977), (2), 410-413.

Supplementary European Search Report dated Feb. 15, 2012 for the European application No. 08740430.7.

* cited by examiner

*Primary Examiner* — David W Wu
*Assistant Examiner* — Chun-Cheng Wang
(74) *Attorney, Agent, or Firm* — Morgan, Lewis & Bockius LLP

(57) ABSTRACT

An epoxy silicon, which comprises at least a compound represented by the following general formula (1), and a compound represented by the following general formula (2); and which is represented by an average composition formula (3), wherein a value of $[g/(a+b+c+d+e+f+g+h+i+j)]$ falls within a range of 0.020 or less.

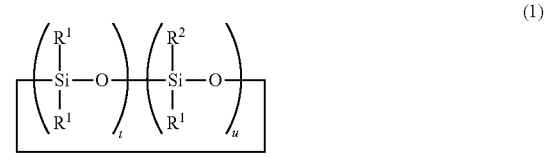

(1)

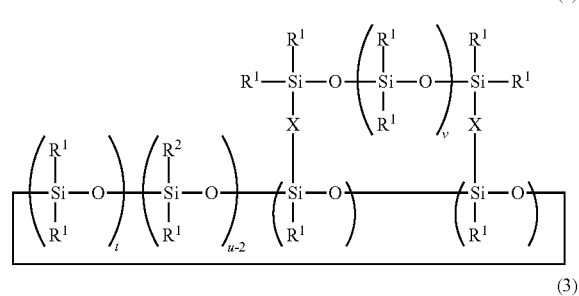

(2)

$(R^1{}_2YSiO_{1/2})_a(R^3{}_3SiO_{1/2})_b(R^3{}_2SiO_{2/2})_c$
$(R^3YSiO_{2/2})_d(R^1ZSiO_{2/2})_e(R^1R^2SiO_{2/2})_f$
$(R^1HSiO_{2/2})_g(R^3SiO_{3/2})_h(YSiO_{3/2})_i(SiO_{4/2})_j$ (3)

18 Claims, No Drawings

EPOXY SILICONE AND PROCESS FOR PRODUCING SAME, AND CURABLE MIX COMPOSITION USING SAME AND USE THEREOF

TECHNICAL FIELD

The present invention relates to epoxy silicone suitably used as a main component of a curable mix composition for use in light-emitting device sealing materials, lenses, and the like.

BACKGROUND ART

Conventionally, an epoxy resin composition using an acid anhydride-based hardening agent provides a transparent hardened material and has been suitably used as a sealing material for light-emitting devices having high heat resistance, such as light-emitting diodes and photodiodes. However, with recent development of high-performance optical semiconductors, a hardened material, which has not only good transparency and high heat resistance but also excellent light resistance, oxidation resistance and crack resistance at the time of a hot and cold cycle in accordance with the on/off cycle of an LED, has been required as a sealing resin. Conventional compositions containing an epoxy resin, such as bisphenol A-based epoxy resin and bisphenol F-based epoxy resin, as a main component, actually do not have sufficient properties.

Epoxy silicone having a siloxane skeleton as a repeat unit and an epoxy group as an organic group has an excellent transparency and heat resistance, which is provided by an epoxy resin, and additionally, light resistance and oxidation resistance, which is provided by silicone. In addition to these, it is further expected that epoxy silicone may have flexibility. For the reason, epoxy silicone has drawn attention as a high-performance sealing material.

For example, Patent Document 1 proposes epoxy silicone, which has a T structure as an essential repeat unit and an epoxy group-containing organic group within the range of 0.1 to 40 mol % based on whole organic groups binding to a silicon atom in a molecule. However, the epoxy silicone formed of a T structure as a main component is brittle and therefore, it is difficult to satisfy crack resistance required for a light-emitting device sealing material.

Patent Document 2 discloses epoxy siloxane formed of a reaction product of vinyl silicone, hydrogenated silyl functional silicone and an olefin epoxy compound. Furthermore, Patent Document 3 discloses an epoxy group-containing organopolysiloxane formed of a reaction product of an organopolysiloxane having a hydroxyl group at both ends, an organohydropolysiloxane, and an epoxy group and alkenyl group-containing compound. These polysiloxanes are used as an ultraviolet curable mix composition for strippable paint. However, these specifications describe nothing about optical uses thereof such as optical semiconductors.

Patent Documents 4 and 5 describe an organohydrogensiloxane compound, which is obtained by hydrosilanizing 5 to 50% of the SiH bonds of an organohydrogensilicone compound (which is obtained by the reaction between organohydrogencyclosiloxane and organopolysiloxane having an unsaturated aliphatic group) with allyl-glycidyl ether or vinylcyclohexene epoxide, and the use thereof in hardened coating. The characteristics of the organohydrogensiloxane compound reside in that the SiH units are partly hydrosilylated with an epoxy compound and part of the SiH units remains unreacted. The SiH units unreacted are used further in a crosslinking reaction as release-coating materials, and the like. However, these specifications describe nothing about application to optical uses thereof such as optical semiconductors.

Patent Document 6 discloses a telechelic siloxane polymer having a plurality of epoxy groups at an end. This polymer is obtained by the reaction of a polyorganosiloxane having a vinyl group at an end, and an organosiloxane oligomer having at least one SiH unit with an excessive amount of alkenyl group-containing epoxy compound. The specification describes use of this polymer as a release-coating material but nothing about application to optical uses thereof such as optical semiconductors.

Patent Document 7 describes a composition containing a silicone compound having a molecular weight within a specific range and having at least two epoxy groups within a molecule, and use of the composition in an optical semiconductor sealing material. However, the resin composition is insufficient in light resistance. The crack resistance and adhesiveness thereof do not reach satisfactory levels.

In addition, the above Patent Documents 2 to 7 disclose an epoxy silicone structure having a ring structure formed of a siloxane unit, and an epoxy unit in a molecule; however, disclose nothing about a bicyclo structure. The physical properties thereof are neither disclosed nor suggested.

Patent Document 1: Japanese Patent No. 3263177
Patent Document 2: Japanese Patent Laid-Open No. 7-216308
Patent Document 3: Japanese Patent Laid-Open No. 10-182826
Patent Document 4: National Publication of International Patent Application No. 2005-523980
Patent Document 5: National Publication of International Patent Application No. 2005-529989
Patent Document 6: U.S. Pat. No. 6,313,255
Patent Document 7: Japanese Patent Laid-Open No. 2005-171021

DISCLOSURE OF THE INVENTION

Problems to be Solved by the Invention

It is an object of the present invention to provide epoxy silicone having not only good transparency but also excellent light resistance, heat resistance, and heat discoloration resistance, and further having crack resistance and adhesiveness in a hot and cool cycle; provide a curable mix composition for use in sealing a light emitting device excellent in adhesiveness between a device and a packaging material, free of occurrence of a crack and capable of suppressing a decrease in brightness for a long time; and provide a light emitting component formed of the resin composition.

It is another object of the present invention is to provide a curable mix composition suitable for injecting molding, and capable of providing a rigid material after hardened and also excellent in dimensional stability, suitable for a lens material.

Means for Solving the Problems

In view of the aforementioned problems, the present inventors conducted intensive studies on a siloxane skeleton structure. As a result, they found that the above problems can be solved by epoxy silicone having a specific skeleton structure, that is, having a monocyclic structure formed of a siloxane skeleton and a bicyclo structure, simultaneously. Based on the finding, the present invention was accomplished.

More specifically, the present invention is as follows:

[1] An epoxy silicone, which comprises at least a compound represented by the following general formula (1), and a compound represented by the following general formula (2); and which is presented by an average composition formulas (3), wherein a value of [g/(a+b+c+d+e+f+g+h+i+j)] falls within a range of 0.020 or less;

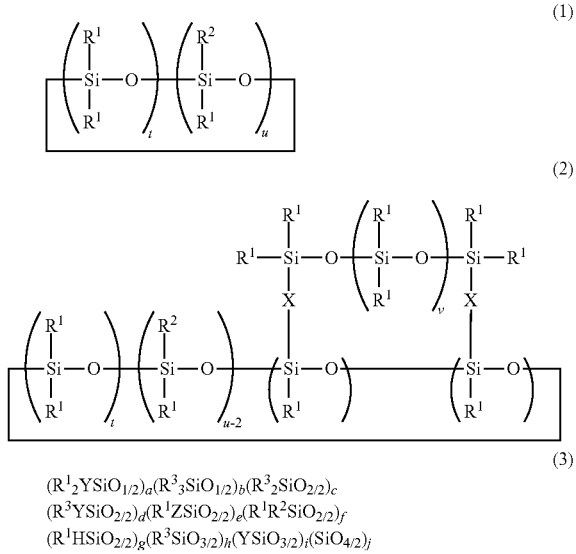

$(R^1{}_2YSiO_{1/2})_a(R^3{}_3SiO_{1/2})_b(R^3{}_2SiO_{2/2})_c$
$(R^3YSiO_{2/2})_d(R^1ZSiO_{2/2})_e(R^1R^2SiO_{2/2})_f$ (3)
$(R^1HSiO_{2/2})_g(R^3SiO_{3/2})_h(YSiO_{3/2})_i(SiO_{4/2})_j$ wherein $R^1$ each independently represents at least one organic group which is selected from the group consisting of A) a monovalent aliphatic organic group having an aliphatic hydrocarbon unit, which is formed of at least one structure which is selected from the group consisting of substituted or unsubstituted chain, branched and cyclic structures, and which has carbon atoms of 1 or more and 24 or less and oxygen atoms of 0 or more and 5 or less, B) a monovalent aromatic organic group, which is a substituted or unsubstituted aromatic hydrocarbon unit, having an aliphatic hydrocarbon unit, which is formed of at least one structure which is selected from the group consisting of optionally substituted or unsubstituted chain, branched and cyclic structures, which has carbon atoms of 6 or more and 24 or less and oxygen atoms of 0 or more and 5 or less, and C) a monovalent organic group having an aliphatic and/or aromatic hydrocarbon unit, which is formed of at least one structure which is selected from the group consisting of a substituted or unsubstituted chain, branched and cyclic structures, and which has carbon atoms of 5 or more and 26 or less, oxygen atoms of 0 or more and 5 or less and a single silicon atom;

$R^2$ each independently represents D) an organic group containing an epoxy group having an aliphatic hydrocarbon unit, which is formed of at least one structure which is selected from the group consisting of substituted or unsubstituted chain, branched and cyclic structures, and which has carbon atoms of 4 or more and 24 or less and oxygen atoms of 1 or more and 5 or less;

$R^3$ each independently represents at least one organic group which is selected from the group consisting of A) a monovalent aliphatic organic group having an aliphatic hydrocarbon unit, which is formed of at least one structure which is selected from the group consisting of substituted or unsubstituted chain, branched and cyclic structures and which has carbon atoms of 1 or more and 24 or less and oxygen atoms of 0 or more and 5 or less, B) a monovalent aromatic organic group, which is a substituted or unsubstituted aromatic hydrocarbon unit, having an aliphatic hydrocarbon unit, which is formed of at least one structure which is selected from the group consisting of optionally substituted or unsubstituted chain, branched and cyclic structures, and which has carbon atoms of 6 or more and 24 or less and oxygen atoms of 0 or more and 5 or less, C) a monovalent organic group having an aliphatic and/or aromatic hydrocarbon unit, which is formed of at least one structure which is selected from the group consisting of a substituted or unsubstituted chain, branched and cyclic structures, and which has carbon atoms of 5 or more and 26 or less, oxygen atoms of 0 or more and 5 or less and a single silicon atom, and E) a monovalent aliphatic organic group formed of at least one structure which is selected from the group consisting of substituted or unsubstituted chain and branched structures, and which has carbon atoms (including a carbon-carbon double bond) of 2 or more and 6 or less;

X represents a divalent hydrocarbon group formed of at least one structure which is selected from the group consisting of substituted or unsubstituted chain and branched structures and which has carbon atoms of 2 or more and 6 or less;

Y each independently represents a divalent hydrocarbon group formed of at least one structure which is selected from the group consisting of substituted or unsubstituted chain and branched structures and which has carbon atoms of 2 or more and 6 or less;

Z represents a bond with the divalent hydrocarbon group Y;

wherein t each independently represents an integer of 0 or more; u each independently represents an integer of 3 or more; v represents an integer of 0 or more; furthermore, a, b, c, d, e, f, g, h, i and j represent the numbers of mole of individual structural units present in epoxy silicone (1 mole); a, e and f are each a value beyond 0; and b, c, d, g, h, i and j are each a value of 0 or more; and e=a+d+i is satisfied; and the chain in the general formulas (1) and (2) may be random or block.

[2] The epoxy silicone according to item [1], wherein a ratio of the content [WB] of the compound represented by the general formula (2) to the content [WA] of the compound represented by the general formula (1), that is, a ratio of [WB]/[WA], which is calculated from the following formula (1) based on the intensity values of peaks measured by the Matrix Assisted Laser Desorption/Ionization time-of-flight Mass Spectrometry, is 0.30 or more and 3.00 or less.

$$[WB]/[WA] = \frac{\text{Intensity of peak corresponding to the sum of the mass corresponding to a structure represented by the general formula (2) and the mass (23) of sodium}}{\text{Intensity of peak corresponding to the sum of the mass corresponding to a structure represented by the general formula (1) and the mass (23) of sodium}} \quad (I)$$

[3] The epoxy silicone according to item [1] or [2], wherein the value of v in the general formula (2) is 0 or more and 9 or less.

[4] The epoxy silicone according to any of items [1] to [3], wherein a value of [(h+i+j)/(a+b+c+d+e+f+g+h+i+j)] of the epoxy silicone represented by the average composition formula (3) falls within a range of 0.040 or less; and the ratio of the content of the compound represented by the general formula (2) to the content of the compound represented by the general formula (1), that is, the ratio of [WB]/[WA], which is defined by formula (1), is 0.30 or more and 3.00 or less.

[5] The epoxy silicone according to any of items [1] to [4], wherein the content of a component having a molecular weight of 800 or less in the epoxy silicone represented by the average composition formula (3) falls within a range of 10% or more and 90% or less.

[6] The epoxy silicone according to any of items [1] to [5], wherein an epoxy value falls within a range of 0.15 or more and 0.50 or less.

[7] A curable mix composition comprising:
the epoxy silicone according to any of items [1] to [6] in an amount of 100 parts by mass; and
a hardening agent for an epoxy resin in an amount of 1 part by mass or more and 200 parts by mass or less.

[8] The curable mix composition according to item [7], further comprising:
a hardening accelerator in an amount of 0.001 part by mass or more and 10 parts by mass or less.

[9] A curable mix composition, comprising:
the epoxy silicone according to any of items [1] to [6] in an amount of 100 parts by mass; and
a cationic polymerization catalyst in an amount of 0.001 part by mass or more and 10 parts by mass or less.

[10] An encapsulant for a light-emitting device, comprising the curable mix composition according to any of items [7] to [9].

[11] A light-emitting component sealed with the encapsulant for a light-emitting device according to item [10].

[12] A lens formed of the curable mix composition according to any of items [7] to [9].

[13] A process for producing the epoxy silicone according to any of items [1] to [6], comprising
a single step of adding a mixture of silicone having a carbon-carbon double bond and represented by the following average composition formula (6) including at least silicone having a carbon-carbon double bond and represented by the following general formula (5) and a vinyl compound <B> including a compound <A> having a carbon-carbon double bond and an epoxy group simultaneously to a SiH unit of organohydrogensilicone represented by the following general formula (4) in the presence of a hydrosilylation catalyst,

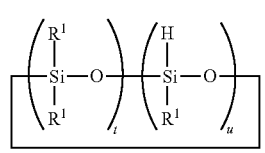

(4)

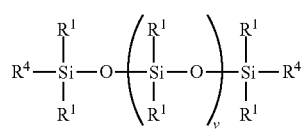

(5)

$(R^4R^1_2SiO_{1/2})_k(R^1_3SiO_{1/2})_l$
$(R^1_2SiO_{2/2})_m(R^1R^4SiO_{2/2})_n$
$(R^1SiO_{3/2})_o(R^4SiO_{3/2})_p(SiO_{4/2})_q$ (6)

wherein $R^1$, $R^2$ and $R^3$ are the same as defined above, $R^4$ each independently represents a monovalent aliphatic organic group formed of at least one structure which is selected from the group consisting of substituted or unsubstituted chain and branched structures and which has carbon atoms (including a carbon-carbon double bond) of 2 or more and 6 or less;
wherein t, u and v are the same as defined above, k, l, m, n, o, p and q represent the numbers of mole of individual structural units present in silicone (1 mole) having a carbon-carbon double bond; k is a value beyond 0; and l, m, n, o, p and q are each a value of 0 or more; and
the chain in the general formula (4) may be random or block.

[14] The process for producing the epoxy silicone according to item [13], wherein individual compounds are added in combination to a reaction system such that a number of mole (r1) of a SiH unit of organohydrogensilicone represented by the general formula (4);
a number of mole (r2) of the carbon-carbon double bond of silicone having a carbon-carbon double bond and represented by the general formula (5); a number of mole (r3) of the carbon-carbon double bond of silicone having a carbon-carbon double bond and represented by the average composition formula (6) except silicone having a carbon-carbon double bond and represented by the general formula (5);
a number of mole (r4) of the carbon-carbon double bond of the compound <A> having a carbon-carbon double bond and an epoxy group; and a number of mole (r5) of the carbon-carbon double bond of a compound <B> except the compound <A> having a carbon-carbon double bond and an epoxy group, simultaneously satisfy the following formulas (A1) to (A5), and subjected to an addition reaction in the presence of a hydrosilylation catalyst.

$0.10 \leq r2/r1 \leq 0.75$      formula (A1)

$0.25 \leq r4/r1$      formula (A2)

$0 \leq r3$      formula (A3)

$0 \leq r5$      formula (A4)

$1 \leq (r2+r3+r4+r5)/r1 \leq 5$      formula (A5)

[15] The process for producing the epoxy silicone according to any of items [1] to [6], comprising a two-stage process including:
a first step of adding a vinyl compound <B> including a compound <A> having a carbon-carbon double bond, and an epoxy group to a SiH unit of organohydrogensilicone represented by the following general formula (4); and
a second step of adding silicone having a carbon-carbon double bond and represented by the following average composition formula (6) including at least silicone having a carbon-carbon double bond and represented by the following general formula (5), in the presence of a hydrosilylation catalyst,

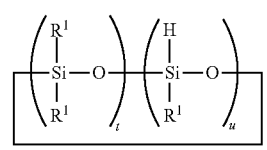

(4)

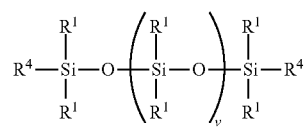

(5)

-continued $$(R^4R^1{}_2SiO_{1/2})_k(R^1{}_3SiO_{1/2})_l \\ (R^1{}_2SiO_{2/2})_m(R^1R^4SiO_{2/2})_n \\ (R^1SiO_{3/2})_o(R^4SiO_{3/2})_p(SiO_{4/2})_q \quad (6)$$

wherein $R^1$, $R^2$, $R^3$ and $R^4$ are the same as defined above; t, u, v, k, l, m, n, o, p and q in the formula are the same as defined above; and the chain in the general formula (4) may be random or block.

[16] The process for producing the epoxy silicone according to item [15] above, wherein, in the first step, individual compounds are added in combination to a reaction system such that a number of mole (s1) of the SiH unit of organohydrogensilicone represented by the general formula (4);

a number of mole (s2) of the carbon-carbon double bond of the compound <A> having a carbon-carbon double bond and an epoxy group; and a number of mole (s3) of the carbon-carbon double bond of a vinyl compound <B> except the compound <A> having a carbon-carbon double bond and an epoxy group simultaneously satisfy the following formulas (B1) to (B3), and subjected to an addition reaction; and subsequently, in the second step, individual compounds are added in combination to the reaction system such that the numbers of mole (s1) to (s3); a number of mole (s4) of the carbon-carbon double bond of silicone having a carbon-carbon double bond and represented by the general formula (5); and a number of mole (s5) of the carbon-carbon double bond of silicone having a carbon-carbon double bond and represented by the average composition formula (6) except the silicone having a carbon-carbon double bond and represented by the general formula (5), simultaneously satisfy the following formulas (B4) to (B6), and subjected to an addition reaction, in the presence of a hydrosilylation catalyst.

$$0 \leq s3 \quad \text{formula (B1)}$$

$$0.25 \leq s2/s1 \leq 0.90 \quad \text{formula (B2)}$$

$$0.25 \leq (s2+s3)/s1 \leq 0.90 \quad \text{formula (B3)}$$

$$0 \leq s5 \quad \text{formula (B4)}$$

$$0.10 \leq s4/s1 \quad \text{formula (B5)}$$

$$1.0 \leq (s4+s5)/[s1-(s2+s3)]3.0 \quad \text{formula (B6)}$$

Advantages of the Invention

According to the present invention, it is possible to provide epoxy silicone having transparency, light resistance, heat resistance, heat discoloration resistance, crack resistance and adhesiveness, and suitable for use in a sealing material for a light-emitting device; a curable mix composition for sealing a light-emitting device, containing the epoxy silicone, and a light-emitting component such as light-emitting diode, formed of the resin composition and having excellent adhesiveness between a device and a packaging material, free of occurrence of a crack and capable of suppressing a decrease in brightness for a long time.

According to the present invention, it is also possible to provide a curable mix composition suitable for injection molding and rigid after hardened, excellent in dimensional stability and suitable as a lens material.

BEST MODE FOR CARRYING OUT THE INVENTION

The epoxy silicone in the present invention is one which comprises at least a compound represented by the following general formula (1), and a compound represented by the following general formula (2); and which is represented by an average composition formula (3),

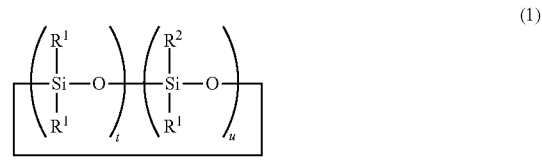

(1)

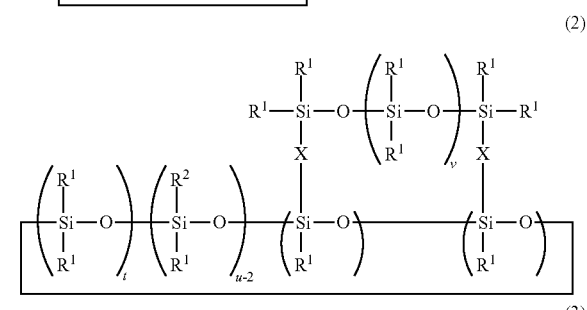

(2)

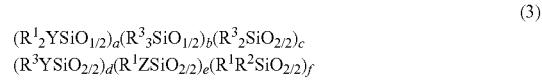

$$(R^1{}_2YSiO_{1/2})_a(R^3{}_3SiO_{1/2})_b(R^3{}_2SiO_{2/2})_c \\ (R^3YSiO_{2/2})_d(R^1ZSiO_{2/2})_e(R^1R^2SiO_{2/2})_f \\ (R^1HSiO_{2/2})_g(R^3SiO_{3/2})_h(YSiO_{3/2})_i(SiO_{4/2})_j$$

(3)

wherein $R^1$ each independently represents at least one organic group which is selected from the group consisting of A) a monovalent aliphatic organic group having an aliphatic hydrocarbon unit, which is formed of at least one structure which is selected from the group consisting of substituted or unsubstituted chain, branched and cyclic structures, and which has carbon atoms of 1 or more and 24 or less and oxygen atoms of 0 or more and 5 or less, B) a monovalent aromatic organic group, which is a substituted or unsubstituted aromatic hydrocarbon unit, having an aliphatic hydrocarbon unit, which is formed of at least one structure which is selected from the group consisting of optionally substituted or unsubstituted chain, branched and cyclic structures, and which has carbon atoms of 6 or more and 24 or less and oxygen atoms of 0 or more and 5 or less, and C) a monovalent organic group having an aliphatic and/or aromatic hydrocarbon unit, which is formed of at least one structure which is selected from the group consisting of a substituted or unsubstituted chain, branched and cyclic structures, and which has carbon atoms of 5 or more and 26 or less, oxygen atoms of 0 or more and 5 or less and a single silicon atom;

$R^2$ each independently represents D) an organic group containing an epoxy group having an aliphatic hydrocarbon unit, which is formed of at least one structure which is selected from the group consisting of substituted or unsubstituted chain, branched and cyclic structures, and which has carbon atoms of 4 or more and 24 or less and oxygen atoms of 1 or more and 5 or less;

$R^3$ each independently represents at least one organic group which is selected from the group consisting of A) a monovalent aliphatic organic group having an aliphatic hydrocarbon unit, which is formed of at least one structure which is selected from the group consisting of substituted or unsubstituted chain, branched and cyclic structures and which has carbon atoms of 1 or more and 24 or less and oxygen atoms of 0 or more and 5 or less, B) a monovalent aromatic organic group, which is a substituted or unsubstituted aromatic hydrocarbon unit, having an aliphatic hydrocarbon unit, which is formed of at least one structure which is selected from the group consisting of optionally substituted or unsubstituted chain, branched and cyclic structures, and which has carbon atoms of 6 or more and 24 or less and oxygen atoms of 0 or more and 5 or less, C) a monovalent organic group having an aliphatic and/or aromatic hydrocarbon unit, which is formed of at least one structure which is selected from the group consisting of a substituted or unsubstituted chain, branched and cyclic structures, and which has carbon atoms of 5 or more and 26 or less, oxygen atoms of 0 or more and 5 or less and a single silicon atom, and E) a monovalent aliphatic organic group formed of at least one structure which is selected from the group consisting of substituted or unsubstituted chain and branched structures, and which has carbon atoms (including a carbon-carbon double bond) of 2 or more and 6 or less;

X represents a divalent hydrocarbon group formed of at least one structure which is selected from the group consisting of substituted or unsubstituted chain and branched structures and which has carbon atoms of 2 or more and 6 or less;

Y each independently represents a divalent hydrocarbon group formed of at least one structure which is selected from the group consisting of substituted or unsubstituted chain and branched structures and which has carbon atoms of 2 or more and 6 or less;

Z represents a bond with the divalent hydrocarbon group Y; wherein t each independently represents an integer of 0 or more; u each independently represents an integer of 3 or more; v represents an integer of 0 or more; furthermore, a, b, c, d, e, f, g, h, i and j represent the numbers of mole of individual structural units present in epoxy silicone (1 mole); a, e and f are each a value beyond 0; and b, c, d, g, h, i and j are each a value of 0 or more; and e=a+d+i is satisfied; and the chain in the general formulas (1) and (2) may be random or block.

Herein, in the average composition formula (3), when h, i, and j simultaneously satisfies the following formulas (1) and (2), the above a, b, h, i, and j are numerical values selected from a range satisfying the formula (3).

$$h+i\approx 0 \qquad \text{formula (1)}$$

$$j\neq 0 \qquad \text{formula (2)}$$

$$0\leq b\leq a+(h+i)+2j+2 \qquad \text{formula (3)}$$

Furthermore, when h, i and j mentioned above simultaneously satisfy the following formulas (4) and (5), a, and b mentioned above are numerical values selected from a range satisfying the following formula (6).

$$h+i=0 \qquad \text{formula (4)}$$

$$j=0 \qquad \text{formula (5)}$$

$$0\leq b\leq a+2 \qquad \text{formula (6)}$$

Furthermore, when h, i and j mentioned above simultaneously satisfy the following formulas (1) and (5), a, and b mentioned above, h and i are numerical values selected from a range satisfying the following formula (7).

$$h+i\approx 0 \qquad \text{formula (1)}$$

$$j=0 \qquad \text{formula (5)}$$

$$0\leq b\leq a+(h+i)+2 \qquad \text{formula (7)}$$

Furthermore, when h, i and j simultaneously satisfy the following formulas (4) and (2), the above a, b and j are numerical values selected from a range satisfying the following formula (8).

$$h+i=0 \qquad \text{formula (4)}$$

$$j\neq 0 \qquad \text{formula (2)}$$

$$0\leq b\leq a+2j+2 \qquad \text{formula (8)}$$

The bicyclo structure represented by the general formula (2) is a component playing an important role for a hardened material obtained by hardening the epoxy silicone of the present invention to accomplish excellent light resistance, crack resistance and adhesiveness. It is difficult to obtain sufficient light resistance, crack resistance and adhesiveness after hardened only by the monocyclic structure represented by the general formula (1). To further improve the light resistance, crack resistance and adhesiveness of a hardened material, it is preferred that the ratio of [WB]/[WA] falls within a specific range, provided that the content of a compound having the monocyclic structure represented by the general formula (1) is represented by [WA] and the content of a compound having the bicyclo structure represented by the general formula (2) is represented by [WB].

In the present invention, as a method for calculating the content ratio of a compound represented by the general formula (2) based on a compound represented by the general formula (1), the Matrix Assisted Laser Desorption/Ionization time-of-flight Mass Spectrometry (hereinafter referred to as MALDI-TOF/MS) is used. The value of [WB]/[WA] is calculated based on peak intensity values of compounds represented by the general formulas (1) and (2) obtained by measuring the epoxy silicone of the present invention by the MALDI-TOF/MS, in accordance with the following formula (I).

$$[WB]/[WA] = \frac{\text{Intensity of peak corresponding to the sum of the mass corresponding to a structure represented by the general formula (2) and the mass (23) of sodium}}{\text{Intensity of peak corresponding to the sum of the mass corresponding to a structure represented by the general formula (1) and the mass (23) of sodium}} \qquad (I)$$

In the present invention, the value of [WB]/[WA] is preferably 0.30 or more and 3.00 or less. When the value of [WB]/[WA] is less than 0.30 or beyond 3.00, light resistance, crack resistance and adhesiveness tend to be insufficient. Since there is a tendency to increase the light resistance, crack resistance and adhesiveness of a hardened material obtained by hardening the resultant epoxy silicone; at the same time, to further increase the heat resistance, the value of [WB]/[WA] is more preferably 0.30 or more and 1.50 or less, and further preferably 0.40 or more and 1.50 or less.

In the above formula (I), the mass corresponding to each of the structures represented by the general formulas (1) and (2)

the structural elements of which have isotopes, refers to a value calculated by use of the mass of an isotope having the largest abundance ratio in the isotopes of the elements.

In the present invention, when there are a plurality of peaks corresponding to the general formulas (1) and (2), the value of [WB]/[WA] is calculated by use of the sum of the peak intensity values corresponding to individual structures. However, in the present invention, the peak having an intensity value of 3% or less based on the maximum intensity of the peak corresponding to the sum of the mass corresponding to the structures of the general formulas (1) and (2) and the mass (23) of sodium, should be eliminated in calculating the sum of peak intensity values.

In the following, how to perform measurement in accordance with the MALDI-TOF/MS will be more specifically described.

A solution having 0.1 g of epoxy silicone dissolved in tetrahydrofuran (100 mL) at room temperature and a solution having 10 mg of dithranol dissolved in tetrahydrofuran (1 mL) are mixed homogeneously in a volume ratio of 1:1 at room temperature to prepare solution a. Subsequently, to a sample plate on which a solution (1 μL) having 10 mg of sodium iodide dissolved in acetone (10 mL) is placed, solution a (1 μL) is added dropwise. After the solvent is vaporized at room temperature, measurement is performed by the MALDI-TOF/MS in the following measurement conditions.

| <Measurement conditions> | |
| --- | --- |
| Apparatus: | Shimadzu AXIMA CFRplus |
| Laser: | Nitrogen laser (337 nm) |
| Detector mode: | Linear mode |
| Ion detection: | Positive ion (positive mode) |
| Total number of times: | 500 times |

The average composition formula (3) of the epoxy silicone of the present invention will be more specifically described below.

In the present invention, $R^1$ each independently represents at least one organic group which is selected from the group consisting of A) a monovalent aliphatic organic group having an aliphatic hydrocarbon unit, which is formed of at least one structure which is selected from the group consisting of substituted or unsubstituted chain, branched and cyclic structures, and which has carbon atoms of 1 or more and 24 or less and oxygen atoms of 0 or more and 5 or less, B) a monovalent aromatic organic group, which is a substituted or unsubstituted aromatic hydrocarbon unit, having an aliphatic hydrocarbon unit, which is formed of at least one structure which is selected from the group consisting of optionally substituted or unsubstituted chain, branched and cyclic structures, and which has carbon atoms of 6 or more and 24 or less and oxygen atoms of 0 or more and 5 or less, and C) a monovalent organic group having an aliphatic and/or aromatic hydrocarbon unit, which is formed of at least one structure which is selected from the group consisting of a substituted or unsubstituted chain, branched and cyclic structures, and which has carbon atoms of 5 or more and 26 or less, oxygen atoms of 0 or more and 5 or less and a single silicon atom.

These may be a single organic group or a mixture of two or more organic groups.

Examples of the above A) a monovalent aliphatic organic group having an aliphatic hydrocarbon unit, which is formed of at least one structure which is selected from the group consisting of substituted or unsubstituted chain, branched and cyclic structures, and which has carbon atoms of 1 or more and 24 or less and oxygen atoms of 0 or more and 5 or less may include:

(A-1) chain organic groups formed of aliphatic hydrocarbons, such as a methyl group, an ethyl group, a propyl group, an isopropyl group, a butyl group, an isobutyl group, a t-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group and an octadecyl group;

(A-2) organic groups formed of hydrocarbons containing a cyclic unit, such as a cyclopentyl group, a methyl cyclopentyl group, a cyclohexyl group, a methyl cyclohexyl group, and a norbornyl group; and (A-3) organic groups containing an ether bond, such as a methoxyethyl, an ethoxyethyl, a propoxyethyl group, a methoxypropyl group, an ethoxypropyl group and a propoxypropyl group.

Examples of the above B) a monovalent aromatic organic group, which is a substituted or unsubstituted aromatic hydrocarbon unit, having an aliphatic hydrocarbon unit, which is formed of at least one structure which is selected from the group consisting of optionally substituted or unsubstituted chain, branched and cyclic structures, and which has carbon atoms of 6 or more and 24 or less and oxygen atoms of 0 or more and 5 or less may include a phenyl group, a tolyl group, a xylyl group, a benzyl group, an α-methylstyryl group, a 3-methylstyryl group and a 4-methylstyryl group.

Examples of the above C) a monovalent organic group having an aliphatic and/or aromatic hydrocarbon unit, which is formed of at least one structure which is selected from the group consisting of a substituted or unsubstituted chain, branched and cyclic structures, and which has carbon atoms of 5 or more and 26 or less, oxygen atoms of 0 or more and 5 or less and a single silicon atom, may include organic groups represented by the following general formulas (7) and (8):

$$—CH_2—CH—SiR^5_3 \quad (7)$$

$$—CH(CH_3)—SiR^5_3 \quad (8)$$

wherein $R^5$ each independently represents at least one organic group which is selected from the group consisting of F) a monovalent aliphatic organic group having an aliphatic hydrocarbon unit, which is formed of at least one structure which is selected from the group consisting of a substituted or unsubstituted chain, branched and cyclic structures, and which has carbon atoms of 1 or more and 8 or less, oxygen atoms of 0 or more and 5 or less and G) a monovalent aromatic organic group having a substituted or unsubstituted aromatic hydrocarbon unit and an aliphatic hydrocarbon unit, which is formed of at least one structure which is selected from the group consisting of optionally substituted or unsubstituted chain, branched and cyclic structures, and which has carbon atoms of 6 or more and 8 or less and oxygen atoms of 0 or more and 5 or less.

Specific examples of $R^5$ will be described below.

Examples of the above F) a monovalent aliphatic organic group having an aliphatic hydrocarbon unit, which is formed of at least one structure which is selected from the group consisting of a substituted or unsubstituted chain, branched and cyclic structures, and which has carbon atoms of 1 or more and 8 or less, oxygen atoms of 0 or more and 5 or less may include (F-1) chain organic groups formed of an aliphatic hydrocarbon, such as a methyl group, an ethyl group, a propyl group, an isopropyl group, a butyl group, an isobutyl group, a t-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group and an octadecyl group;

(F-2) organic groups formed of hydrocarbon containing a cyclic unit, such as a cyclopentyl group, a methylcyclopentyl group, a cyclohexyl group, a methylcyclohexyl group and a norbornyl group; and (F-3) organic groups containing an ether bond, such as alkoxy groups including a methoxy group, an ethoxy group, a propoxy group, an isopropoxy group, a butoxy group, an isobutoxy group and a t-butoxy group; and a methoxyethyl, an ethoxyethyl, a propoxyethyl group, a methoxypropyl group, an ethoxypropyl group and a propoxypropyl group.

Furthermore, examples of the above G) a monovalent aromatic organic group having a substituted or unsubstituted aromatic hydrocarbon unit and an aliphatic hydrocarbon unit, which is formed of at least one structure which is selected from the group consisting of optionally substituted or unsubstituted chain, branched and cyclic structures, and which has carbon atoms of 6 or more and 8 or less and oxygen atoms of 0 or more and 5 or less may include organic groups formed of an aromatic hydrocarbon, such as a phenyl group, a tolyl group, a xylyl group, a benzyl group, an α-methylstyryl group, a 3-methylstyryl group and a 4-methylstyryl group.

The above $R^1$ may include, as long as the ranges of the number of carbon atoms and oxygen atoms, and optionally the number of silicon atoms are satisfied, organic groups such as a hydroxyl unit, an alkoxy unit, an acyl unit, a carboxyl unit, an alkenyloxy unit and an acyloxy unit, halogen atoms such as fluorine and chlorine atoms or ester bonds and may further include hetero atoms such as nitrogen, phosphorus and sulfur atoms except an oxygen atom and a silicon atom. These may a single organic group or a mixture of two types or more.

Next, the organic group $R^2$ of the present invention will be more specifically described.

$R^2$ is an organic group containing an epoxy group having an aliphatic hydrocarbon unit, which is formed of at least one structure which is selected from the group consisting of substituted or unsubstituted chain, branched and cyclic structures, and which has carbon atoms of 4 or more and 24 or less and oxygen atoms of 1 or more and 5 or less. Examples thereof may include the structures represented by the following general formulas (9) to (14). These may be a single organic group or a mixture of two types or more.

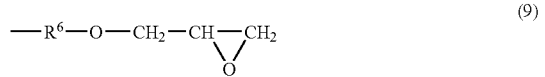

(9)

(10)

(11)

(12)

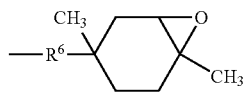

(13)

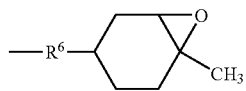

(14)

Examples of $R^6$ in the above general formulas may include structural units containing an ether bond or an ester bond, such as —$(CH_2)_2$—O—, —$(CH_2)_3$—O—, —$(CH_2)_4$—O—, —$CH_2$—$CH(CH_3)$—O—, —$CH_2$—$CH(CH_3)$—$CH_2$—O—, —$CH_2$—$CH_2$—$CH(CH_3)$—O—, —$CH_2$—$CH(CH_3)$—COO— and —$CH_2$—$CH_2$—COO—; and aliphatic hydrocarbon units formed of chain and/or branched structure such as —$(CH_2)_2$—, —$CH(CH_3)$—, —$(CH_2)_3$—, —$CH(CH_3)$—$CH_2$—, —$CH_2$—$CH(CH_3)$—, —$(CH_2)_4$—, —$(CH_2)_5$—, —$(CH_2)_6$—, —$(CH_2)_7$—, —$(CH_2)_8$—, —$(CH_2)_9$—, —$(CH_2)_{10}$—, —$(CH_2)_{11}$—, —$(CH_2)_{12}$—, —$(CH_2)_{13}$—, —$(CH_2)_{14}$—, —$(CH_2)_{15}$— and —$(CH_2)_{16}$—.

These may be a single organic group or a mixture of two or more organic groups. Furthermore, when optical isomers are present, the organic groups may be an organic group having a single optical isomer or as a mixture of two or more optical isomers.

Next, the organic group $R^3$ of the present invention will be more specifically described.

$R^3$ each independently represents at least one organic which is group selected from the group consisting of A) a monovalent aliphatic organic group having an aliphatic hydrocarbon unit, which is formed of at least one structure which is selected from the group consisting of substituted or unsubstituted chain, branched and cyclic structures and which has carbon atoms of 1 or more and 24 or less and oxygen atoms of 0 or more and 5 or less, B) a monovalent aromatic organic group, which is a substituted or unsubstituted aromatic hydrocarbon unit, having an aliphatic hydrocarbon unit, which is formed of at least one structure which is selected from the group consisting of optionally substituted or unsubstituted chain, branched and cyclic structures, and which has carbon atoms of 6 or more and 24 or less and oxygen atoms of 0 or more and 5 or less, C) a monovalent organic group having an aliphatic and/or aromatic hydrocarbon unit, which is formed of at least one structure which is selected from the group consisting of a substituted or unsubstituted chain, branched and cyclic structures, and which has carbon atoms of 5 or more and 26 or less, oxygen atoms of 0 or more and 5 or less and a single silicon atom, and E) a monovalent aliphatic organic group formed of at least one structure which is selected from the group consisting of substituted or unsubstituted chain and branched structures, and which has carbon atoms (including a carbon-carbon double bond) of 2 or more and 6 or less.

Now, the "carbon-carbon double bond" in the present invention will be described. The "carbon-carbon double bond" in the present invention refers to the carbon-carbon double bond of an aliphatic group and does not include the double bonds of a benzene ring a naphthalene ring, and the like.

In the above $R^3$, A) a monovalent aliphatic organic group having an aliphatic hydrocarbon unit, which is formed of at least one structure which is selected from the group consisting of substituted or unsubstituted chain, branched and cyclic structures and which has carbon atoms of 1 or more and 24 or less and oxygen atoms of 0 or more and 5 or less, B) a monovalent aromatic organic group, which is substituted or unsubstituted aromatic hydrocarbon unit, having an aliphatic hydrocarbon unit, which is formed of at least one structure which is selected from the group consisting of optionally substituted or unsubstituted chain, branched and cyclic structures, and which has carbon atoms of 6 or more and 24 or less and oxygen atoms of 0 or more and 5 or less, C) a monovalent organic group having an aliphatic and/or aromatic hydrocarbon unit, which is formed of at least one structure which is selected from the group consisting of a substituted or unsubstituted chain, branched and cyclic structures, and which has carbon atoms of 5 or more and 26 or less, oxygen atoms of 0 or more and 5 or less and a single silicon atom, are the same as defined above.

On the other hand, examples of the above E) a monovalent aliphatic organic group formed of at least one structure which is selected from the group consisting of substituted or unsubstituted chain and branched structures, and which has carbon atoms (including a carbon-carbon double bond) of 2 or more and 6 or less, may include a vinyl group, an allyl group, an isopropenyl group, a butenyl group, an isobutenyl group, a pentenyl group and a hexenyl group. These may include a single organic group or a mixture of two types or more.

The above $R^3$ may include, as long as the ranges of the number of carbon atoms and oxygen atoms, and optionally the number of silicon atoms are satisfied, organic groups such as a hydroxyl unit, an alkoxy unit, an acyl unit, a carboxyl unit, an alkenyloxy unit and an acyloxy unit, halogen atoms such as fluorine and chlorine atoms or ester bonds and may further include hetero atoms such as nitrogen, phosphorus and sulfur atoms except an oxygen atom and a silicon atom. These may include a single organic group or a mixture of two types or more.

Next, organic groups X, Y and Z in the present invention will be described.

Organic groups X and Y, which are linking groups produced by hydrosilylation in producing the epoxy silicone of the present invention (described later), are divalent hydrocarbon groups each formed of at least one structure which is selected from the group consisting of substituted or unsubstituted chain and branched structures and which has carbon atoms of 2 or more and 6 or less. Specific examples thereof include —$(CH_2)_2$—, —$(CH_2)_3$—, —$(CH_2)_4$—, —$(CH_2)_5$—, —$(CH_2)_6$—, —$CH(CH_3)$—, —$CH_2$—$CH(CH_3)$— and —$CH(CH_3)$—$CH_2$—. These may include a single organic group or a mixture of two types or more.

Z represents a bond with the divalent hydrocarbon group Y and specifically represents a structure of —Y—Z— and a hydrocarbon group of —X— mentioned above.

In the organic groups $R^1$ and $R^3$ of the average composition formula (3) including the general formulas (1) and (2) of the present invention, since there is a tendency to have good light resistance of the epoxy silicone of the present invention or improve the storage stability, the total number of mole of silicon atoms, to which an organic group containing a hydroxyl unit, an alkoxy unit, an acyl unit, a carboxyl unit, an alkenyloxy unit and an acyloxy unit, halogen atoms such as fluorine and chlorine atoms or an ester bond, and further a hetero atom such as nitrogen, phosphorus and sulfur atoms except an oxygen atom and a silicon atom is bound, based on the total number of mole of all Si units of epoxy silicones represented by the average composition formula (3) is preferably 10% or less, more preferably 1% or less, and further preferably 0%.

On the other hand, when a hardened material is produced from the epoxy silicone of the present invention, since hardening tends to be performed possibly with good reproducibility, the total number of mole of silicon atoms, to which a monovalent aliphatic organic group formed of at least one structure which is selected from the group consisting of substituted or unsubstituted chain and branched structures and which has carbon atoms (including a carbon-carbon double bond) of 2 or more and 6 or less is bound, based on the total number of mole of all Si units of the epoxy silicone represented by the average composition formula (3) is preferably 10% or less, more preferably 5% or less, further preferably 1% or less, and particularly preferably 0%.

Since there is a tendency to improve the light resistance of the epoxy silicone of the present invention and heat discoloration resistance, the organic groups $R^1$ and $R^3$ of the average composition formula (3) including the general formulas (1) and (2) of the present invention are preferably which is selected from the group consisting of (A-1) and (A-2) and (C) where $R^5$ is (F-1) and (F-2), more preferably an organic group which is selected from the group consisting of (A-1) and (A-2) having carbon atoms of 1 or more and 8 or less and no oxygen atoms, further preferably an unsubstituted chain organic group which is selected from the group consisting of (A-1) and (A-2) having carbon atoms of 1 or more and 8 or less and no oxygen atoms, and particularly preferably a methyl group.

The organic group $R^2$ in the epoxy silicone represented by the average composition formula (3), comprising the compounds represented by the general formulas (1) and (2) of the present invention, is preferably the organic groups represented by the general formulas (10) to (14) wherein $R^6$ is a chain and/or branched aliphatic hydrocarbon unit, more preferably the organic groups represented by the general formulas (10) to (14) wherein $R^6$ is —$(CH_2)_2$—, further preferably the organic groups represented by the general formulas (11) to (14) wherein $R^6$ is —$(CH_2)_2$—, and particularly preferably the organic group represented by the general formula (12) wherein $R^6$ is —$(CH_2)_2$—, since there is a tendency to increase a hardening rate of hardening the obtained epoxy silicone or improve the light resistance of a hardened material using the epoxy silicone.

The divalent hydrocarbon group X of the present invention preferably has at least one structure which is selected from the group consisting of —$(CH_2)_2$— and —$CH(CH_3)$—, and more preferably has —$(CH_2)_2$—, since there is a tendency to improve the light resistance and heat discoloration resistance of a hardened material obtained by use of the epoxy silicone of the present invention.

The values of t and u in the general formulas (1) and (2) represent the number of chains. The chains may be random or block. In the present invention, t is each independently an integer of 0 or more and u is each independently an integer of 3 or more.

In the present invention, since there is tendency to reduce the viscosity of the epoxy silicone, thereby improving handling or to improve the heat discoloration resistance of a hardened material obtained by use of the epoxy silicone, the value of (t+u) in the general formulas (1) and (2) is preferably 10 or less, more preferably, t is 1 or less and u is 3 or more and 7 or less, further preferably, t is 0 and u is 3 or more and 7 or less, and particularly preferably, t is 0 and u is 3 or more and 5 or less.

The values of t and u in the general formulas (1) and (2) can be calculated by measurement of the MALDI-TOF/MS mentioned above.

In the present invention, v is an integer of 0 or more. The value of v is preferably 0 or more and 9 or less, more preferably, 0 or more and 6 or less, further preferably 0 or more and 3 or less, and particularly preferably 0, since there are tendencies to improve the heat resistance of a hardened material obtained by use of the epoxy silicone of the present invention, to have good compatibility with a hardening agent, to obtain a transparent and uniform hardened material, and to improve the adhesiveness.

The values of a, b, c, d, e, f, g, h, i and j of the average composition formula (3) of the present invention represent the numbers of moles of individual structural units present in epoxy silicone (1 mole). The values of a, e and f exceed 0, the values of b, c, d, g, h, i and j are each 0 or more, and e=a+d+i is satisfied.

In order for the epoxy silicone of the present invention to show excellent storage stability without causing a denaturation reaction and a viscosity change during storage; at the same time, to show excellent crack resistance after hardened, the value of [g/(a+b+c+d+e+f+g+h+i+j)] representing the remaining amount of unreacted SiH group present in epoxy silicone must be 0.020 or less, preferably 0.015 or less, more preferably 0.010 or less, and further preferably, 0.005 or less.

The value of [(h+i+j)/(a+b+c+d+e+f+g+h+i+j)], which represents the content of branched chains, is preferably 0.040 or less, more preferably 0.010 or less, and further preferably 0, since there are tendencies to improve the handling of the epoxy silicone, further to improve the compatibility and homogeneous miscibility with a hardening agent and a hardening accelerator, and to improve crack resistance after hardened.

Furthermore, in the present invention, since there is a tendency to suppress the stickiness of the surface of a hardened material obtained by use of the epoxy silicone, f is preferably 1 or more, and more preferably 1.5 or more.

Now, a calculation method for a value of [g/(a+b+c+d+e+f+g+h+i+j)], [(h+i+j)/(a+b+c+d+e+f+g+h+i+j)] and a value f in the epoxy silicone represented by the average composition formula (3) of the present invention will be described.

The value of [g/(a+b+c+d+e+f+g+h+i+j)], [(h+i+j)/(a+b+c+d+e+f+g+h+i+j)] in the epoxy silicone represented by the average composition formula (3) of the present invention can be obtained by calculating abundance ratios of individual structural units corresponding to g and (h+i+j) based on the total Si, based on the integral value calculated from a spectrum pattern obtained by $^{29}$Si-NMR measurement in accordance with the method described below.

On the other hand, the value f is calculated by using the epoxy value, which is obtained by epoxy value measurement (described later) using the number average molecular weight obtained by the above GPC measurement in accordance with the following formula (9).

$$f=(\text{number average molecular weight})/(100/\text{epoxy value}) \quad \text{formula (9)}$$

<$^{29}$Si—NMR Measurement Method>

To a solution obtained by dissolving 0.15 g of epoxy silicone in deuterated chloroform (1 g), 0.015 g of Cr(acac)$_3$ and tetramethylsilane (10 μL) were added to obtain an NMR measurement solution. $^{29}$Si—NMR measurement is performed by using the NMR measurement solution 4000 times in total under proton complete decoupling conditions.

The epoxy silicone represented by the average compositions formula (3) of the present invention has a number average molecular weight preferably ranging from 400 to 1,000,000, more preferably ranging from 500 to 500,000, further preferably ranging from 500 to 100,000, further more preferably ranging from 500 to 50,000, and particularly preferably ranging from 500 to 10,000, in order to improve handling and processability due to flowability, etc.

In the present invention, since there is a tendency to improve the crack resistance, adhesiveness or light resistance of a hardened material to be obtained by use of the epoxy silicone, the content of a component having a molecular weight of 800 or less in the epoxy silicone represented by the average compositions formula (3) is preferably 10% or more and 90% or less, more preferably 15% or more and 80% or less, and further preferably 20% or more and 75% or less.

Now, the number average molecular weight of the epoxy silicone represented by the average compositions formula (3) in the present invention and the content of a component having a molecular weight of 800 or less in the epoxy silicone will be described.

The molecular weight of the epoxy silicone represented by the average compositions formula (3) is a value obtained by gel permeation chromatographic (GPC) measurement using chloroform as an eluent and monodispersed polystyrene and a styrene monomer as a reference substance, and more specifically, refers to the number average molecular weight calculated by use of the calibration curve, which is previously prepared from the elution time by RI detection, based on the elution time of a test sample solution and the intensity detected.

On the other hand, the content of a component having a molecular weight of 800 or less in the epoxy silicone represented by the average compositions formula (3) refers to a numerical value, which is a percentage ratio of a peak area (peak area 2) corresponding to a molecular weight of 800 or less based on the elution peak area (peak area 1) obtained by connecting an elution initiation point to an elution termination point of epoxy silicone in the elution curve obtained by the GPC measurement, [in short, a numerical value expressed by (peak area 2)/(peak area 1)×100(%)].

Since there is a tendency to improve the heat resistance of a hardened material obtained by use of the epoxy silicone of the present invention, the epoxy value of the epoxy silicone is preferably 0.15 or more, more preferably 0.20 or more, and further preferably 0.25 or more. On the other hand, since the heat resistance and heat discoloration resistance of a hardened material obtained by use of the epoxy silicone tend to improve, the epoxy value of the epoxy silicone is preferably 0.50 or less, more preferably 0.48 or less, and further preferably 0.46 or less.

The epoxy value in the present invention refers to the number of epoxy units present in 100 g of epoxy silicone, and more specifically refers to a measurement value obtained by the following method.

<Measurement Method of Epoxy Value>

A resin sample is dissolved in benzyl alcohol and 1-propanol. To the resultant solution, an aqueous potassium iodide solution and a bromophenol blue indicator are added, and thereafter, titrated with 1N hydrochloric acid. An equivalent point is determined when the color of the reaction system changes from blue to yellow. Based on the equivalent point, the epoxy value of the epoxy silicone is calculated in accordance with the following formula (10):

$$\text{Epoxy value(equivalent/100 g)}=(V \times N \times F)/(10 \times W) \quad \text{formula (10)}$$

wherein the values of W, V, N and F are separately defined below:

W: Sample weight (g),
V: Titration amount (mL),
N: Normality (N) of hydrochloric acid used in titration,
F: hydrochloric acid factor used in titration.

Now, a process for producing the epoxy silicone of the present invention will be described.

The epoxy silicone of the present invention is produced by an addition reaction of organohydrogensilicone represented by the following general formula (4), a silicone having a carbon-carbon double bond and represented by the average composition formula (6) including at least a silicone having a carbon-carbon double bond and represented by the formula (5), and a vinyl compound <B> including a compound <A> having a carbon-carbon double bond and an epoxy group,

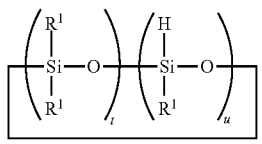 (4)

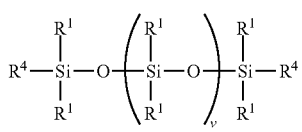 (5)

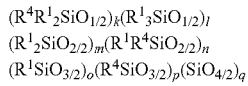

$(R^4R^1{}_2SiO_{1/2})_k(R^1{}_3SiO_{1/2})_l$
$(R^1{}_2SiO_{2/2})_m(R^1R^4SiO_{2/2})_n$
$(R^1SiO_{3/2})_o(R^4SiO_{3/2})_p(SiO_{4/2})_q$ (6)

wherein $R^1$, $R^2$, $R^3$ are the same as defined above, $R^4$ each independently represents a monovalent aliphatic organic group formed of at least one structure which is selected from the group consisting of substituted or unsubstituted chain and branched structures and which has carbon atoms (including a carbon-carbon double bond) of 2 or more and 6 or less;

In the formula, t, u and v are the same as defined above, k, l, m, n, o, p and q represent the numbers of mole of individual structural units present in silicone (1 mole) having a carbon-carbon double bond; k is a value beyond 0, and l, m, n, o, p and q are each a value of 0 or more; and The chain in the general formula (4) may be random or block.

Note that when o, p and q in the average composition formula (6), all simultaneously satisfy the following formulas (11) and (12), the values of k, l, o, p, and q are selected from the range satisfying the formula (13).

$o+p\approx 0$   formula (11)

$q\approx 0$   formula (12)

$0\leq k+l \leq o+p+2q+2$   formula (13)

Furthermore, when o, p and q all simultaneously satisfy the following formulas (14) and (15), the values of k and l are selected from the range satisfying the following formula (16).

$o+p=0$   formula (14)

$q=0$   formula (15)

$0\leq k+l \leq 2$   formula (16)

Furthermore, when o, p and q all simultaneously satisfy the following formulas (11) and (15), the values of k, l, o and p are selected from the range satisfying the following formula (17).

$o+p\approx 0$   formula (11)

$q=0$   formula (15)

$0\leq k+l \leq o+p+2$   formula (17)

Furthermore, when o, p and q all simultaneously satisfy the following formulas (14) and (12), the values of k, l and q are selected from the range satisfying the following formula (18).

$o+p=0$   formula (14)

$q\approx 0$   formula (12)

$0\leq k+l \leq 2q+2$   formula (18)

Processes for producing the organohydrogensilicone represented by the general formula (4) and silicone represented by the general formula (5) and the average composition formula (6) to be used in the present invention are not particularly limited. Compounds produced by known methods in the art can be used.

In the present invention, a part of the silicone having a carbon-carbon double bond and represented by the average composition formula (6) may be the silicone having a carbon-carbon double bond and represented by the general formula (5). Alternatively, the whole of the silicone having a carbon-carbon double bond and represented by the average composition formula (6) is the silicone having a carbon-carbon double bond and represented by the general formula (5). When a part of the silicone having a carbon-carbon double bond and represented by the average composition formula (6) is the silicone having a carbon-carbon double bond and represented by the general formula (5), the silicone having a carbon-carbon double bond and represented by the average composition formula (6) may include silicone having a carbon-carbon double bond and having any one of straight chain, cyclic-form, branched, ladder-form and cage-form structures, other than the silicone having a carbon-carbon double bond and represented by the general formula (5).

On the other hand, a part of the vinyl compound <B> may be a compound <A> having a carbon-carbon double bond and an epoxy group. Alternatively, the whole of the vinyl compound <B> may be a compound <A> having a carbon-carbon double bond and an epoxy group.

The compound of the general formula (4) that may be used in the present invention is not particularly limited as long as, in the formula, t is each independently an integer of 0 or more and u is each independently an integer of 3 or more and $R^1$ is an organic group as mentioned above. These compounds may be used alone or as a mixture of two types or more.

Since there is a tendency to improve the light resistance of the epoxy silicone of the present invention, as the organohydrogensilicone represented by the general formula (4), a compound where $R^1$ is a monovalent aliphatic organic group having an aliphatic hydrocarbon unit, which is formed of at least one structure which is selected from the group consisting of substituted or unsubstituted chain, branched and cyclic structures, and which has carbon atoms of 1 or more and 24 or less, is preferably used. Examples of such a compound may include 1,3,5-trimethylcyclotrisiloxane, 1,3,5,7-tetramethylcyclotetrasiloxane, 1,3,5,7,9-pentamethylcyclopentasiloxane, 1,3,5,7,9,11-hexamethylcyclohexasiloxane, 1,3,5,7,9,11,13-heptamethylcycloheptasiloxane, 1,3,5,7,9,11,13,15-octamethylcyclooctasiloxane, 1,3,5,7,9,11,13,15,17-nonamethylcyclononasiloxane, 1,3,5,7,9,11,13,15,17,19-decanethyldecasiloxane, 1,3,5,7,9,11,13,15,17,19,21-undecamethylcycloundecasiloxane, 1,1,3,5-tetramethylcyclotrisiloxane, 1,1,3,5,5,7-hexamethylcyclotetrasiloxane, 1,3,5,7-tetraethylcyclotetrasiloxane, 1,3,5,7,9-pentaethylcyclopentasiloxane, 1,3,5,7,9,11-hexaethylcyclohexasiloxane and 1,3,5,7,9,11,13-heptaethylcycloheptasiloxane.

Of the above compounds, a compound represented by the general formula (4) where a value of (t+u) is 10 or less is preferably used, a compound where t is 1 or less and u is 3 or more and 7 or less is more preferably used, a compound where t is 0 and u is 3 or more and 7 or less is further preferably used, a compound where t is 0 and u is 3 or more and 5 or less is further more preferably used, a compound where t is 0 and u is 3 or more and 5 or less and $R^1$ is a methyl group is particularly preferably used, and 1,3,5,7-tetramethylcyclotetrasiloxane is most preferable, since there is a tendency to reduce the viscosity of the epoxy silicone of the present invention, thereby improving handling, or improve the heat discoloration resistance and crack resistance of a hardened material obtained by use of the epoxy silicone of the present invention.

The compound of the general formula (5) of the present invention is a compound having $R^1$, which is the same as defined above, and $R^4$, which is a monovalent aliphatic organic group formed of at least one structure which is selected from the group consisting of substituted or unsubstituted chain and branched structures and which has carbon atoms (including a carbon-carbon double bond) of 2 or more and 6 or less. Examples of the organic group of $R^4$ may include a vinyl group, an allyl group, an isopropenyl group, a butenyl group, an isobutenyl group, a pentenyl group and a hexenyl group. These may be used alone or as a mixture to two types or more.

The above $R^1$ may include, as long as they fall within the range of the number of carbon atoms and oxygen atoms, and optionally the number of silicon atoms, organic groups such as a hydroxyl unit, an alkoxy unit, an acyl unit, a carboxyl unit, an alkenyloxy unit and an acyloxy unit, halogen atoms such as fluorine and chlorine atoms or ester bonds and may further include hetero atoms such as nitrogen, phosphorus and sulfur atoms except an oxygen atom or a silicon atom.

The compound of the general formula (5) is a compound where $R^4$ is a vinyl group since there is a tendency to perform a hydrosilylation reaction with a high reactivity and good reproducibility.

On the other hand, in the compound of the general formula (5), the total number of mole of silicon atoms, to which an organic group having a hydroxyl unit, an alkoxy unit, an acyl unit, a carboxyl unit, an alkenyloxy unit and an acyloxy unit, halogen atoms such as fluorine and chlorine atoms or an ester bond and further containing a hetero atom such as nitrogen, phosphorus and sulfur atoms except an oxygen atom and a silicon atom is bound, based on the total number of mole of all Si units of the compound of the general formula (5) is preferably 10% or less, more preferably 1% or less, and further preferably 0%, since there is a tendency to improve the light resistance and heat discoloration resistance of the epoxy silicone of the present invention or improve the storage stability.

Furthermore, $R^1$ is preferably which is selected from the group consisting of (A-1) and (A-2) of monovalent aliphatic organic groups of A) having an aliphatic hydrocarbon unit, which is formed of at least one structure which is selected from the group consisting of substituted or unsubstituted chain, branched and cyclic structures, and which has carbon atoms of 1 or more and 24 or less and oxygen atoms of 0 or more and 5 or less; more preferably an organic group which is selected from the group consisting of (A-1) and (A-2) having carbon atoms of 1 or more and 8 or less and no oxygen atoms; and further preferably an unsubstituted chain organic group which is selected from the group consisting of (A-1) and (A-2) having carbon atoms of 1 or more and 8 or less and no oxygen atoms. Examples of such a compound may include dimethylvinylsiloxy terminated polydimethylsiloxane, a dimethylvinylsiloxy-terminated dimethylsiloxane-methylethylsiloxane copolymer and a dimethylvinylsiloxy-terminated dimethylsiloxane-methyl octyl siloxane copolymer. Furthermore, as the compound of the general formula (5) in the present invention, $R^1$ is particularly preferably a methyl group.

In the present invention, v in the general formula (5) is an integer of 0 or more. The value of v is preferably 0 or more and 9 or less, more preferably 0 or more and 6 or less, further preferably 0 or more and 3 or less, and particularly preferably 0, since there are tendencies to improve the heat resistance of a hardened material obtained by use of the epoxy silicone of the present invention, to have good compatibility with a hardening agent, to obtain a transparent and uniform hardened material and to have good adhesiveness.

Preferable examples of the compound of the general formula (5) in the present invention may include 1,3-divinyl-1,1,3,3-tetramethyldisiloxane in the case where v=0, 1,5-divinyl-1,1,3,3,5,5-hexamethyltrisiloxane in the case where v=1, and dimethylvinylsiloxy-terminated polydimethylsiloxane in the case where v is 9 or less. 1,3-Divinyl-1,1,3,3-tetramethyldisiloxane is particularly preferred.

The organic groups $R^1$ and $R^4$ of silicone having a carbon-carbon double bond and represented by the average composition formula (6) including at least the silicone having a carbon-carbon double bond and represented by the general formula (5) in the present invention are the same as defined above. $R^1$ of silicone having a carbon-carbon double bond and represented by the average composition formula (6) may include, as long as the ranges of the number of carbon atoms and oxygen atoms, and optionally the number of silicon atoms are satisfied, organic groups such as a hydroxyl unit, an alkoxy unit, an acyl unit, a carboxyl unit, an alkenyloxy unit and an acyloxy unit, halogen atoms such as fluorine and chlorine atoms or ester bonds, and may further include hetero atoms such as nitrogen, phosphorus and sulfur atoms except an oxygen atom and a silicon atom.

Since there is a tendency to improve the light resistance of the epoxy silicone of the present invention or improve the storage stability, the total number of mole of silicon atoms, to which an organic group having a hydroxyl unit, an alkoxy unit, an acyl unit, a carboxyl unit, an alkenyloxy unit and an acyloxy unit, halogen atoms such as fluorine and chlorine atoms or an ester bond and further including a hetero atom such as nitrogen, phosphorus and sulfur atoms except an oxygen atom and a silicon atom is bound, based on the total number of mole of all Si units of silicone having a carbon-carbon double bond and represented by the average composition formula (6) at least including at least the silicone having a carbon-carbon double bond and represented by the general formula (5) is preferably 10% or less, more preferably 1% or less, and further preferably 0%.

Furthermore, $R^1$ is preferably which is selected from the group consisting of (A-1) and (A-2) of monovalent aliphatic organic groups of A) having an aliphatic hydrocarbon unit, which is formed of at least one structure which is selected from the group consisting of substituted or unsubstituted chain, branched and cyclic structures, and which has carbon atoms of 1 or more and 24 or less and oxygen atoms of 0 or more and 5 or less; more preferably an organic group which is selected from the group consisting of (A-1) and (A-2) having carbon atoms of 1 or more and 8 or less and no oxygen atoms, and further preferably an unsubstituted chain organic group which is selected from the group consisting of (A-1) and (A-2) having carbon atoms of 1 or more and 8 or less and no oxygen atoms. The organic group is particularly preferably a methyl group.

The silicone having a carbon-carbon double bond and represented by the average composition formula (6) including at least the silicone having a carbon-carbon double bond and represented by the general formula (5) of the present invention preferably has a number average molecular weight of 180 or more and 1,000 or less, more preferably 180 or more and 800 or less, and further preferably 180 or more and 600 or less, since there are tendencies to improve the heat resistance of a hardened material obtained by use of the epoxy silicone of the present invention, to have good compatibility with a hardening agent and to obtain a transparent and uniform hardened material.

As to the number of mole of individual units constituting one mole of the silicone having a carbon-carbon double bond and represented by the average composition formula (6) at least including at least the silicone having a carbon-carbon double bond and represented by the general formula (5) of the present invention, the value of $[q/(k+l+m+o+p+q)]$ is preferably 0.040 or less, more preferably the value of $[o+p)/(k+l+m+o+p+q)]$ where q is 0 is 0.010 or less, and further preferably the value of $[(o+p+q)/(k+l+m+o+p+q)]$ is 0, in order for hydrosilylation reaction for producing the epoxy silicone of the present invention to proceed stably with good reproducibility.

On the other hand, since there is a tendency to suppress the stickiness of the surface of a hardened material obtained by use of the epoxy silicone produced by the method of the present invention, the value of $(k+n+p)$ of the silicone having a carbon-carbon double bond and represented by the average composition formula (6) including at least the silicone having a carbon-carbon double bond and represented by the general formula (5) is preferably 1 or more, more preferably 1.5 or more, and further preferably 1.8 or more.

Now, a method of calculating the values k to q of the silicone having a carbon-carbon double bond and represented by the average composition formula (6) at least including at least the silicone having a carbon-carbon double bond and represented by the general formula (5) will be explained.

The values k to q of the silicone having a carbon-carbon double bond and represented by the average composition formula (6) including at least the silicone having a carbon-carbon double bond and represented by the general formula (5) are calculated based on the results of $^{29}$Si—NMR measurement, GPC measurement and further optionally $^{1}$H-NMR measurement. More specifically, the silicone represented by the average composition formula (6) is subjected to $^{29}$Si—NMR measurement and $^{1}$H-NMR measurement. Based on integral values calculated from the resultant spectrum pattern, the abundance ratios (percentages) of individual structural units are calculated.

Subsequently, using the resultant abundance ratios and theoretical formula weight of the individual structural units, average formula weights of the structural units are calculated.

Furthermore, the number average molecular weight, which is obtained by GPC measurement of the silicone represented by the average composition formula (6), and which is regarded as the molecular weight per mole of the silicone, is divided by the average formula weight calculated above in consideration of the abundance ratios of individual structural units. In this way, the total number of mole of individual units constituting the silicone represented by the average composition formula (6) is calculated. Based on the resultant total number of mole of individual units constituting the silicone represented by the average composition formula (6) and the abundance ratios of individual units, the number of mole of the individual units constituting one mole of the silicone represented by the average composition formula (6) can be calculated.

In the present invention, the silicone having a carbon-carbon double bond and represented by the average composition formula (6) is preferably constituted completely of the silicone having a carbon-carbon double bond and represented by the general formula (5), more preferably 1,3-divinyl-1,1,3,3-tetramethyldisiloxane, 1,5-divinyl-1,1,3,3,5,5-hexamethyltrisiloxane or dimethylvinylsiloxy-terminated polydimethylsiloxane where v is 9 or less, and further preferably, 1,3-divinyl-1,1,3,3-tetramethyldisiloxane.

The compound <A> having a carbon-carbon double bond and an epoxy group that may be used in the present invention is not particularly limited as long as the epoxy silicone of the present invention can be produced. A compound having an epoxy group and a carbon-carbon double bond as essential structural units and having an aliphatic hydrocarbon unit, which is formed of at least one structure which is selected from the group consisting of substituted or unsubstituted chain, branched and cyclic structures, and which has carbon atoms of 4 or more and 24 or less and oxygen atoms of 1 or more and 5 or less, may be used. Specific examples of such a compound may include the compounds represented by the following general formulas (15) to (20):

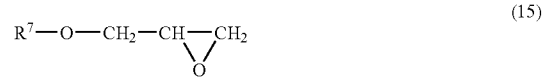

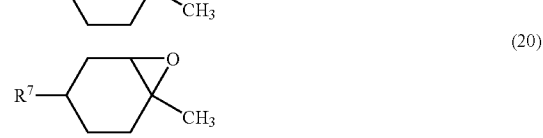

Examples of $R^7$ in the general formulas (15) to (20) may include structural units containing an ether bond or an ester bond such as $CH_2$=CH—O—, $CH_2$=CH—$CH_2$—O—, $CH_2$=CH—$CH_2$—$CH_2$—O—, $CH_2$=C($CH_3$)—O—, $CH_2$=C($CH_3$)—$CH_2$—O—, $CH_2$=$CH_2$—CH($CH_3$)—O—, $CH_2$=C($CH_3$)—COO— and $CH_2$=CH—COO— and aliphatic hydrocarbon units formed of chain and/or branched structure such as $CH_2$=CH—, $CH_2$=CH—$CH_2$—, $CH_2$=C($CH_3$)—, $CH_2$=CH—$(CH_2)_2$—, $CH_2$=CH—$(CH_2)_3$—, $CH_2$=CH—$(CH_2)_4$—, $CH_2$=CH—$(CH_2)_5$—, $CH_2$=CH—$(CH_2)_6$—, $CH_2$=CH—$(CH_2)_7$—, $CH_2$=CH—$(CH_2)_8$—, $CH_2$=CH—$(CH_2)_9$—, $CH_2$=CH—$(CH_2)_{10}$—, $CH_2$=CH—$(CH_2)_{11}$—, $CH_2$=CH—$(CH_2)_{12}$—, $CH_2$=CH—$(CH_2)_{13}$— and $CH_2$=CH—$(CH_2)_{14}$—. These may be used alone or as a mixture of one or two types or more.

Furthermore, when an optical isomer is present, the organic group may have a single optical isomer or a mixture with two or more optical isomers.

Since there is a tendency to increase a hardening rate when the epoxy silicone to be obtained is hardened or to improve the light resistance, heat discoloration resistance of a hardened material obtained by use of the epoxy silicone, the compounds represented by the general formulas (16) to (20), in which $R^7$ is an aliphatic hydrocarbon unit having a carbon-carbon double bond as an essential structural unit and formed of at least one structure which is selected from the group consisting of substituted or unsubstituted chain and branched structures, are preferable as the compound <A>; the compounds represented by the general formulas (16) to (20) in which $R^7$ is a vinyl group are more preferable; the compounds represented by the general formulas (17) to (20) in which $R^7$ is a vinyl group are further preferable; a compound represented by the general formula (18) in which $R^7$ is a vinyl group, namely, 4-vinylcyclohexene oxide, is particularly preferable.

As the compound to be used as the vinyl compound <B> except the compound <A> having a carbon-carbon double bond and an epoxy group, the examples may include (a) a compound having an aliphatic hydrocarbon unit, which contains no epoxy group, has a carbon-carbon double bond as an essential structural unit, and is formed of at least one structure which is selected from the group consisting of substituted or unsubstituted chain, branched and cyclic structures, and which has carbon atoms of 3 or more and 24 or less and oxygen atoms of 0 or more and 5 or less; (b) a compound having a substituted or unsubstituted aromatic hydrocarbon unit, which has a carbon-carbon double bond as an essential structural unit, and an aliphatic hydrocarbon unit, which is formed of at least one structure which is selected from the group consisting of optionally substituted or unsubstituted chain, branched and cyclic structures, and which has carbon atoms of 8 or more and 24 or less and oxygen atoms of 0 or more and 5 or less; and (c) silane or the like which is represented by the following general formula (21) and which has at least one carbon-carbon double bond within a molecule,

$$CH_2=CH-SiR^5{}_3 \qquad (21)$$

wherein $R^5$s are each independently the same as defined above.

The compounds (a) to (c) mentioned above may be used alone or as a mixture of two types or more. The compounds may include, as long as the ranges of the numbers of carbon atoms and oxygen atoms, are satisfied, a hydroxyl unit, an alkoxy unit, an acyl unit, a carboxyl unit, an alkenyloxy unit and an acyloxy unit, halogen atoms such as fluorine and chlorine atoms or ester bonds and may further include hetero atoms such as nitrogen, phosphorus and sulfur atoms except an oxygen atom and a silicon atom.

Examples of the compound (a) having an aliphatic hydrocarbon unit, which contains no epoxy group, has a carbon-carbon double bond as an essential structural unit, and is formed of at least one structure which is selected from the group consisting of substituted or unsubstituted chain, branched and cyclic structures, and which has carbon atoms of 3 or more and 24 or less and oxygen atoms of 0 or more and 5 or less may include compounds formed of the carbon-carbon double bond and a hydrocarbon, such as propylene, 1-butene, 1-pentene, 1-hexene, 1-heptene, 1-octene, 1-nonene, 1-decene, 1-undecene, 1-dodecene, 1-tridecene, 1-tetradecene, 1-pentadecene, 1-hexadecene, 1-heptadecene, 1-octadecene, cyclopentene, methylcyclopentene, cyclohexene, methylcyclohexene, norbornene, vinylcyclohexane and vinyldecahydronaphthalene; and compounds having a carbon-carbon double bond and an ether bond, such as vinylmethyl ether, vinylethyl ether, vinylpropyl ether, allylmethyl ether, allylethyl ether and allylpropyl ether. These may be used alone or as a mixture of two types or more.

Examples of the compound (b) having a substituted or unsubstituted aromatic hydrocarbon unit, which has a carbon-carbon double bond as an essential structural unit, and an aliphatic hydrocarbon unit, which is formed of at least one structure which is selected from the group consisting of optionally substituted or unsubstituted chain, branched and cyclic structures, and which has carbon atoms of 8 or more and 24 or less and oxygen atoms of 0 or more and 5 or less may include styrene, 3-methylstyrene, 4-methylstyrene and α-methylstyrene. These may be used alone or as a mixture of two types or more.

Examples of silane (c) having at least one carbon-carbon double bond within a molecule may include vinylalkylsilanes having a carbon-carbon double bond, such as vinyltrimethylsilane, vinylethyldimethylsilane, vinyldiethylmethylsilane and vinyltriethylsilane; aliphaticvinylalkoxysilanes having a carbon-carbon double bond, such as vinyltrimethoxysilane, vinylmethyldimethoxysilane, vinyldimethylmethoxysilane, vinyltriethoxysilane, vinylmethyldiethoxysilane, vinyldimethylethoxysilane, vinyltriisopropoxysilane and vinyltri-t-butoxysilane; aromatic vinylalkoxysilanes having a carbon-carbon double bond, such as vinylphenylmethylmethoxysilane, vinylphenyldiethoxysilane and vinyldiphenylethoxysilane; vinylarylsilane having a carbon-carbon double bond, such as vinylphenyldimethylsilane and vinylphenyldiethylsilane; and vinylaralkylsilane having a carbon-carbon double bond such as vinylbenzyldimethylsilane and vinylbenzyldiethylsilane. These silanes having a carbon-carbon double bond in a molecule may be used alone or as a mixture of two types or more.

Of these, a compound <B> except the compound <A> having a carbon-carbon double bond and an epoxy group preferably contains none of organic groups containing a hydroxyl unit, an alkoxy unit, an acyl unit, a carboxyl unit, an alkenyloxy unit and an acyloxy unit, halogen atoms such as fluorine and chlorine atoms or ester bonds and further containing hetero atoms such as nitrogen, phosphorus and sulfur atoms except an oxygen atom and a silicon atom, since there is a tendency to improve the light resistance of a hardened material obtained by use of the epoxy silicone obtained after a hydrosilylation reaction. Furthermore, it is more preferred to be selected from the group consisting of the compound (a) having an aliphatic hydrocarbon unit, which contains no epoxy group, has a carbon-carbon double bond as an essential structural unit, and is formed of at least one structure which is selected from the group consisting of substituted or unsubstituted chain, branched and cyclic structures, and which has carbon atoms of 3 or more and 24 or less and oxygen atoms of 0 or more and 5 or less and the vinylalkylsilane (c) having a carbon-carbon double bond.

Specific examples of the compound (a) that are preferably used may include 1-hexene, 1-heptene, 1-octene, 1-nonene, 1-decene, 1-undecene, 1-dodecene, 1-tridecene, 1-tetradecene, 1-pentadecene, 1-hexadecene, 1-heptadecene, 1-octadecene, cyclopentene, cyclohexene, methylcyclohexene, norbornene and vinylcyclohexene, since there is a tendency to improve the handling of a vinyl compound or to easily remove an excessive compound by distillation. On the other hand, specific examples of the compound (c) that are preferably used may include vinyltrimethylsilane, vinylethyldimethyl silane, vinyldiethylmethylsilane and vinyltriethylsilane, and vinyl trimethylsilane is particularly preferably used since there is a tendency to easily remove an excessive compound by distillation.

Next, a process for producing the epoxy silicone of the present invention will be more specifically described.

The epoxy silicone of the present invention may be produced by adding the silicone having a carbon-carbon double bond and represented by the average composition formula (6) including at least the silicone having a carbon-carbon double bond and represented by the general formula (5), and the vinyl compound <B> including the compound <A> having a carbon-carbon double bond and an epoxy group, to a SiH unit of organohydrogensilicone represented by the above general formula (4) in accordance with the following "Production process 1" or "Production process 2".

[Production Process 1]

This is a process comprising a single step of simultaneously adding a mixture of the silicone having a carbon-carbon double bond and represented by the average composition formula (6) including at least the silicone having a carbon-carbon double bond and represented by the general formula (5), and the vinyl compound <B> including the compound <A> having a carbon-carbon double bond and an epoxy group, to a SiH unit of organohydrogensilicone represented by the general formula (4), in the presence of a hydrosilylation catalyst.

[Production Process 2]

A process comprising two-stage step including a first step of adding the vinyl compound <B> including the compound <A> having a carbon-carbon double bond and an epoxy group to a SiH unit of organohydrogensilicone represented by the general formula (4) in the presence of a hydrosilylation catalyst; and a second step of subsequently adding silicone having a carbon-carbon double bond and represented by the average composition formula (6) including at least the silicone having a carbon-carbon double bond and represented by the general formula (5).

The epoxy silicone of the present invention may be produced by either one of [Production process 1] and [Production process 2] mentioned above. Furthermore in the case following [Production process 2], the first step and the second step may be continuously performed or after an addition product obtained in the first step is separated and recovered, the second step may be performed.

As described above, in the epoxy silicone of the present invention, a ratio of the content [WA] of a compound represented by the general formula (1) based on the content [WB] of a compound represented by the general formula (2), that is, a ratio of [WB]/[WA], is preferably 0.30 or more and 3.00 or less. The ratio of [WB]/[WA] may be obtained by controlling the amount of carbon-carbon double bond of the silicone having a carbon-carbon double bond and represented by the general formula (5) to be added and the amount of carbon-carbon double bond of the compound <A> having a carbon-carbon double bond and an epoxy group to a SiH unit of organohydrogensilicone represented by the general formula (4) within the range described below.

In [Production process 1], individual compounds are preferably added in combination to a reaction system such that the number of mole (r1) of a SiH unit of organohydrogensilicone represented by the general formula (4); the number of mole (r2) of the carbon-carbon double bond of silicone having a carbon-carbon double bond and represented by the above general formula (5); the number of mole (r3) of the carbon-carbon double bond of silicone having a carbon-carbon double bond and represented by the average composition formula (6) except the silicone having a carbon-carbon bond and represented by the above general formula (5); the number of mole (r4) of the carbon-carbon double bond of the compound <A> having a carbon-carbon double bond and an epoxy group; and the number of mole (r5) of the carbon-carbon double bond of the vinyl compound <B> except the compound <A> having a carbon-carbon double bond and an epoxy group, simultaneously satisfy the following formulas (A1) to (A5), and an addition reaction is performed in the presence of a hydrosilylation catalyst.

$$0.10 \leq r2/r1 \leq 0.75 \quad \text{formula (A1)}$$

$$0.25 \leq r4/r1 \quad \text{formula (A2)}$$

$$0 \leq r3 \quad \text{formula (A3)}$$

$$0 \leq r5 \quad \text{formula (A4)}$$

$$1 \leq (r2+r3+r4+r5)/r1 \leq 5 \quad \text{formula (A5)}$$

The case where the value of [r2/r1] is less than 0.10 or exceeds 0.75, or the case where the value of [r4/r1] is less than 0.25 is not preferable, since the value of [WB]/[WA] may be sometimes less than 0.30 or beyond 3.00 and the crack resistance or adhesiveness of a hardened material obtained by use of the epoxy silicone of the present invention tends to be insufficient.

Furthermore, in the case where the value of [(r2+r3+r4+r5)/r1] is less than 1, the SiH units of organohydrogensilicone represented by the general formula (4) partly remain unreacted to produce epoxy silicone containing a polymer compound formed by ring-opening of an epoxy group, with the result that epoxy silicone cannot be produced stably with good reproducibility. Epoxy silicone reduced in storage stability due to denature and viscosity change during storage is hardened, the crack resistance may reduce. Due to such a disadvantage, this case is not preferred.

In the case where the value of [(r2+r3+r4+r5)/r1] exceeds 5 is not preferable, since a hydrosilylation catalyst is stabilized and a rate of hydrosilylation reaction may sometimes decrease and the load on the step of separating and recovering the epoxy silicone from a reaction mixture containing the epoxy silicone obtained by the process of the present invention tends to increase.

Furthermore, the silicone having a carbon-carbon double bond and represented by the average composition formula (6) except the silicone having a carbon-carbon double bond and represented by the general formula (5) and the vinyl compound <B> except the compound <A> having a carbon-carbon double bond and an epoxy group are the compounds that may be optionally used. The numbers of mole (r3) and (r5) of the carbon-carbon double bonds thereof are numerical values of 0 or more.

In order to produce epoxy silicone excellent in transparency, light resistance, heat resistance, crack resistance and adhesiveness stably with good reproducibility, it is preferred that r1 to r5 satisfy the following formulas (A3) and (A4) and formulas (A6) to (A8), simultaneously;

$$0.10 \leq r2/r1 \leq 0.55 \quad \text{formula (A6)}$$

$$0.45 \leq r4/r1 \quad \text{formula (A7)}$$

$$0 \leq r3 \quad \text{formula (A3)}$$

$$0 \leq r5 \quad \text{formula (A4)}$$

$$1 \leq (r2+r3+r4+r5)/r1 \leq 2 \quad \text{formula (A8)}$$

more preferably, r1 to r5 satisfy the following formulas (A3) and (A4) and formulas (A9) to (A11), simultaneously;

$0.20 \leq r2/r1 \leq 0.55$     formula (A9)

$0.45 \leq r4/r1$     formula (A10)

$0 \leq r3$     formula (A3)

$0 \leq r5$     formula (A4)

$1 \leq (r2+r3+r4+r5)/r1 \leq 1.5$     formula (A11)

and further preferably, r1 to r5 satisfy the following formulas (A9) and (A10) and the following formulas (A12) to (A14), simultaneously.

$0.20 \leq r2/r1 \leq 0.55$     formula (A9)

$0.45 \leq r4/r1$     formula (A10)

$r3=0$     formula (A12)

$r5=0$     formula (A13)

$1 \leq (r2+r4)/r1 \leq 1.3$     formula (A14)

In [Production process 2], in the first step, individual compounds are added in combination to a reaction system such that the number of mole (s1) of the SiH unit of organohydrogensilicone represented by the general formula (4); the number of mole (s2) of the carbon-carbon double bond of the compound <A> having a carbon-carbon double bond and an epoxy group; and the number of mole (s3) of the carbon-carbon double bond of a vinyl compound <B> except a compound <A> having a carbon-carbon double bond and an epoxy group simultaneously satisfy the following formulas (B1) to (B3) and subjected to an addition reaction; and subsequently, in the second step, individual compounds are preferably added in combination to a reaction system such that the numbers of mole (s1) to (s3); (s4) of the carbon-carbon double bond of the silicone having a carbon-carbon double bond and represented by the general formula (5); and (s5) of the carbon-carbon double bond of silicone having a carbon-carbon double bond and represented by the average composition formula (6) except the silicone having a carbon-carbon double bond and represented by the general formula (5), simultaneously satisfy the following formulas (B4) to (B6) and then subjected to an addition reaction, in the presence of a hydrosilylation catalyst.

$0 \leq s3$     formula (B1)

$0.25 \leq s2/s1 \leq 0.90$     formula (B2)

$0.25 \leq (s2+s3)/s1 \leq 0.90$     formula (B3)

$0 \leq s5$     formula (B4)

$0.10 \leq s4/s1$     formula (B5)

$1.0 \leq (s4+s5)/[s1-(s2+s3)] \leq 3.0$     formula (B6)

In the case where the value of [s2/s1] is less than 0.25 or exceeds 0.90, the case where the value of [(s2+s3)/s1] is less than 0.25 or exceeds 0.90, or the case where the value of [s4/s1] is less than 0.10, the value of [WB]/[WA] may be sometimes less than 0.30 or beyond 3.00, and the crack resistance or adhesiveness of the hardened material obtained by use of the epoxy silicone of the present invention tends to be insufficient. Because of these advantages, this case is not preferred.

Furthermore, in the case where the value of {(s4+s5)/[s1−(s2+s3)]} is less than 1.0, the SiH units of organohydrogensilicone represented by the general formula (4) partly remain unreacted and ring-opening of an epoxy group proceeds to obtain epoxy silicone containing a polymer compound. As a result, epoxy silicone cannot be produced stably with good reproducibility; epoxy silicone causes a denaturation reaction and a viscosity change during storage, storage stability thereof decreases; when the epoxy silicone is hardened, the crack resistance decreases. Because of these disadvantages, this case is not preferred. On the other hand, in the case where the value of {(s4+s5)/[s1−(s2+s3)]} exceeds 3, a hydrosilylation catalyst is stabilized and a rate of hydrosilylation reaction may decrease. As a result, the load on the step of separating and recovering the epoxy silicone from a reaction mixture containing the epoxy silicone obtained by the method of the present invention tends to increase. Because of the disadvantage, the case is not preferred.

Herein, the vinyl compound <B> except the compound <A> having a carbon-carbon double bond and an epoxy group, and the silicone having a carbon-carbon double bond and represented by the average composition formula (6) except the silicone having a carbon-carbon double bond and represented by the general formula (5) are the compounds that may be optionally used. The numbers of mole (s3) and (s5) of the carbon-carbon double bonds thereof are each a numerical value of 0 or more.

In order to produce epoxy silicone excellent in transparency, light resistance, heat resistance, crack resistance and adhesiveness stably with good reproducibility, it is preferred that s1 to s5 satisfy the following formulas (B1) and (B4) and formulas (B7) to (B10), simultaneously;

$0 \leq s3$     formula (B1)

$0.45 \leq s2/s1 \leq 0.90$     formula (B7)

$0.45 \leq (s2+s3)/s1 \leq 0.90$     formula (B8)

$0 \leq s5$     formula (B4)

$0.10 \leq s4/s1$     formula (B9)

$1.0 \leq (s4+s5)/[s1-(s2+s3)]2.0$     formula (B10)

more preferably, s1 to s5 satisfy the following formulas (B1) and (B4) and formulas (B11) to (B14), simultaneously;

$0 \leq s3$     formula (B1)

$0.45 \leq s2/s1 \leq 0.80$     formula (B11)

$0.45 \leq (s2+s3)/s1 \leq 0.80$     formula (B12)

$0 \leq s5$     formula (B4)

$0.20 \leq s4/s1$     formula (B13)

$1.0 \leq (s4+s5)/[s1-(s2+s3)] \leq 1.5$     formula (B14)

and further preferably, s1 to s5 satisfy the following formula (B11) and formulas (B15) to (B18), simultaneously.

$s3=0$     formula (B15)

$0.45 \leq s2/s1 \leq 0.80$     formula (B11)

$s5=0$     formula (B16)

$0.20 \leq s4/s1 \leq 0.55$     formula (B17)

$1.0 \leq s4/(s1-s2) \leq 1.3$     formula (B18)

When no hydrosilylation catalyst is present, the hydrosilylation reaction between the SiH unit of organohydrogensilicone represented by the general formula (4) and a compound having a carbon-carbon double bond does not proceed.

Therefore, the method of the present invention employs a hydrosilylation catalyst.

As the hydrosilylation catalyst that may be used in the present invention, a hydrosilylation catalyst known in the art may be used. Examples of hydrosilylation catalyst may include single metals belonging to the 8th group of the periodical table; the above metals (solid form) supported by carriers such as alumina, silica, and carbon black; salts of the metals, or complexes of the metals. Of them, metals belonging to the 8th group of the periodical table, such as platinum, rhodium and ruthenium, which have high hydrosilylation activity and rarely cause a by-production, are preferred, and platinum is particularly preferred. Examples of the hydrosilylation catalyst using platinum may include chloroplatinic acid, a complex of chloroplatinic acid with alcohol, aldehyde, or ketone, a platinum-vinyl silicone complex, a platinum-phosphine complex, a platinum-phosphite complex, dicarbonyl dichloroplatinum and dicyclopentadienyl dichloroplatinum.

The number of mole of catalyst to be used in a hydrosilylation reaction in terms of metal atom is preferably 1/1,200 or less based on the total number of mole of SiH unit of the organohydrogensilicone before the hydrosilylation reaction, more preferably 1/6,000 or less, and further preferably 1/25,000 or less, in order to suppress the ring opening of an epoxy group during the hydrosilylation reaction in order to produce epoxy silicone with good reproducibility. On the other hand, in order to carry out the hydrosilylation reaction at a reproducible rate, the number of mole of catalyst to be used in a hydrosilylation reaction in terms of metal atom is preferably 1/5,000,000 or more based on the total number of mole of SiH unit of the organohydrogensilicone before the hydrosilylation reaction, more preferably 1/1,000,000 or more, and further preferably 1/800,000 or more.

The amount of hydrosilylation catalyst to be used in adding the silicone having a carbon-carbon double bond and represented by the average composition formula (6) including at least the silicone having a carbon-carbon double bond and represented by the general formula (5) and the vinyl compound <B> including the compound <A> having a carbon-carbon double bond and an epoxy group, based on the amount of the SiH unit of organohydrogensilicone represented by the general formula (4), is not necessary fixed as long as it falls within the aforementioned range and may be varied in the beginning of the reaction and during the reaction.

In the present invention, the reaction temperature at which a hydrosilylation reaction is carried out varies depending upon the type or molecular weight of the organohydrogensilicone to be used and the silicone having a carbon-carbon double bond and represented by the average composition formula (6) at including at least the silicone having a carbon-carbon double bond and represented by the general formula (5) or the type of vinyl compound <B> including the compound <A> having a carbon-carbon double bond and an epoxy group, and further depending upon the reaction manner such as a batch type, a semi-batch type or a continuous type. However, in order to increase a reaction rate and efficiently complete the reaction, the temperature is preferably within the range of 0° C. or more and 250° C. or less, more preferably within the range of 10° C. or more and 200° C. or less, further preferably within the range of 20° C. or more and 150° C. or less, and particularly preferably within the range of 30° C. or more and 120° C. or less. The reaction temperature is not necessary fixed as long as it falls within the aforementioned range and may be varied in the beginning of the reaction and during the reaction.

In the present invention, when the hydrosilylation reaction is carried out, a solvent is preferably used in order to remove heat of reaction generated in the hydrosilylation reaction and suppress the denaturation of the epoxy silicone obtained and an increase in viscosity of the reaction system caused by an addition reaction.

Examples of the solvent to be used may include ether-based solvents such as dimethyl ether, diethyl ether, diisopropyl ether, 1,4-dioxane, 1,3-dioxane, tetrahydrofuran, ethylene glycol dimethyl ether, ethylene glycol diethyl ether, propylene glycol dimethyl ether, propylene glycol monomethyl ether acetate and anisole; ketone-based solvents such as acetone, methyl ethyl ketone and methyl isobutyl ketone; aliphatic hydrocarbon-based solvents such as hexane, cyclohexane, heptane, octane and isooctane; aromatic hydrocarbon-based solvents such as toluene, o-xylene, m-xylene, p-xylene and ethyl benzene; ester-based solvents such as ethyl acetate and butyl acetate; and alcohol-based solvents such as butyl cellosolve and butyl carbitol. These solvents may be used alone or as a mixture of two types or more.

Of them, an ether-based solvent, a ketone-based solvent, an aliphatic hydrocarbon-based solvent and an aromatic hydrocarbon-based solvent are preferred since the rate of hydrosilylation reaction is relatively large and solubility of a raw material and/or performance of a solvent recovery are satisfactory. A solvent containing an ether-based solvent in an amount of 50% by mass or more is more preferable and a single solvent or a mixture of two or more solvents selected from the group consisting of solvents having a boiling point of 120° C. or less in the normal atmospheric pressure, such as 1,4-dioxane, tetrahydrofuran, ethylene glycol dimethyl ether and propylene glycol dimethyl ether is further preferable.

The amount of solvent to be used varies depending upon the type or molecular weight of the organohydrogensilicone to be used, the silicone having a carbon-carbon double bond and represented by the average composition formula (6) including at least the silicone having a carbon-carbon double bond and represented by the general formula (5) or the type of vinyl compound <B> including the compound <A> having a carbon-carbon double bond and an epoxy group, and further depending upon the reaction manner such as a batch type, a semi-batch type or a continuous type. Generally, in the hydrosilylation reaction, the mass of the solvent based on the total mass of the mixture falls within the range of 0.1% by mass or more and 99.9% by mass or less, preferably within the range of 10% by mass or more and 95% by mass or less, and further preferably within the range of 20% by mass or more and 90% by mass or less.

In the present invention, the hydrosilylation reaction is preferably carried out in an inert gas atmosphere such as nitrogen, helium and argon.

In the present invention, the reaction method for a hydrosilylation reaction is not particularly limited. Example thereof may include a method of reacting the organohydrogensilicone to be used in the present invention with the silicone having a carbon-carbon double bond and represented by the average composition formula (6) including at least the silicone having a carbon-carbon double bond and represented by the general formula (5) and at least one or more compounds selected from the group consisting of the vinyl compound <B> including the compound <A> having a carbon-carbon double bond and an epoxy group, by using a single manner or in combination of two or more manners selected from the group consisting of a batch type, a semi-batch type and a continuous type, sequentially, continuously or at a time.

As the manner of adding a hydrosilylation catalyst, in the case of the following [Production process 1] mentioned above, it is preferred that the organohydrogensilicone represented by the general formula (4), the silicone having a carbon-carbon double bond and represented by the average composition formula (6) including at least the silicone having a carbon-carbon double bond and represented by the general formula (5), and the vinyl compound <B> including the compound <A> having a carbon-carbon double bond and an epoxy group, and further optionally a solvent are added in advance and finally a hydrosilylation catalyst is added. In the case of the following [Production process 2] mentioned above, it is preferred that the first step, in which the organohydrogensilicone of the general formula (4) and the vinyl compound <B> including the compound <A> having a carbon-carbon double bond and an epoxy group, and further optionally, a solvent are added in advance, and finally a hydrosilylation catalyst is added, is performed, and subsequently, a second step, in which the silicone having a carbon-carbon double bond and represented by the average composition formula (6) including at least the silicone having a carbon-carbon double bond and represented by the general formula (5) is added, is performed. Furthermore, the hydrosilylation catalyst may be additionally added in the second step. In this case, it is preferred that the hydrosilylation catalyst is additionally added after the silicone having a carbon-carbon double bond and represented by the average composition formula (6) including at least the silicone having a carbon-carbon double bond and represented by the general formula (5) is added. The method of adding a hydrosilylation catalyst finally in a reaction system is preferred since it is sometimes effective for preventing gelation of the reaction system due to a side reaction.

When the vinyl compound <B> including the compound <A> having a carbon-carbon double bond and an epoxy group and the silicone having a carbon-carbon double bond and represented by the average composition formula (6) including at least the silicone having a carbon-carbon double bond and represented by the general formula (5) are added to the SiH unit of organohydrogensilicone in accordance with a hydrosilylation reaction, the moisture content within the system may affect. In order to maintain a rate of hydrosilylation reaction or suppress a ring opening reaction of an epoxy group, the moisture content within the reaction system is preferably 2% by mass or less based on the mass of the reaction system, more preferably 1% by mass or less, further preferably 0.5% by mass or less, further more preferably 0.1% by mass or less, particularly preferably 0.05% by mass or less, and most preferably 0.01% by mass or less.

It is preferred that the following post treatments are performed, prior to separating and recovering epoxy silicone from a reaction mixture. This method is preferably used in order to suppress denaturation of epoxy silicone when the epoxy silicone is separated and recovered from the reaction mixture. More specifically, examples of the post treatment may include a) a treatment for reducing or eliminating an unreacted SiH unit by bringing an alcohol into contact with a reaction mixture or blending them; b) a treatment for deactivating or inactivating the catalyst by bringing a known deactivator or inactivator in the art for a hydrosilylation catalyst into contact with a reaction mixture or blending them; c) a treatment for removing or reducing a metal component such as a hydrosilylation catalyst, a coloring component, and the like by adsorption by bringing a reaction mixture into contact with an adsorbent or blending them or by bringing a reaction mixture to pass through an adsorbent; and d) performing these treatments in combination.

Examples of the alcohol to be used in the treatment a) may include at least one alcohol having a structure which is selected from the group consisting of chain, branched and cyclic structures which has carbon atoms of 1 or more and 4 or less. Examples of the deactivator or inactivator for a hydrosilylation catalyst to be used in the treatment b) may include sulfur-containing compounds such as dodecyl mercaptan and 2-mercaptobenzothiazole; nitriles such as acetonitrile, acrylonitrile, 2-pentenenitrile and 3-pentenenitrile; and acetylene-based compounds such as 1-heptyne, 1-octyne, 1-decyne, 3-methyl-1-pentyne, 2-propyn-1-ol, 3-butyn-1-ol, 2-pentyn-1-ol, 4-pentyn-1-ol, 4-pentyn-2-ol, 2-methyl-3-butyn-1-ol, 3-methyl-1-pentyn-3-ol, 3-methyl-1-hexyn-3-ol, 3,5-dimethyl-1-hexyn-3-ol, 2-phenyl-3-butyn-2-ol, 1-ethynyl-1-cyclohexanol, 2,5-dimethyl-3-hexyne-2,5-diol, 1,1-dimethyl-2-propynyl amine, 3-methyl-3-(trimethylsiloxy)-1-butyne, dimethyl-bis(1,1-dimethyl-2-propynoxy)-silane, 3-methyl-3-(trimethylsiloxy)-1-pentyne, 3,5-dimethyl-3-(trimethylsiloxy)-1-hexyne, 3-ethyl-3-(trimethylsiloxy)-1-pentyne, methyl propiolate and ethyl propiolate. Furthermore, examples of the adsorbent to be used in the treatment c) for removing or reducing a metal component such as a hydrosilylation catalyst and a coloring component, etc. by adsorption may include active carbon, cerite, silica gel, an alumina powder and an ion-exchange resin.

These post treatments are preferably performed in an inert gas atmosphere such as nitrogen, helium or argon.

The temperature for these post treatments is preferably within the range of 0° C. or more and 200° C. or less, more preferably within the range of 5° C. or more and 150° C. or less, further preferably within the range of 10° C. or more and 100° C. or less and particularly preferably within the range of 15° C. or more and 80° C. or less, in order to suppress denaturation of epoxy silicone. The reaction temperature is not necessary fixed as long as it falls within the aforementioned range and may be varied during the reaction.

A mixture containing the epoxy silicone obtained by the post treatment is subjected to an epoxy silicone separation step to recover the epoxy silicone of the present invention.

Hereinafter, in the process for producing the epoxy silicone of the present invention, the compound having a carbon-carbon double bond and an optional deactivator or inactivator of a hydrosilylation catalyst are collectively referred to as a low boiling-point compound, an optional solvent and alcohol optionally used in the treatment for reducing or eliminating an unreacted SiH unit are generally collectively referred to as a volatile compound.

Next, a method for separating epoxy silicone from a mixture containing epoxy silicone will be described.

A method for separating epoxy silicone from a mixture containing epoxy silicone is not particularly limited. For example, a method for removing a low boiling-point compound and a volatile compound from a mixture containing epoxy silicone may be mentioned. Alternatively, when epoxy silicone is a compound having high volatility, a method for separating and recovering epoxy silicone by distillation may be mentioned.

The temperature at which epoxy silicone is separated from a mixture containing epoxy silicone varies depending upon the type of epoxy silicone, low boiling-point compound and volatile compound; however, the temperature is preferably within the range of 0° C. or more and 200° C. or less, more preferably within the range of 5° C. or more and 150° C. or less, further preferably within the range of 10° C. or more and 100° C. or less, and particularly preferably within the range of 15° C. or more and 80° C. or less, in order to suppress denaturation of epoxy silicone. The temperature for separating epoxy silicone from a mixture containing epoxy silicone is not necessary fixed as long as it falls within the aforementioned range and may be varied during the reaction.

These separation operations are preferably performed in an inert gas atmosphere such as nitrogen, helium or argon.

In the step of separating epoxy silicone from a mixture containing epoxy silicone, it is preferred to use an apparatus capable of efficiently separating a low boiling-point compound and a volatile compound even when the viscosity of the mixture containing epoxy silicone increases by decreasing the contents of the low boiling-point compound and the volatile compound. Examples of such an apparatus may include an upright stirred vessel, a surface renewal type stirred vessel, a thin-film evaporator, a surface renewal type double-screw kneader, a double-screw horizontal stirrer, a wet-wall type reactor, a free-fall porous-board type reactor and a reactor for vaporizing a volatile component while dropping a compound along a support. These apparatuses may be used alone or in combination of two types or more.

In the epoxy silicone obtained by the process for producing of the present invention, a compound having a carbon-carbon double bond and a low boiling-point compound such as a solvent and/or a volatile compound, derived from the vinyl compound <B> including the compound <A> having a carbon-carbon double bond and an epoxy group used in producing epoxy silicone may sometimes remain.

Herein, the "compound having a carbon-carbon double bond" in the present invention will be described. The compound having a carbon-carbon double bond in the present invention refers to a compound having at least one carbon-carbon double bond in a molecule except silicone. Therefore, vinyl silicone and epoxy silicone are not included in this, even if they have a carbon-carbon double bond within a molecule.

Examples of such a compound having a carbon-carbon double bond may include:

(i) an excessive or unreacted vinyl compound, which is added to be subjected to a hydrosilylation reaction;

(ii) an impurity having a carbon-carbon double bond and contained in a vinyl compound, which is added to be subjected to a hydrosilylation reaction; and (iii) a by-product produced by internal rearrangement of the carbon-carbon double bond in a vinyl compound, which is added to be subjected to a hydrosilylation reaction, during a hydrosilylation reaction.

Specific examples of the impurity (ii) having a carbon-carbon double bond and contained in a vinyl compound, which is added to be subjected to a hydrosilylation reaction, may include 4-epoxyethylcyclohexene that may be sometimes contained in 4-vinylcyclohexene oxide.

The by-product (iii) produced by internal rearrangement of the carbon-carbon double bond in a vinyl compound, which is added to be subjected to a hydrosilylation reaction, during a hydrosilylation reaction, varies depending upon the type of vinyl compound to be uses and the hydrosilylation reaction conditions. As the by-product when 1-hexene is used as a vinyl compound, for example, 2-hexene and 3-hexene is mentioned. As the by-product when vinyl cyclohexane is used as a vinyl compound, ethylidenylcyclohexane is mentioned.

Furthermore, when, for example, epoxy cycloalkanes having a vinyl group, such as (a-1) 4-vinylcyclohexene oxide, (a-2) 1-methyl-4-isopropenyl cyclohexene oxide, (a-3) 1 methyl-4-vinyl-cyclohexene oxide and (a-4) vinyl norbornene oxide, are used as the vinyl compound, (b-1) 4-ethylidenylcyclohexene oxide, (b-2) 1-methyl-4-isopropedenyl-cyclohexene oxide, (b-3) 1 methyl-4-ethylidenylcyclohexene oxide and (b-4) ethylidenylnorbornene oxide are produced, respectively, as the by-products corresponding to (a-1) to (a-4). Furthermore, when (a-5) 1,2-epoxy-5-hexene is used as a compound having a carbon-carbon double bond and an epoxy group, 1,2-epoxy-4-hexene, 1,2-epoxy-3-hexene 1,2-epoxy-2-hexene, and the like are produced as the by-product corresponding to (a-5) by internal rearrangement of the carbon-carbon double bond in a vinyl compound during a hydrosilylation reaction.

Since the heat discoloration resistance and light resistance of a hardened material obtained by use of the epoxy silicone obtained by the process for producing of the present invention tend to improve, the total amount of low boiling-point compounds remaining in epoxy silicone is preferably 2% by mass or less, more preferably 1.5% by mass or less, further preferably 1% by mass or less, further more preferably 0.75% by mass or less, particularly preferably 0.5% by mass or less, and most preferably 0.3% by mass or less.

In the present invention, when the low boiling-point compound is comprised of at least two components, the total amount of low boiling-point compounds remaining in the epoxy silicone of the present invention means total value of the components remaining in the epoxy silicone.

The total amount of low boiling-point compounds remaining in the epoxy silicone is preferably low. However, although considerable time and labor are required for reducing the total amount of low boiling-point compounds to zero, the effect thereof in reducing coloration and discoloration is low. Therefore, in view of cost-effectiveness, the total amount of low boiling-point compounds remaining in the epoxy silicone is preferably reduced to about 0.003% by mass from a practical point of view.

Furthermore, of the low boiling-point compounds remaining in the epoxy silicone, the remaining amount of a compound having a carbon-carbon double bond is preferably 1.5% by mass or less based on the epoxy silicone, more preferably 1% by mass or less, further preferably 0.75% by mass or less, further more preferably 0.5% by mass or less, particularly preferably 0.3% by mass or less, and most preferably 0.1% by mass or less, in order to reduce coloration and discoloration of a hardened material by light or heat.

In the present invention, when a compound having a carbon-carbon double bond is comprised of at least two components, the remaining amount of a compound having a carbon-carbon double bond remaining in the epoxy silicone of the present invention means the total value of the components remaining in the epoxy silicone.

Furthermore, among the compounds having a carbon-carbon double bond remaining in the epoxy silicone, the remaining amount of the compound having an epoxy group is preferably 1% by mass or less based on the epoxy silicone, more preferably 0.6% by mass or less, further preferably 0.3% by mass or less, further more preferably 0.1% by mass or less, and particularly preferably 0.05% by mass or less, in order to reduce coloration and discoloration of a hardened material by light or heat.

In the present invention, when a compound having a carbon-carbon double bond and an epoxy group is comprised of at least two components, the remaining amount of a compound having a carbon-carbon double bond and an epoxy group means the total amount of the remaining components.

Furthermore, among the compounds having a carbon-carbon double bond remaining in the epoxy silicone, the remaining amount of a by-product obtained by the internal rearrangement of the carbon-carbon double bond of a compound <A> having a carbon-carbon double bond and an epoxy group, which is added to be subjected to a hydrosilylation reaction is preferably not more than 0.5% by mass based on the epoxy silicone, more preferably 0.3% by mass or less, further preferably 0.1% by mass or less, and particularly preferably 0.05% by mass or less, in order to reduce coloration and discoloration of a hardened material by light and heat.

If not less than two by-products are obtained herein by the internal rearrangement of the carbon-carbon double bond of a compound <A> having a carbon-carbon double bond and an epoxy group, which is added to be subjected to a hydrosilylation reaction and remain in the epoxy silicone, the remaining amount of a by-product obtained by the internal rearrangement of the carbon-carbon double bond of a vinyl compound having an epoxy group, which is added to be subjected to a hydrosilylation reaction, means the total amount of the remaining components.

Note that in the case where compounds having a carbon-carbon double bond and an epoxy group different in the position of carbon-carbon double bond are already contained in the compound <A> having a carbon-carbon double bond and an epoxy group, which is added to be subjected to a hydrosilylation reaction, the compounds different in the position of carbon-carbon double bond are not included in the by-product generated by the internal rearrangement of the carbon-carbon double bond of a compound <A> having a carbon-carbon double bond and an epoxy group in the present invention.

Furthermore, in the present invention, when a deactivator or an inactivator of the hydrosilylation catalyst is brought into contact with a reaction mixture or blended with the mixture to deactivate or inactivate the catalyst, the remaining amount of deactivator or inactivator of the hydrosilylation catalyst used in the treatment is preferably 0.5% by mass or less, based on the epoxy silicone, more preferably 0.3% by mass or less, further preferably 0.1% by mass or less, and particularly preferably 0.05% by mass or less, in order to reduce coloration and discoloration of a hardened material by light or heat.

If the deactivator or inactivator of the hydrosilylation catalyst is comprised of at least two components, the remaining amount of deactivator or inactivator of the hydrosilylation catalyst remaining in the epoxy silicone of the present invention means the total value of the components remaining in the epoxy silicone.

In the epoxy silicone obtained by the present invention, a solvent used in producing the epoxy silicone, and a volatile compound used in the treatment for reducing or eliminating an unreacted SiH unit by bringing a reaction mixture into contact with an alcohol or blending them, may sometimes remain. The total amount of volatile compounds remaining in the epoxy silicone of the present invention is preferably 1% by mass or less, more preferably 0.1% by mass or less, and further preferably 0.05% by mass or less, in order to suppress generation of air bubbles in a hardened material in a hardening process of the epoxy silicone of the present invention.

In the present invention, when the volatile compound is comprised of at least two components, the total amount of volatile compounds remaining in the epoxy silicone means the total value of the components remaining in the epoxy silicone.

The total amount of volatile compounds remaining in the epoxy silicone is preferably low. Although considerable time and labor are required for reducing the total amount of remaining volatile compounds to zero, the effect thereof in reducing coloration and discoloration is low. Therefore, in view of cost-effectiveness, the total amount of volatile compounds remaining in the epoxy silicone is preferably reduced to about 0.005% by mass from a practical point of view.

The epoxy silicone obtained by the present invention may be sometimes contaminated with a residue of a catalyst such as a hydrosilylation catalyst used in producing the epoxy silicone or with metal components leaking out from a reaction apparatus. For example, when SUS 316 alloy is used, metal elements such as Fe, Ni, Cr and Mo may sometimes leak out. Of these metals, transition metal components may affect the light resistance of a hardened material obtained in a hardening process of the epoxy silicone obtained by the present invention. In order to maintain the light resistance of the hardened material at a high level, the total amount of transition metal components corresponding to the 3rd group and the 11th group of the periodical table which is contained in the epoxy silicone of the present invention is preferably 20 ppm or less in terms of element, more preferably 10 ppm or less and further preferably 5 ppm or less.

As a method for reducing the content of the transition metal components, for example, there is a method of removing a metal component by adsorption by passing a reaction solution after a hydrosilylation reaction through an adsorbent such as activated carbon, silica gel, an alumina powder and an ion exchange resin. In addition, as a preferable example, there is a method of reducing the use amount of catalyst for use in a hydrosilylation reaction such that the total amount of transition metal components contained in the epoxy silicone of the present invention fall within the aforementioned range (or less), in consideration of the amount of transition metal components leaking out from a reaction apparatus in the step of producing the epoxy silicone of the present invention.

The epoxy silicone obtained by the present invention has excellent transparency, based on which the epoxy silicone can be used in usages requiring transparency. Simultaneously, the epoxy silicone has excellent light resistance, heat resistance, heat discoloration resistance, as well as crack resistance and adhesiveness, and thus it is suitably used as a light-emitting device sealing material. Furthermore, the epoxy silicone of the present invention provides a rigid hardened material having excellent dimensional stability. Therefore, the epoxy silicone is suitably used as a material for lenses such as glass lens, lens for optical equipment, pick-up lens for CD and DVD, lens for automobile head lamps and lens for a projector. Furthermore, the epoxy silicone can be used also as optical members such as an optical fiber, a light guide, an optical filter, an adhesive for optical use, an optical disk substrate, a display board and a coating material including an anti-reflection film, and a various optical element.

For the aforementioned uses, the epoxy silicone obtained by the present invention is used as a curable mix composition by optionally and appropriately adding well-known additives in the art such as an epoxy resin and/or a hardening agent for an epoxy resin, a hardening accelerator, a cationic polymerization catalyst, a denaturant, an antioxidant, a heat stabilizer, a silane coupling agent, a defoaming agent, a coloring agent, a fluorescent substance, a light diffusion agent, an inorganic filler and a heat conductive filler.

Examples of the epoxy resin to be used include aromatic epoxy resins represented by aromatic glycidyl ether known in the art, glycidyl ethers obtained by hydrogenating an aromatic ring of an aromatic epoxy resin, alicyclic epoxy resins and other epoxy resins. They may be used alone or as a mixture of two types or more.

Examples of the aromatic glycidyl ethers include bisphenol-based epoxy resins obtained by glycidylating bisphenols such as bisphenol A, bisphenol F, bisphenol AD, bisphenol S, tetramethyl bisphenol A, tetramethyl bisphenol F, tetramethyl bisphenol AD, tetramethyl bisphenol S, tetrabromo bisphenol A, tetrachloro bisphenol A and tetrafluoro bisphenol A; epoxy resins obtained by glycidylating other divalent phenols such as biphenol, dihydroxynaphthalene and 9,9-bis(4-hydroxyphenyl)fluorene; epoxy resins obtained by glycidylating trisphenols such as 1,1,1-tris(4-hydroxyphenyl)methane and 4,4-(1-(4-(1-(4-hydroxyphenyl)-1-methylethyl)phenyl)ethylidene)bisphenol; epoxy resins obtained by glycidylating tetrakis phenols such as 1,1,2,2,-tetrakis(4-hydroxyphenyl) ethane; and novolak-based epoxy resins obtained by glycidylating novolaks such as a phenol novolak, a cresol novolak, a bisphenol A novolak, a brominated phenol novolak and a brominated bisphenol A novolak.

The hydrogenation reaction of an aromatic ring of an aromatic glycidyl ether can be performed by a method known in the art using a catalyst such as a ruthenium-based catalyst or a rhodium-based catalyst.

Examples of the alicyclic epoxy resins may include compounds known in the art such as 3,4-epoxycyclohexylmethyl-3',4'-epoxycyclohexane carboxylate, 1,2-epoxy-4-(2-oxiranyl)cyclohexane adduct of 2,2-bis(hydroxymethyl)-1-butanol, and bis(3,4-epoxycyclohexylmethyl)adipate.

Examples of other epoxy resins may include glycidyl esters such as glycidyl esters of dimer acids and glycidyl esters of hexahydro phthalic acids; glycidyl amines such as triglycidyl isocyanurate; linear aliphatic epoxy compounds such as epoxylated soybean oil and epoxylated polybutadiene.

When an aromatic epoxy resin is used as the epoxy rein, satisfactory light resistance tends to be obtained. Therefore, the ratio of the aromatic epoxy resin based on the total mass of the epoxy resins to be used is preferably 50% by mass or less, more preferably 30% by mass or less, and further preferably 10% by mass or less. Particularly preferably, an epoxy resin containing no aromatic epoxy resin is used.

The use amount of epoxy resin is preferably from 0.1 to 100 parts by mass based on the epoxy silicone (100 parts by mass) obtained by the present invention, more preferably from 1 to 100 parts by mass, and further preferably from 1 to 80 parts by mass.

The epoxy-resin hardening agent that can be used in the present invention is not particularly limited and a general hardening agent can be used; however, an acid anhydride-based hardening agent is preferably used since a transparent and colorless hardened material tends to be obtained. Specific examples thereof may include alicyclic acid anhydrides such as polyazelaic anhydride, methyltetrahydrophthalic anhydride, tetrahydrophthalic anhydride, methylhexahydrophthalic anhydride, hexahydrophthalic anhydride, 5-norbornene-2,3-dicarboxylic acid anhydride, norbornane-2,3-dicarboxylic acid anhydride, methyl-5-norbornene-2,3-dicarboxylic acid anhydride and methyl-norbornane-2,3-dicarboxylic acid anhydride; aromatic acid anhydrides such as phthalic anhydride, trimellitic anhydride and pyromellitic anhydride; and silicones having not less than two acid anhydride-containing functional groups in a molecule as substituents.

Of these hardening agents, alicyclic acid anhydrides and silicones having not less than two acid anhydride-containing functional groups in a molecule as substituents are more preferably used since the light resistance of a hardened material obtained by hardening the epoxy silicone of the present invention tends to be improved, and methyl hexahydrophthalic anhydride, hexahydrophthalic anhydride, norbornane-2,3-dicarboxylic acid anhydride and methyl norbornane-2,3-dicarboxylic acid anhydride are further preferably used. These hardening agents may be used alone or as a mixture of two types or more.

The use amount of epoxy resin hardening agent preferably fall within the range of 0.1 to 3 equivalents based on the epoxy group of epoxy silicone obtained by the present invention and more preferably within the range of from 0.5 to 2 equivalents; and falls within the range of from 1 part by mass to 200 parts by mass based on the epoxy silicone (100 parts by mass), more preferably within the range of from 10 parts by mass to 150 parts by mass, and further preferably within the range of from 20 parts by mass to 100 parts by mass.

The curable mix composition obtained by use of the epoxy silicone obtained by the present invention may optionally contain a hardening accelerator. Examples of the hardening accelerator to be used may include an imidazole compound, a quaternary ammonium salt, a phosphonium salt, an amine compound, an aluminium chelating compound, an organic phosphine compound, a metal carboxylic acid salt and an acetylacetone chelating compound. These hardening accelerators may be used alone or as a mixture of two types or more.

Specific examples of these compounds may include amine compounds and salts thereof such as 2-methylimidazole, 2-ethyl-4-methylimidazole, 1,8-diaza-bicyclo(5,4,0)undecene-7, trimethylamine, benzyldimethylamine, triethylamine, 2,4,6-tris(dimethylaminomethyl)phenol and 2-(dimethylaminomethyl)phenol; quaternary ammonium salts such as tetramethylammonium chloride, benzyltrimethylammonium bromide and tetrabutylammonium bromide; organic phosphine compounds such as ammonium chelate, tetra-n-butylphosphonium benzotriazolate and tetra-n-butylphosphonium-0,0-diethyl phosphorodithioate; metal carboxylic acid salts such as chromium(III) tricarboxylate, tin octoate and chromium acetylacetonate; and acetyl acetone chelate compounds. Furthermore, as commercially available products, U-CAT SA1, U-CAT 2026 and U-CAT 18X manufactured by San-Apro Limited may be mentioned. Of them, an imidazole compound, a quaternary ammonium salt, a phosphonium salt and an organic phosphine compound are preferably used since a hardening material less colored is provided.

The content of these hardening accelerators is preferably 0.001 part by mass or more, based on epoxy silicone (100 parts by mass), more preferably 0.01 part by mass or more, and particularly preferably 0.1 part by mass or more, in order to increase a hardening rate. On the other hand, in view of humidity resistance and coloration of a hardened material, the content is preferably 10 parts by mass or less, more preferably 5 parts by mass or less, further preferably 3 parts by mass or less, and particularly preferably 1 part by mass or less.

The epoxy silicone of the present invention can be used as a curable mix composition by blending a cationic polymerization catalyst known in the art.

Examples of the cationic polymerization catalyst to be used may include Lewis acid catalysts represented by $BF_3$.amine complex, $PF_5$, $BF_3$, $AsF_5$ and $SbF_5$; thermo-setting cationic polymerization catalysts represented by a phosphonium salt, a quaternary ammonium salt, a sulfonium salt, a benzyl ammonium salt, a benzyl pyridinium salt, a benzyl sulfonium salt, a hydrazinium salt, a carboxylic acid ester, a sulfonic acid ester and an amine imide; and UV hardening cationic polymerization catalysts represented by diaryliodonium hexafluorophosphate and hexafluoroantimonate-bis (dodecyl phenyl)iodonium.

Of them, a thermo-setting cationic polymerization catalyst is preferably used since a transparent hardened material less colored having a high glass transition temperature and excellent solder heat resistance and adhesiveness tends to be obtained. Examples of the thermo-setting cationic polymerization catalyst may include a sulfonium salt based cationic polymerization initiator such as SI-100L and SI-60L (these are manufactured by Sanshin Chemical Industry Co., Ltd.), and CP-66 and CP-77 (these are manufactured by Adeka Corporation).

The content of the cationic polymerization catalyst is preferably 0.001 part by mass or more, based on the epoxy silicone (100 parts by mass), more preferably 0.005 parts by mass or more, and further preferably 0.01 part by mass or more, in order to improve a hardening rate. On the other hand, in view of humidity resistance and coloration of a hardened material, the content is preferably 10 parts by mass or less, more preferably 1 part by mass or less, further preferably 0.5 parts by mass or less, and particularly preferably 0.2 parts by mass or less.

As a hardening agent and hardening accelerator suitably used in the epoxy silicone of the present invention, for example, an aluminium compound having an organic group such as aluminium trisacetylacetonate (as described in Japanese Patent Application Laid-Open Nos. 4-84444 and 2005-93569) and a compound having an OH group directly bound to Si such as diphenylsilane diol and diphenyl diethoxysilane or an alkoxy group are used in combination other than those mentioned above.

The curable mix composition obtained by use of the epoxy silicone obtained by the present invention may optionally contain a denaturizing agent in order to impart flexibility to a hardened material and improve peel/adhesive force. As the denaturizing agent to be used, a polyol containing two or more hydroxyl groups in a molecule may be exemplified. Examples thereof that preferably used may include aliphatic polyols such as ethylene glycol, diethylene glycol, triethylene glycol, polyethylene glycol, 1,2-propanediol, 1,3-propanediol, dipropylene glycol, tripropylene glycol, polypropylene glycol, 1,2-butanediol, 1,4-butanediol, neopentyl glycol, glycerin, erythritol, trimethylolpropane and 1,2,4-butane triol; polycarbonate diol and silicone having a silanol group at an end. These denaturizing agents may be used alone or as a mixture of two types or more.

The content of the polyol containing two or more hydroxyl groups in a molecule is preferably not less than 0.1 part by mass based on the epoxy silicone (100 parts by mass) in order to improve adhesiveness, more preferably not more than 50 parts by mass in order to improve heat resistance and humidity resistance, more preferably from 1 to 30 parts by mass, further preferably from 3 to 20 parts by mass and particularly preferably 3 to 10 parts by mass.

The curable mix composition of the present invention may employ various types of silane coupling agents in order to improve physical properties such as adhesiveness. Examples of the silane coupling agent suitably used in the present invention may include 3-glycidoxypropyltrimethoxysilane, 3-glycidoxypropyltriethoxysilane, 3-glycidoxypropylmethyldimethoxysilane, 3-glycidoxypropylmethyldiethoxysilane, 3-glycidoxypropyldimethylmethoxysilane, 3-glycidoxypropyldimethyl ethoxysilane, 2-(3,4-epoxycyclohexyl)ethyltrimethoxysilane, 2-(3,4-epoxycyclohexyl)ethyltriethoxysilane 3-aminopropyltrimethoxysilane, 3-aminopropyltriethoxysilane, 3-aminopropylmethyldiethoxysilane, 3-aminopropyldimethylethoxysilane, N-(2-aminoethyl)aminomethyltrimethoxysilane, N-(2-aminoethyl)(3-aminopropyl)trimethoxysilane, N-(2-aminoethyl)(3-aminopropyl)triethoxysilane, N-(2-aminoethyl)(3-aminopropyl)methyldimethoxysilane, N—[N'-(2-aminoethyl)(2-aminoethyl)](3-aminopropyl) trimethoxysilane, 2-(2-aminoethyl)thioethyltriethoxysilane, 2-(2-aminoethyl)thioethylmethyldiethoxysilane, 3-(N-phenylamino)propyltrimethoxysilane, 3-(N-cyclohexylamino) propyltrimethoxysilane, (N-phenylaminomethyl)trimethoxysilane, (N-phenylaminomethyl)methyldimethoxysilane, (N-cyclohexylaminomethyl)triethoxysilane, (N-cyclohexylaminomethyl)methyldiethoxysilane, piperazinomethyltrimethoxysilane, piperazinomethyltriethoxysilane, 3-piperazinopropyltrimethoxysilane, 3-piperazinopropylmethyldimethoxysilane, 3-ureidopropyltriethoxysilane, mercaptomethyltrimethoxysilane, mercaptomethyltriethoxysilane, mercaptomethylmethyldimethoxysilane, mercaptomethylmethyldiethoxysilane, 3-mercaptopropyltrimethoxysilane, 3-mercaptopropyltriethoxysilane, 3-mercaptopropylmethyldimethoxysilane, 3-mercaptopropylmethyldiethoxysilane, 3-(trimethoxysilyl)propyl succinic anhydride, 3-(triethoxysilyl)propyl succinic anhydride, tetramethoxysilane, tetraethoxysilane, methyltrimethoxysilane, methyltriethoxysilane, ethyltrimethoxysilane, ethyltriethoxysilane, propyltrimethoxysilane, propyltriethoxysilane, vinyltrimethoxysilane, vinyltriethoxysilane, cyclohexyltrimethoxysilane, cyclohexyltriethoxysilane, cyclopentyltrimethoxysilane, cyclopentyltriethoxysilane, phenyltrimethoxysilane, phenyltriethoxysilane, dimethyldimethoxysilane, dimethyldiethoxysilane, methylvinyldimethoxysilane, methylvinyldiethoxysilane, methylphenyldimethoxysilane, methylphenyldiethoxysilane, methylcyclohexyldimethoxysilane, methylcyclohexyldiethoxysilane, methylcyclopentyldimethoxysilane, methylcyclopentyldiethoxysilane, 3-methacryloxypropylmethyldimethoxysilane, 3-methacryloxypropyltrimethoxysilane, 3-methacryloxypropylmethyldiethoxysilane, and 3-methacryloxypropyltriethoxysilane. Furthermore, partial condensates of these silane coupling agents may be used.

As a hardening method for a curable mix composition obtained by use of the epoxy silicone of the present invention, known methods in the art may be used. Of the known methods, a hardening method by heating or a hardening method by UV irradiation are generally used as a method for hardening an epoxy resin. These may be mentioned as preferable methods in the present invention. The temperature for hardening by heating is not particularly limited since it varies depending upon the epoxy resin and hardening agent, etc. to be used; however, generally the temperature falls within the range of 20 to 200° C.

The hardening reaction may be performed in air or otherwise can be performed, if necessary, in an inert gas atmosphere such as nitrogen, helium and argon.

The curable mix composition containing the epoxy silicone of the present invention can be suitably used as a light-emitting device sealing material. Furthermore, light-emitting components such as a light-emitting diode can be manufactured by sealing a light-emitting device with the light-emitting device sealing material.

The emission wavelength from a light-emitting device sealed with the light-emitting device sealing material formed of the curable mix composition containing the epoxy silicone of the present invention is broad from infrared to red, green, blue, purple and ultraviolet. The light-emitting device sealing material can be used in practice even for light having a wavelength of 250 nm to 550 nm, at which a conventional sealing material degrades because of lack of light resistance. Therefore, a white-light-emitting diode having a long life, high energy efficiency and high color reproducibility can be obtained. The emission wavelength used herein refers to a main luminescence peak wavelength.

Specific examples of the light-emitting device to be used may include a light-emitting device formed by laminating a semiconductor material on a substrate. In this case, examples of the semiconductor materials may include GaAs, GaP, GaAlAs, GaAsP, AlGaInP, GaN, InN, MN, InGaAlN and SiC.

Examples of the substrate may include, sapphire, spinel, SiC, Si, ZnO, GaN single crystals. If necessary, a buffer layer may be formed between the substrate and the semiconductor material. Examples of the buffer layers may include GaN, AlN, and the like.

The method for laminating a semiconductor material on a substrate is not particularly limited; however, for example, a MOCVD method, a HDVPE method and a liquid phase growth method may be used.

Examples of the structure of a light-emitting device may include a homo junction, a heterojunction and a double hetero structure having an MIS junction, a p-n junction and a PIN junction. Alternatively, a single or multiquantum well structure may be used.

A light-emitting diode can be manufactured by sealing a light-emitting device with the light-emitting device sealing material formed of the curable mix composition containing the epoxy silicone of the present invention. The light-emitting device can be sealed herein only by the light-emitting device sealing material; however, may be sealed in combination with another different sealing material. When the different sealing material is used in combination, a light-emitting device sealed by the light-emitting device sealing material obtained by use of the epoxy silicone obtained by the present invention, and thereafter, the periphery thereof is sealed with the different sealing material. Alternatively, a light-emitting device is sealed with the different sealing material, and thereafter, the periphery thereof is sealed with the light-emitting device sealing material obtained by use of the epoxy silicone obtained by the present invention. Examples of the different sealing material may include an epoxy resin, a silicone resin, an acrylic resin, a urea resin, an imide resin and glass.

A method for sealing a light-emitting device with the light-emitting device sealing material obtained by use of the epoxy silicone obtained by the present invention, mention may be made of a method in which a light-emitting device sealing material is previously injected in a frame mold and a lead frame having a light-emitting device immobilized thereto is soaked therein and thereafter, hardening is performed; and a method in which a light-emitting device sealing material is injected in a frame mold having a light-emitting device inserted and then hardening is performed. In these cases, as a method for injecting a light-emitting device sealing material, injection by a dispenser, transfer molding and injection molding may be mentioned. Furthermore, examples of other sealing methods may include a method in which a light-emitting device sealing material is added dropwise onto a light-emitting device, and then applied by mimeo graphic printing, screen printing or via a mask and then hardening is performed, and a method in which a light-emitting device sealing material is injected to a cup or the like having a light-emitting device placed in the lower portion, by use of a dispenser and then hardening is performed.

The curable mix composition containing the epoxy silicone obtained by the present invention may be used as a die bonding material for immobilizing a light-emitting device to a lead terminal and a package, as a passivation film on the light-emitting device and as a package substrate.

As the shape of a portion to be sealed, cannonball-lens form, plate-form and thin film form may be mentioned.

A light-emitting diode obtained by use of the epoxy silicone of the present invention can be improved in performance by a known method in the art. Examples of the method for improving the performance may include a method of providing a light reflecting layer or a light-collection layer onto the back surface of a light-emitting device; a method of forming a complementary-color applied portion on the bottom; a method of providing a layer absorbing light having a shorter wavelength than a main luminescent peak on a light-emitting device; a method of sealing a light-emitting device and further molding by a hard material; a method of immobilizing a light-emitting diode by inserting it in a through-hole; and a method of connecting a light-emitting device to a lead member and the like, by a flip-chip connection, thereby taking out light from the side of a substrate.

The light-emitting diode obtained by use of the epoxy silicone of the present invention is useful as a backlight of liquid crystal displays, light sources for illumination, various types of sensors, printers, and copying machines; light sources for automobile meters, light sources for signal lamps, display lamps, display devices and planer luminous bodies; lights such as display light and decoration light; and various types of lights.

EXAMPLES

The present invention will be more specifically described by way of examples below; however the present invention is not limited by the following examples.

The composition and characteristics of silicone were obtained by the following methods.

(1) Calculation of a Ratio [WB]/[WA], i.e., a Content Ratio of a Compound Represented by the General Formula (1) to the Content of a Compound Represented by the General Formula (2)

The value of each of [WB] and [WA] of the present invention represents peak intensity, which corresponds to the total of the mass, which corresponds to each of the structures represented by the general formulas (1) and (2) and which is obtained by measuring the epoxy silicone by the Matrix Assisted Laser Desorption/Ionization time-of-flight Mass Spectrometry (hereinafter referred to as MALDI-TOF/MS), and the mass (23) of sodium.

Note that the mass, which corresponds to each of the structures represented by the general formulas (1) and (2) refer to as follows. When the elements constituting the structure have isotopes, the mass refers to a value calculated by use of the mass of the isotope present at the largest ratio in the isotopes of the elements.

Furthermore, in the present invention, when a plurality of peaks arepresent corresponding to the general formulas (1) and (2), the content [WA] of a compound having a structure of the general formula (1) and the content [WB] of a compound having a structure of the general formula (2) are each defined as the sum of peak intensities corresponding to each structure.

Note that the peak intensity, which is an intensity of 3% or less based on the maximum intensity of the peak corresponding to the sum of the mass corresponding to each of the general formulas (1) and (2) and the mass 23 of sodium was eliminated from calculation for obtaining the sum of peak-intensity values.

The measurement method by the MALDI-TOF/MS was performed as follows.

<MALDI-TOF/MS Measurement Method>

A solution having 0.1 g of epoxy silicone dissolved in tetrahydrofuran (100 mL) at room temperature and a solution having 10 mg of dithranol dissolved in tetrahydrofuran (1 mL) were mixed homogeneously in a volume ratio of 1:1 at room temperature to prepare solution a. Subsequently, to a sample plate on which a solution (1 µL) having 10 mg of sodium iodide dissolved in acetone (10 mL) was placed, solution a was added dropwise. After the solvent was vaporized at room temperature, measurement was performed by the MALDI-TOF/MS in the following measurement conditions.

| <Measurement conditions> | |
|---|---|
| Apparatus: | Shimadzu AXIMA CFRplus |
| Laser: | Nitrogen laser (337 nm) |
| Detector mode: | Linear mode |
| Ion detection: | Positive ion (positive mode) |
| Total number of times: | 500 times |

(2) Composition of Epoxy Silicone

Calculation was performed based on the results obtained by $^{29}$Si-NMR measurement, gel permeation chromatography (GPC) measurement and H$^1$-NMR measurement.

More specifically, $^{29}$Si-NMR measurement of epoxy silicone was performed in accordance with the method described below. From the obtained spectrum pattern, an integral value was calculated and analyzed to calculate the content of a hydrogen alkyl unit and a dialkylsiloxy unit by percentages.

Subsequently, H$^1$-NMR measurement was performed in accordance with the method described below. From the obtained spectrum pattern, an integral value was calculated. Based on the integral value, the abundance ratio of an alkylsiloxy unit having organic groups was calculated by percentages.

Using the abundance ratios and theoretical formula weights of the individual structural units obtained above, an average formula weights of the structural units were calculated.

Subsequently, gel permeation chromatography (GPC) of epoxy silicone was performed in accordance with the method described below. The number average molecular weight obtained, which was regarded as the molecular weight per mole of the epoxy silicone represented by the average composition formula (3), was divided by the average formula weight calculated above in consideration of the abundance ratios of individual units. In this way, the total number of mole of the individual units constituting the epoxy silicone represented by the average composition formula (3) was calculated. Using the obtained total number of mole of the individual units constituting the epoxy silicone represented by the average composition formula (3) and the abundance ratios of individual units, the numbers of mole of the individual units constituting a mole of epoxy silicone represented by the average composition formula (3) were obtained.

<$^{29}$Si-NMR Measurement Method>

Epoxy silicone (0.15 g) was dissolved in deuterated chloroform (1 g). To the solution, 0.015 g of Cr(acac)$_3$ was added and dissolved. To the resultant solution, tetramethylsilane (10 µL) was further added to obtain an NMR measurement solution. $^{29}$Si-NMR measurement was performed by using the NMR measurement solution 4000 times by use of an apparatus (α-400 manufactured by JEOL Ltd.) under complete proton decoupling conditions.

<$^1$H-NMR Measurement Method>

Epoxy silicone (30 mg) was dissolved in deuterated chloroform (1 mL) to obtain a solution. Using this solution as a measurement sample, $^1$H-NMR measurement was performed 200 times in total by use of an apparatus (a-400 manufactured by JEOL Ltd.) at 400 MHz.

<Gel Permeation Chromatography (GPC) Measurement>

Using a gel permeation chromatography (GPC) measurement apparatus, 8020GPC system (manufactured by Tosoh Corporation), (GPC) measurement was performed in the following conditions.

A 0.5% by mass tetrahydrofuran solution of epoxy silicone was prepared, and thereafter, filtrated through a 0.45 µm filter, and used as a measurement sample solution.

An eluent (tetrahydrofuran) was passed though a column in the conditions: a column temperature of 40° C. and at a flow rate of 1 mL/minute. Based on the elution time and the intensity detected by RI detection, a number average molecular weight was calculated.

The column is constituted as follows. TSK guard column H$_{XL}$-H (registered trade mark) manufactured by Tosoh Corporation was used as a guard column. A single TSK gel column (registered trade mark) G5000H$_{XL}$ manufactured by Tosoh Corporation, a single TSK gel column (registered trade mark) G3000H$_{XL}$ manufactured by Tosoh Corporation, and a single TSKgel column (registered trade mark) G1000H$_{XL}$ manufactured by Tosoh Corporation were arranged in series and put in use. Furthermore, using monodispersed polystyrene reference substances (manufactured by Polymer Laboratories) having molecular weights of 7,500,000, 2,560,000, 841,700, 320,000, 148,000, 59,500, 28,500, 10,850, 2,930, and 580 and a styrene monomer (molecular weight of 104), a number average molecular weight was calculated from the calibration curve previously prepared.

(3) The Content of a Component Having a Molecular Weight of 800 or Less in Epoxy Silicone The content was calculated by analyzing the elution curve obtained by the above gel permeation chromatography (GPC) measurement.

To describe more specifically, the content refers to a numerical value (expressed by percentages) representing the ratio of the peak area (peak area 2), which corresponds to a molecular weight of 800 or less, to the total area (peak area 1) surrounded by the peak corresponding to epoxy silicone and the base line of the elution curve, in short, a numerical value expressed by [peak area 2]/[peak area 1]×100(%).

(4) Measurement of the Amounts of a Low Boiling-Point Compound and a Volatile Compound Remaining in Epoxy Silicone They were obtained by use of gas chromatographic device GG-14B manufactured by Shimadzu Corporation in the following conditions.

In a 5 mL messflask, epoxy silicone (about 0.5 g) and n-octane (0.015 g) serving as the internal standard were weighed and diluted with chloroform (15 mL). The resultant solution was used as a measurement sample.

Column: DB-1 (registered trademark) manufactured by J & W Scientific having a length of 30 m, and an inner diameter of 0.25 mm and a liquid film of 1 µm Carrier gas: Helium Detector: FID Injection temperature: 250° C.

Temperature of the detector: 300° C.

Temperature increasing conditions: After the reaction was held at 50° C. for 5 min, the temperature was raised from 50° C. to 300° C. at a rate of 10° C./min.

From the results obtained, the contents of individual components contained in epoxy silicone were determined by use of the calibration curve separately prepared in accordance with the internal standardization and summed up. Note that the numerical value is expressed by a mass fraction based on epoxy silicone.

(5) Epoxy Value

Epoxy value was obtained by the following operation and calculation method.

Epoxy silicone was dissolved in benzyl alcohol and 1-propanol. To this solution, an aqueous potassium iodide solution and a bromophenol blue indicator were added. Thereafter, titration was performed by 1N hydrochloric acid. The equivalent point was determined at the time point when the color of the reaction system was changed from blue to yellow. Based on the equivalent point, the epoxy value of the epoxy silicone was calculated in accordance with the following formula:

Epoxy value(Equivalent/100 g)=($V \times N \times F$)/($10 \times W$)

wherein W, V, N and F represent the following values:
  W: Weight (g) of a sample
  V: Titration volume (mL)
  N: Normality (N) of hydrochloric acid used in titration
  F: Factor of hydrochloric acid used in titration.

(6) Metal Element Content

The content of platinum was measured by the quadrupole ICP mass spectrometric apparatus (X7-ICP-MS manufactured by Thermo Elemental)

(7) Transparency

Using a hardened material having a thickness of 3 mm, the transmissivity of each of light beams having a wavelength of 350 nm, 400 nm and 450 nm in the thickness direction was measured by JASCO V-550 (manufactured by JASCO Corporation). An initial light beam transmissivity of 80% or more was evaluated by "excellent", 70% or more and less than 80% by "good", and less than 70% by. "bad".

(8) Heat Resistance

The Tg of a pulverized hardened material was measured by DSC220 C (manufactured by Seiko Instruments Inc.) at a temperature increasing rate of 10° C./minute and used as a heat resistance index. The Tg of the hardened material of 120° C. or more is evaluated by "excellent", 100° C. or more and less than 120° C. by "good", and less than 100° C. by "bad".

(9) Light Resistance

A hardened material having a thickness of 3 mm was set in a constant-temperature dryer set at a constant temperature of 50° C. such that UV rays could be applied by an UV irradiation apparatus (SP-7 manufactured by Ushio Inc.) through an optical fiber. Light having a wavelength of 330 to 410 nm was applied by use of a 365 nm band pass filter so as to obtain 3W/cm$^2$.

After initiation of irradiation, a hardened material that was not colored for 250 hours or more was evaluated by "excellent", a hardened material that was colored in 200 hours to less than 250 hours by "good", and less than 200 hours by "bad".

(10) Thermal Discoloration Resistancet

The transmissibility of a light-beam having a wavelength of 400 nm through a hardened material having a thickness of 3 mm in the thickness direction was measured by JASCO V-550 (manufactured by JASCO Corporation). The hardened material was heated in air at 150° C. for 100 hours and allowed to cool to room temperature. Thereafter, the transmissibility of a light-beam having a wavelength of 400 nm through the sample in the thickness direction was measured again. The ratio of the transmissibility of a light-beam of the sample after the heat treatment to that of before the heat treatment was calculated as a transmitted-light beam retention rate. The transmitted-light beam retention rate of 90% or more is evaluated by "excellent", 85% or more and less than 90% by "good", and less than 85% by "bad".

(11) Crack Resistance and Adhesiveness

In a frame mold formed of a polyphthalamide resin (A model 4122 manufactured by Solvey Advanced Polymers K.K.) having a depression of 10 mm φ and a depth of 1 mm at the center of a flat plate of 20 mm×20 mm×20 mm, a silicon chip of 5 mm×5 mm×0.2 mm was placed. A resin composition was injected to the mold and hardened by heating to obtain a test piece. The test piece thus obtained was subjected to a cycle test. After the test piece was held a hot and cold cycler (TSE-11-A manufactured by Espec Corp.) at −40° C. for 15 minutes, the temperature was raised to 120° C. for 3 minutes in average. The test piece was held at 120° C. for 15 minutes and then the temperature was reduced to −40° C. for 3 minutes in average.

The occurrence of crack in the hardened resin was visually observed and evaluated. The case where no crack occurred until 40 cycles or more was evaluated by "excellent", where crack occurred until 20 cycles or more and less than 40 cycles was evaluated by "good", and where crack occurred in less than 5 cycles was evaluated by "bad".

Furthermore, adhesiveness was evaluated by the number of occurrence of separation between a hardened resin and a polyphthalamide resin mold frame. The case where no separation occurred until 40 cycles or more was evaluated by "excellent", where separation occurred from 20 cycles or more and less than 40 cycles was evaluated by "good", and where separation occurred in less than 5 cycles was evaluated by "bad".

Note that the case where cracks already occurred at the completion time of hardening and thus no evaluation was made was indicated by "too bad".

Example 1

Production of [Epoxy Silicone-1a]

A 3 L reactor with a reflux condenser, a thermometer and a stirrer was purged with dry nitrogen. Under dry nitrogen conditions, the reactor was charged with 80 g of 1,3,5,7-tetramethylcyclotetrasiloxane (a reagent manufactured by Shin-Etsu Chemical Co., Ltd.) dehydrated, distilled and purified under dry nitrogen; 37.2 g of 1,3-divinyltetramethyldisiloxane (a reagent manufactured by Shin-Etsu Chemical Co., Ltd.) dehydrated, distillated and purified under dry nitrogen; 122.6 g of 4-vinylcyclohexene oxide (a reagent manufactured by Aldrich) dehydrated, distillated and purified under dry nitrogen, and 925 g of 1,4-dioxane (a reagent manufactured by Wako Pure Chemical Industries Ltd.) dehydrated, distillated and purified under nitrogen. Thereafter, the mixture was heated in an oil bath increased to 70° C. while stirring under an atmospheric-pressure dry nitrogen atmosphere.

After the temperature of the interior solution exceeded 65° C., a 1,4-dioxane solution (3.7 g) of a platinum divinyltetramethyldisilicone complex containing 500 ppm of platinum in terms of platinum element was added to the solution under dry nitrogen. A hydrosilylation reaction was carried out for 8 hours. At this time, the temperature of the reaction solution was within the range from 65° C. to 100° C. After the 8-hour reaction, the hydrosilylation reaction was found to proceed quantitatively and an unreacted SiH unit was not detected. Subsequently, heating of the reaction solution was terminated and the reaction solution was allowed to cool to room temperature.

In the initiation time of the reaction, the ratio (r2/r1), which is the ratio of the total number of mole (r1) of the SiH unit of organohydrogensilicone to the number of mole (r2) of the carbon-carbon double bond of the silicone having a carbon-carbon double bond and used in combination, was 0.30; and the ratio (r4/r1), which is the ratio of the total number of mole (r1) of the SiH unit of organohydrogensilicone to the number of mole (r4) of the carbon-carbon double bond of a compound <A> having a carbon-carbon double bond and an epoxy group and used in combination, was 0.74. The total number of mole of the carbon-carbon double bond of the compound added based on the total number of mole of the SiH unit of organohydrogensilicone was 1.04 times.

The number of mole of a catalyst in terms of metal atom for use in initiating the hydrosilylation reaction based on the total number of mole of the SiH unit of organohydrogensilicone before the hydrosilylation reaction was 1/140,000 times.

After completion of cooling, 925 g of acetonitrile (a reagent manufactured by Wako Pure Chemical Industries Ltd.) dehydrated, distilled and purified under dry nitrogen was added to the reaction solution. After the reaction solution was stirred for 2 hours under an atmospheric-pressure dry nitrogen atmosphere, stirring was terminated. Subsequently, 800 g of activated carbon (granular particle; manufactured by Wako Pure Chemical Industries Ltd.), which was dried by heating at 150° C. for 3 hours under dry nitrogen airflow, was added. The reaction solution was treated with activated carbon for 48 hours under a dry nitrogen atmosphere. After completion of the treatment with activated carbon, the activated carbon was filtered off by a membrane filter formed of PTFE having a pore size of 1 μm and the filtrate was collected. Furthermore, the activated carbon separated by the aforementioned operation was washed with 1500 g of 1,4-dioxane (a reagent manufactured by Wako Pure Chemical Industries Ltd.) dehydrated, evaporated and purified under nitrogen. The activated carbon was filtered off by a membrane filter in the same manner as above. The washing solution was collected and combined with the filtrate previously obtained. The solution mixture thus collected was subjected to an evaporator to evaporate 1,4-dioxane and acetonitrile at a heating temperature of 40° C. under reduced pressure conditions to obtain epoxy silicone.

An aliquot of the epoxy silicone obtained was taken and placed in a cylindrical Pyrex (registered trademark) glass tube having an inner diameter of 70 mm and an effective length of 200 mm and set in a glass tube oven (GTO-350 manufactured by Shibata Scientific Technology Ltd.). Rotation of the cylindrical tube inside was initiated and the interior was purged with dry nitrogen in room temperature conditions. Thereafter, while introducing dry nitrogen at 50° C. at a pressure of 0.2 kPa to the interior at a flow rate of 10 mL/minute in terms of atmospheric pressure, a treatment was performed with heating for 24 hours under reduced pressure to obtain epoxy silicone reduced in the content of low boiling-point compounds. The remaining epoxy silicone obtained above, from which 1,4-dioxane and acetonitrile were evaporated, was repeatedly subjected to this operation to obtain 203 g of [epoxy silicone-1a] reduced in the content of low boiling-point compounds.

The obtained [epoxy silicone-1a] had a number average molecular weight of 900 and a structure represented by the following average composition formula (22):

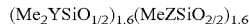

 (22)

wherein in the average composition formula (22), Y represents a divalent organic group represented by —CH$_2$—CH$_2$—, and Z represents a bond with the divalent hydrocarbon group Y. Furthermore, (Me[VCHO]SiO$_{2/2}$) represents a unit formed by adding vinylcyclohexene oxide to a hydrogen-methylsiloxy unit by the hydrosilylation reaction in the anti-Markownikoff addition manner.

Since an unreacted SiH unit was not detected, g=0 in the average composition formula (3) and a value of [g/(a+b+c+d+e+f+g+h+i+j)] was 0.

The compound represented by the general formula (1) and contained in [epoxy silicone-1a] was a compound (the total mass including the mass of sodium: 759) represented by the following chemical formula (23). On the other hand, the compound represented by the general formula (2) was a compound (the total mass including the mass of sodium: 697) represented by the following chemical formula (24). The value of [WB]/[WA] was 0.64. The content of a component having a molecular weight of 800 or less in the epoxy silicone was 47%. The epoxy value was 0.40. The transition metal component contained was platinum alone. The content of the component was 1 ppm or less in terms of platinum element.

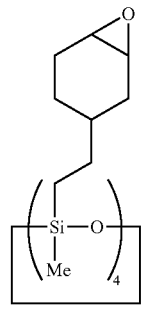 (23)

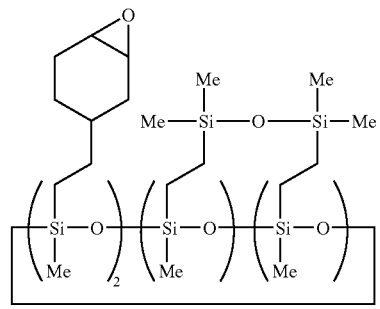 (24)

As the volatile compounds remaining in [epoxy silicone-1a], only 1,4-dioxane was detected. The total amount of remaining volatile compounds was 0.005% by mass or less. Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.004% by mass and 0.003% by mass, respectively. Other compounds were not detected.

<Production of [Curable Mix Composition-1a] and Evaluation of Physical Property>

The obtained [epoxy silicone-1a] (100 parts by mass), methyl hexahydrophthalicanhydride (67.2 parts by mass), 1,2-propanediol (3 parts by mass) and diazabicycloundecene octoate (0.3 parts by mass) were mixed under nitrogen. After stirring was performed until the whole solution was homogenized, the mixture was defoamed to obtain [curable mix composition-1a]. [Curable mix composition-1a] was poured into a mold having a depth of 3 mm under nitrogen and a hardening reaction was performed at 120° C. for one hour, further at 150° C. for two hours, and further continuously at 170° C. for one hour to obtain a hardened material. The performance of the obtained hardened material is shown in Table 1.

Example 2

Production of [Epoxy Silicone-2a]

A 3 L reactor with a reflux condenser, a thermometer and a stirrer was purged with dry nitrogen. Under dry nitrogen conditions, the reactor was charged with 80 g of 1,3,5,7-tetramethylcyclotetrasiloxane (a reagent manufactured by Shin-Etsu Chemical Co., Ltd.) dehydrated, distilled and purified under dry nitrogen; 37.2 g of 1,3-divinyltetramethyldisiloxane (a reagent manufactured by Shin-Etsu Chemical Co., Ltd.) dehydrated, distilled and purified under dry nitrogen; 122.6 g of 4-vinylcyclohexene oxide (a reagent manufactured by Aldrich) dehydrated, distilled and purified under dry nitrogen and 925 g of ethylene glycol dimethyl ether (a reagent manufactured by Aldrich). Thereafter, the mixture was heated in an oil bath increased to 83° C. while stirring under an atmospheric-pressure dry nitrogen atmosphere.

An ethylene glycol dimethyl ether solution (5.6 g) of a platinum divinyltetramethyldisilicone complex containing 500 ppm of platinum in terms of platinum element was added to the solution under dry nitrogen. A hydrosilylation reaction was carried out for 6 hours. At this time, the temperature of the reaction solution was within the range from 83° C. to 85° C. After the 6-hour reaction, a conversion rate of SiH unit was confirmed to be 99% by $^1$H-NMR analysis. Subsequently, heating of the reaction solution was terminated and the reaction solution was allowed to cool to room temperature.

In the initiation time of the reaction, the ratio (r2/r1), which is the ratio of the total number of mole (r1) of the SiH unit of organohydrogensilicone to the number of mole (r2) of the carbon-carbon double bond of the silicone having a carbon-carbon double bond and used in combination, was 0.30; and the ratio (r4/r1), which is the ratio of the total number of mole (r1) of the SiH unit of organohydrogensilicone to the number of mole (r4) of the carbon-carbon double bond of a compound <A> having a carbon-carbon double bond and an epoxy group and used in combination, was 0.74. The total number of mole of the carbon-carbon double bond of the compound added to the total number of mole of the SiH unit of organohydrogensilicone was 1.04 times.

The number of mole of a catalyst used at the time of initiating the hydrosilylation reaction in terms of metal atom based on the total number of mole of the SiH unit of organohydrogensilicone before the hydrosilylation reaction was 1/93,000 times.

After completion of cooling, 800 g of activated carbon (granular particle manufactured by Wako Pure Chemical Industries Ltd.), which was dried by heating at 150° C. for 3 hours under dry nitrogen airflow, was added. The reaction solution was treated with activated carbon for 48 hours under a dry nitrogen atmosphere. After completion of the treatment with activated carbon, the activated carbon was filtered off by a membrane filter formed of PTFE having a pore size of 1 μm and the filtrate was collected. The filtrate was subjected to an evaporator to evaporate ethylene glycol dimethyl ether at a heating temperature of 40° C. under reduced pressure conditions to obtain epoxy silicone.

An aliquot of the epoxy silicone obtained was taken and placed in a cylindrical Pyrex (registered trademark) glass tube having an inner diameter of 70 mm and an effective length of 200 mm and set in a glass tube oven (GTO-350 manufactured by Shibata Scientific Technology Ltd.). Rotation of the cylindrical tube inside was initiated and the interior was purged with dry nitrogen in room temperature conditions. Thereafter, while introducing dry nitrogen at a temperature of 50° C. at a pressure of 0.2 kPa to the interior at a flow rate of 10 mL/minute in terms of atmospheric pressure, a treatment was performed with heating for 24 hours under reduced pressure to obtain epoxy silicone reduced in the content of low boiling-point compounds. The remaining epoxy silicone obtained above was repeatedly subjected to this operation to obtain 185 g of [epoxy silicone-2a] reduced in the content of low boiling-point compounds.

The obtained [epoxy silicone-2a] had a number average molecular weight of 900 and a structure represented by the following average composition formula (25):

$$(Me_2YSiO_{1/2})_{1.6}(MeZSiO_{2/2})_{1.6}$$

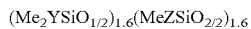

$$(MeHSiO_{2/2})_{0.05}(Me[VCHO]SiO_{2/2})_{3.7} \quad (25)$$

wherein in the average composition formula (25), Y represents a divalent organic group represented by —CH$_2$—CH$_2$— and Z represents a bond with the divalent hydrocarbon group Y. Furthermore, (Me[VCHO]SiO$_{2/2}$) represents a unit formed by adding vinylcyclohexene oxide to a hydrogenmethylsiloxy unit by the hydrosilylation reaction in the anti-Markownikoff addition manner.

From the formula, a value of [g/(a+b+c+d+e+f+g+h+i+j)] in the average composition formula (3) was calculated. As a result, g=[0.05/(1.6+1.6+0.05+3.7)]=0.007.

The compound represented by the general formula (1) and contained in [epoxy silicone-2a] was a compound (the total mass including the mass of sodium: 759) represented by the above chemical formula (23). On the other hand, the compound represented by the general formula (2) was a compound (the total mass including the mass of sodium: 697) represented by the above chemical formula (24). The value of [WB]/[WA] was 0.53. The content of a component having a molecular weight of 800 or less in the epoxy silicone was 45%. The epoxy value was 0.40. The transition metal component contained was platinum alone. The content of the component was 1 ppm or less in terms of platinum element.

The remaining ethylene glycol dimethyl ether in [epoxy silicone-2a] was not detected. Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.003% by mass and 0.003% by mass, respectively. Other compounds were not detected.

<Production of [Curable Mix Composition-2a] and Evaluation of Physical Property>

The obtained [epoxy silicone-2a] (100 parts by mass), methyl hexahydrophthalicanhydride (67.2 parts by mass), 1,2-propanediol (3 parts by mass) and diazabicycloundecene octoate (0.3 parts by mass) were mixed under nitrogen. After stirring was performed until the whole solution was homogenized, the mixture was defoamed to obtain [curable mix composition-2a]. [Curable mix composition-2a] was poured into a mold having a depth of 3 mm under nitrogen and a hardening reaction was performed at 120° C. for one hour, further at 150° C. for two hours, and further continuously at 170° C. for one hour to obtain a hardened material. The performance of the obtained hardened material is shown in Table 1.

Example 3

Production of [Epoxy Silicone-3a]

[Epoxy silicone-3a] (195 g) reduced in low boiling-point compounds was obtained in the same manner as in Example 1 except that, in the hydrosilylation reaction, 1,3-divinyltetramethyldisiloxane (55.8 g) was used; 4-vinylcyclohexene oxide (97.6 g) was used; 1,4-dioxane (900 g) was used; the 1,4-dioxane solution (3.6 g) of a platinum divinyltetramethyldisilicone complex containing 500 ppm of platinum in terms of platinum element was used; and after the hydrosilylation reaction, the solution was cooled, and thereafter, acetonitrile (900 g) was added.

Immediately before termination of the hydrosilylation reaction, a sample was taken. As a result, the hydrosilylation reaction was found to proceed quantitatively and an unreacted SiH unit was not detected.

At the initiation of the reaction, the ratio (r2/r1), which is the ratio of the total number of mole (r1) of the SiH unit of organohydrogensilicone to the number of mole (r2) of the carbon-carbon double bond of the silicone having a carbon-carbon double bond and used in combination, was 0.45; and the ratio (r4/r1), which is the ratio of the total number of mole (r1) of the SiH unit of organohydrogensilicone to the number of mole (r4) of the carbon-carbon double bond of a compound <A> having a carbon-carbon double bond and an epoxy group and used in combination, was 0.59. The total number of mole of the carbon-carbon double bond of the compound added based on the total number of mole of the SiH unit of organohydrogensilicone was 1.04 times.

The number of mole of a catalyst used at the time of initiating the hydrosilylation reaction in terms of metal atom based on the total number of mole of the SiH unit of organohydrogensilicone before the hydrosilylation reaction was 1/144,000 times.

The obtained [epoxy silicone-3a] had a number average molecular weight of 1,000 and a structure represented by the following average composition formula (26):

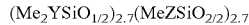

 (26)

wherein in the average composition formula (26), Y represents a divalent organic group represented by —$CH_2$—$CH_2$— and Z represents a bond with the divalent hydrocarbon group Y. Furthermore, (Me[VCHO]$SiO_{2/2}$) represents a unit formed by adding vinylcyclohexene oxide to a hydrogenmethylsiloxy unit by the hydrosilylation reaction in the anti-Markownikoff addition manner.

Since an unreacted SiH unit was not detected, g=0 in the average composition formula (3) and a value of [g/(a+b+c+d+e+f+g+h+i+j)] was 0.

The compound represented by the general formula (1) and contained in [epoxy silicone-3a] was a compound represented by the above chemical formula (23). On the other hand, the compound represented by the general formula (2) was a compound represented by the above chemical formula (24). The value of [WB]/[WA] was 0.95. The content of a component having a molecular weight of 800 or less in the epoxy silicone was 43%. The epoxy value was 0.32. The transition metal component contained was platinum alone. The content of the component was 1 ppm or less in terms of platinum element.

As the volatile compounds remaining in [epoxy silicone-3a], only 1,4-dioxane was detected. The total amount of remaining volatile compounds was 0.005% by mass or less. Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.003% by mass and 0.002% by mass, respectively. Other compounds were not detected.

<Production of [Curable Mix Composition-3a] and Evaluation of Physical Property>

The obtained [epoxy silicone-3a] (100 parts by mass), methyl hexahydrophthalicanhydride (53.8 parts by mass), 1,2-propanediol (3 parts by mass) and diazabicycloundecene octoate (0.3 parts by mass) were mixed under nitrogen. After stirring was performed until the whole solution was homogenized, the mixture was defoamed to obtain [curable mix composition-3a]. [Curable mix composition-3a] was poured into mold having a depth of 3 mm under nitrogen and a hardening reaction was performed at 120° C. for one hour, further at 150° C. for two hours, and further continuously at 170° C. for one hour to obtain a hardened material. The performance of the obtained hardened material is shown in Table 1.

Example 4

Production of [Epoxy Silicone-4-a]

[Epoxy silicone-4-a] (183 g) reduced in low boiling-point compound was obtained in the same manner as in Example 1 except that, in the hydrosilylation reaction, 1,3-divinyltetramethyldisiloxane (89.9 g) was used; 4-vinylcyclohexene oxide (51.8 g) was used; 1,4-dioxane (855 g) was used; the 1,4-dioxane solution (3.5 g) of a platinum divinyltetramethyldisilicone complex containing 500 ppm of platinum in terms of platinum element was used; and after the hydrosilylation reaction, the solution was cooled, and thereafter, acetonitrile (855 g) was added.

Immediately before termination of the hydrosilylation reaction, a sample was taken. As a result, the hydrosilylation reaction was found to proceed quantitatively and an unreacted SiH unit was not detected.

At the initiation of the reaction, the ratio (r2/r1), which is the ratio of the total number of mole (r1) of the SiH unit of organohydrogensilicone to the number of mole (r2) of the carbon-carbon double bond of the silicone having a carbon-carbon double bond and used in combination, was 0.73; and the ratio (r4/r1), which is the ratio of the total number of mole (r1) of the SiH unit of organohydrogensilicone to the number of mole (r4) of the carbon-carbon double bond of a compound <A> having a carbon-carbon double bond and an epoxy group and used in combination, was 0.31. The total number of mole of the carbon-carbon double bond of the compound added based on the total number of mole of the SiH unit of organohydrogensilicone was 1.04 times.

The number of mole of a catalyst used at the time of initiating the hydrosilylation reaction in terms of metal atom based on the total number of mole of the SiH unit of organohydrogensilicone before the hydrosilylation reaction was 1/148,000 times.

The obtained [epoxy silicone-4-a] had a number average molecular weight of 1,100 and a structure represented by the following average composition formula (27):

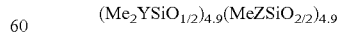

 (27)

wherein in the average composition formula (27), Y represents a divalent organic group represented by —$CH_2$—$CH_2$— and Z represents a bond with the divalent hydrocarbon group Y. Furthermore, (Me[VCHO]$SiO_{2/2}$) represents a unit formed by adding vinylcyclohexene oxide to a hydrogenmethylsiloxy unit by the hydrosilylation reaction in the anti-Markownikoff addition manner.

Since an unreacted SiH unit was not detected, g=0 in the average composition formula (3) and a value of [g/(a+b+c+d+e+f+g+h+i+j)] was 0.

The compound represented by the general formula (1) and contained in [epoxy silicone-4-a] was a compound represented by the above chemical formula (23). On the other hand, the compound represented by the general formula (2) was a compound represented by the above chemical formula (24). The value of [WB]/[WA] was 2.83. The content of a component having a molecular weight of 800 or less in the epoxy silicone was 24%. The epoxy value was 0.17. The transition metal component contained was platinum alone. The content of the component was 1 ppm or less in terms of platinum element.

As the volatile compounds remaining in [epoxy silicone-4-a], only 1,4-dioxane was detected. The total amount of remaining volatile compounds was 0.005% by mass or less. Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.003% by mass and 0.002% by mass, respectively. Other compounds were not detected.

<Production of [Curable Mix Composition-4-a] and Evaluation of Physical Property>

The obtained [epoxy silicone-4-a] (100 parts by mass), methyl hexahydrophthalicanhydride (28.6 parts by mass), 1,2-propanediol (3 parts by mass) and diazabicycloundecene octoate (0.3 parts by mass) were mixed under nitrogen. After stirring was performed until the whole solution was homogenized, the mixture was defoamed to obtain [curable mix composition-4-a]. [Curable mix composition-4-a] was poured into a mold having a depth of 3 mm under nitrogen and a hardening reaction was performed at 100° C. for one hour, further at 110° C. for two hours, and further continuously at 120° C. for one hour to obtain a hardened material. The performance of the obtained hardened material is shown in Table 1.

Example 5

Production of [Epoxy Silicone-5a]

A 3 L reactor with a reflux condenser, a thermometer and a stirrer was purged with dry nitrogen. Under dry nitrogen conditions, the reactor was charged with 80 g of 1,3,5,7-tetramethylcyclotetrasiloxane dehydrated, distilled and purified under dry nitrogen; 99.2 g of 4-vinylcyclohexene oxide (a reagent manufactured by Aldrich) dehydrated, distilled and purified under dry nitrogen and 884 g of 1,4-dioxane (a reagent manufactured by Wako Pure Chemical Industries Ltd.) dehydrated, distilled and purified under nitrogen. Thereafter, the mixture was heated in an oil bath increased to 70° C. while stirring under an atmospheric-pressure dry nitrogen atmosphere.

After the temperature of the interior solution exceeded 65° C., a 1,4-dioxane solution (3.6 g) of a platinum divinyltetramethyldisilicone complex containing 500 ppm of platinum in terms of platinum element was added to the solution under dry nitrogen. A hydrosilylation reaction was carried out for 2.5 hours. At this time, the temperature of the reaction solution was within the range from 65° C. to 100° C. After the 2.5-hour reaction, 4-vinylcyclohexene oxide was not detected in the reaction solution. Thereafter, continuously, 59.5 g of 1,3-divinyltetramethyldisiloxane (a reagent manufactured by Shin-Etsu Chemical Co., Ltd.) dehydrated, distilled and purified under dry nitrogen was added to the reaction solution. The mixture was heated in an oil bath increased to 70° C. while stirring under an atmospheric-pressure dry nitrogen atmosphere to carry out a hydrosilylation reaction for 7 hours. The heating of the reaction solution was terminated and the reaction solution was allowed to cool to room temperature. The solution was analyzed before heating was terminated. As a result, the hydrosilylation reaction was found to proceed quantitatively and an unreacted SiH unit was not detected.

In this example, a vinyl compound <B> except the compound <A> having a carbon-carbon double bond and an epoxy group was not used. In the initiation time of the reaction, the ratio (s2/s1), which is the ratio of the total number of mole (s1) of the SiH unit of organohydrogensilicone to the number of mole (s2) of the carbon-carbon double bond of the compound <A> having a carbon-carbon double bond and an epoxy group, was 0.60; and the ratio (s4/s1), which is the ratio of the total number of mole (s1) of the SiH unit of organohydrogensilicone to the number of mole (s4) of the carbon-carbon double bond of the silicone having a carbon-carbon double bond and added after addition of the compound <A> having a carbon-carbon double bond was completed, was 0.48. The value of [s4/(s1−s2)] was 1.20.

The number of mole of a catalyst used at the time of initiating the hydrosilylation reaction in terms of metal atom based on the total number of mole of the SiH unit of organohydrogensilicone before the hydrosilylation reaction was 1/144,000 times.

After completion of cooling, the same treatment was performed in the same manner as in Example 1 except that 884 g of acetonitrile dehydrated, distillated and purified under dry nitrogen was used in the reaction solution to obtain 195 g of [epoxy silicone-5a] reduced in the content of low boiling-point compounds.

The obtained [epoxy silicone-5a] had a number average molecular weight of 900 and a structure represented by the following average composition formula (28):

$$(Me_2YSiO_{1/2})_{2.2}(MeZSiO_{2/2})_{2.2}$$

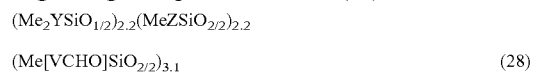

wherein in the average composition formula (28), Y represents a divalent organic group represented by —CH$_2$—CH$_2$— and Z represents a bond with the divalent hydrocarbon group Y. Furthermore, (Me[VCHO]SiO$_{2/2}$) represents a unit formed by adding vinylcyclohexene oxide to a hydrogenmethylsiloxy unit by the hydrosilylation reaction in the anti-Markownikoff addition manner.

Since an unreacted SiH unit was not detected, g=0 in the average composition formula (3) and a value of [g/(a+b+c+d+e+f+g+h+i+j)] was 0.

The compound represented by the general formula (1) and contained in [epoxy silicone-5a] was a compound represented by the above chemical formula (23). On the other hand, the compound represented by the general formula (2) was a compound represented by the above chemical formula (24). The value of [WB]/[WA] was 0.87. The content of a component having a molecular weight of 800 or less in the epoxy silicone was 45%. The epoxy value was 0.34. The transition metal component contained was platinum alone. The content of the component was 1 ppm or less in terms of platinum element.

As the volatile compounds remaining in [epoxy silicone-5a], only 1,4-dioxane was detected. The total amount of remaining volatile compounds was 0.005% by mass or less.

Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.004% by mass and 0.003% by mass, respectively. Other compounds were not detected.

<Production of [Curable Mix Composition-5a] and Evaluation of Physical Property>

The obtained [epoxy silicone-5a] (90 parts by mass), 3,4-epoxycyclohexylmethyl-3',4'-epoxycyclohexanedicarboxylate (10 parts by mass), methylhexahydrophthalicanhydride (51.4 parts by mass), 1,3-propanediol (3 parts by mass) and diazabicycloundecene octoate (0.3 parts by mass) were mixed under nitrogen. After stirring was performed until the whole solution was homogenized, the mixture was defoamed to obtain [curable mix composition-5a]. [Curable mix composition-5a] was poured into a mold having a depth of 3 mm under nitrogen and a hardening reaction was performed at 120° C. for one hour, further at 140° C. for two hours, and further continuously at 160° C. for one hour to obtain a hardened material. The performance of the obtained hardened material is shown in Table 1.

Example 6

Production of [Curable Mix Composition-6a] and Evaluation of Physical Property

The [epoxy silicone-1a] (100 parts by mass) obtained in Example 1, a thermosetting cationic polymerization catalyst (Adeka Optomer CP-66, manufactured by ADEKA Corporation)(0.1 part by mass) were mixed. After stirring was performed until the whole solution was homogenized, the mixture was defoamed to obtain [curable mix composition-6a]. [Curable mix composition-6a] was poured into a mold having a depth of 3 mm under nitrogen and a hardening reaction was performed at 120° C. for one hour, further at 150° C. for two hours, and further continuously at 170° C. for one hour to obtain a hardened material. The performance of the obtained hardened material is shown in Table 1.

Example 7

Production of [Epoxy Silicone-7a]

A 3 L reactor with a reflux condenser, a thermometer and a stirrer was purged with dry nitrogen. Under dry nitrogen conditions, the reactor was charged with 70 g of 1,3,5,7-tetramethylcyclotetrasiloxane (SiH unit: 1.164 mol, a reagent manufactured by Shin-Etsu Chemical Co., Ltd.) dehydrated, distilled and purified under dry nitrogen; vinyldimethylsiloxy-terminated polydimethylsiloxane (64.5 g, vinyl group: 0.204 mol), which is represented by the following average composition formula (29) and was treated under reduced pressure in a dry nitrogen atmosphere at 0.2 kPa or less for 2 hours while stirring; 126.7 g (1.020 mol) of 4-vinylcyclohexene oxide (a reagent manufactured by Aldrich) dehydrated, distilled and purified under dry nitrogen; and 1000 g of 1,4-dioxane (a reagent manufactured by Wako Pure Chemical Industries Ltd.) dehydrated, distilled and purified under nitrogen. Thereafter, the mixture was heated in an oil bath increased to 70° C. while stirring under an atmospheric-pressure dry nitrogen atmosphere.

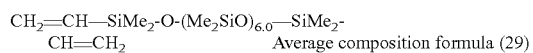

Average composition formula (29)

After the temperature of the interior solution exceeded 65° C., a 1,4-dioxane solution (3.3 g) of a platinum divinyltetramethyldisilicone complex containing 500 ppm of platinum in terms of platinum element was added to the solution under dry nitrogen. A hydrosilylation reaction was carried out for 8 hours. At this time, the temperature of the reaction solution was within the range from 65° C. to 100° C. After the 8-hour reaction, the hydrosilylation reaction was found to proceed quantitatively and an unreacted SiH unit was not detected. Subsequently, heating of the reaction solution was terminated and the reaction solution was allowed to cool to room temperature.

In the initiation time of the reaction, the ratio (r2/r1), which is the ratio of the total number of mole (r1) of the SiH unit of organohydrogensilicone to the number of mole (r2) of the carbon-carbon double bond of the silicone having a carbon-carbon double bond and used in combination, was 0.18; and the ratio (r4/r1), which is the ratio of the total number of mole (r1) of the SiH unit of organohydrogensilicone to the number of mole (r4) of the carbon-carbon double bond of a compound <A> having a carbon-carbon double bond and an epoxy group and used in combination, was 0.88. The total number of mole of the carbon-carbon double bond of the compound added based on the total number of mole of the SiH unit of organohydrogensilicone was 1.05 times.

The number of mole of a catalyst used at the time of initiating the hydrosilylation reaction in terms of metal atom based on the total number of mole of the SiH unit of organohydrogensilicone before the hydrosilylation reaction was 1/138,000 times.

After completion of cooling, 1000 g of acetonitrile (a reagent manufactured by Wako Pure Chemical Industries Ltd.) dehydrated, distilled and purified under dry nitrogen was added to the reaction solution. After the reaction solution was stirred for 2 hours under an atmospheric-pressure dry nitrogen atmosphere, stirring was terminated. Subsequently, 800 g of activated carbon (granular particle manufactured by Wako Pure Chemical Industries Ltd.), which was dried by heating at 150° C. for 3 hours under dry nitrogen airflow, was added. The reaction solution was treated with activated carbon for 48 hours under a dry nitrogen atmosphere. After completion of the treatment with activated carbon, the activated carbon was filtered off by a membrane filter formed of PTFE having a pore size of 1 μm and the filtrate was collected. Furthermore, the activated carbon separated by the aforementioned operation was washed with 1500 g of 1,4-dioxane (a reagent manufactured by Wako Pure Chemical Industries Ltd.) dehydrated, distilled and purified under nitrogen. The activated carbon was filtered off by a membrane filter in the same manner as above. The washing solution was collected and combined with the filtrate previously obtained. The solution mixture thus collected was subjected to an evaporator to evaporate 1,4-dioxane and acetonitrile at a heating temperature of 40° C. under reduced pressure conditions to obtain epoxy silicone.

An aliquot of the epoxy silicone obtained was taken and placed in a cylindrical Pyrex glass tube having an inner diameter of 70 mm and an effective length of 200 mm and set in a glass tube oven (GTO-350 manufactured by Shibata Scientific Technology Ltd.). Rotation of the cylindrical tube inside was initiated and the interior was purged with dry nitrogen in room temperature conditions. Thereafter, while introducing dry nitrogen at a temperature of 50° C. at a pressure of 0.2 kPa to the interior at a flow rate of 10 mL/minute in terms of atmospheric pressure, a treatment was performed with heating for 24 hours under reduced pressure to obtain epoxy silicone reduced in the content of low boiling-point compounds. The remaining epoxy silicone obtained above, from which 1,4-dioxane and acetonitrile were evaporated, was repeatedly subjected to this operation to obtain 220 g of [epoxy silicone-7a] reduced in the content of low boiling-point compounds.

The obtained [epoxy silicone-7a] had a number average molecular weight of 1,000 and a structure represented by the following average composition formula (30):

$$(Me_2YSiO_{1/2})_{0.81}(MeZSiO_{2/2})_{0.81}(Me_2SiO_{2/2})_{2.42}$$

$$(Me[VCHO]SiO_{2/2})_{3.81} \quad (30)$$

wherein in the average composition formula (30), Y represents a divalent organic group represented by —CH$_2$—CH$_2$— and Z represents a bond with the divalent hydrocarbon group Y. Furthermore, (Me[VCHO]SiO$_{2/2}$) represents a unit formed by adding vinylcyclohexene oxide to a hydrogenmethylsiloxy unit by the hydrosilylation reaction in the anti-Markownikoff addition manner.

Since an unreacted SiH unit was not detected, g=0 in the average composition formula (3) and a value of [g/(a+b+c+d+e+f+g+h+i+j)] was 0.

The compound represented by the general formula (1) and contained in [epoxy silicone-7a] was a compound (the total mass including the mass of sodium: 759) represented by the following chemical formula (23). On the other hand, the compound represented by the general formula (2) includes compounds represented by the following chemical formula (31) where W is an integer of 1 to 9 (the total masses including the mass of sodium were 771, 845, 919, 993, 1,067, 1,141, 1,215, 1,289 and 1,363, respectively). The value of [WB]/[WA] was 0.50. The content of a component having a molecular weight of 800 or less in the epoxy silicone was 41%. The epoxy value was 0.38. The transition metal component contained was platinum alone. The content of the component was 1 ppm or less in terms of platinum element.

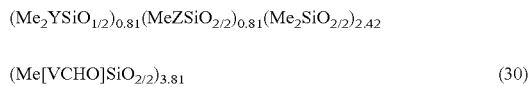

(23)

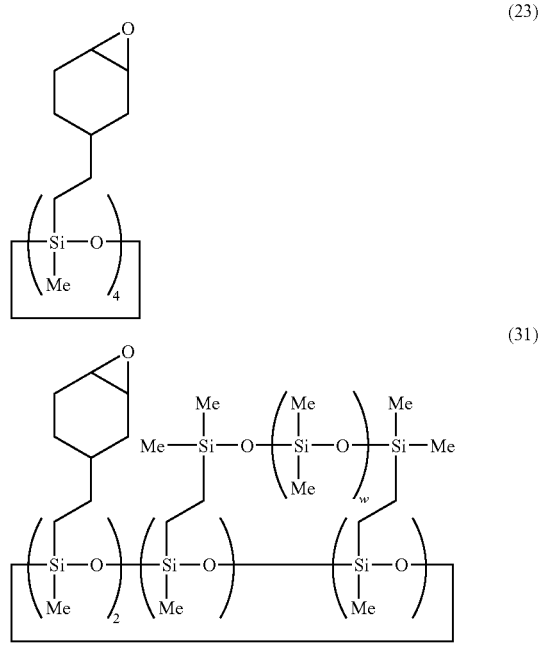

(31)

As the volatile compounds remaining in [epoxy silicone-7a], only 1,4-dioxane was detected. The total amount of remaining volatile compounds was 0.005% by mass or less.

Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.002% by mass and 0.002% by mass, respectively. Other compounds were not detected.

<Production of [Curable Mix Composition-7a] and Evaluation of Physical Property>

The obtained [epoxy silicone-7a] (100 parts by mass), methyl hexahydrophthalicanhydride (63.8 parts by mass), 1,2-propanediol (3 parts by mass) and diazabicycloundecene octoate (0.3 parts by mass) were mixed under nitrogen. After stirring was performed until the whole solution was homogenized, the mixture was defoamed to obtain [curable mix composition-7a]. [Curable mix composition-7a] was poured into a mold having a depth of 3 mm under nitrogen and a hardening reaction was performed at 120° C. for one hour, further at 150° C. for two hours, and further continuously at 170° C. for one hour to obtain a hardened material. The performance of the obtained hardened material is shown in Table 1.

Example 8

Production of [Epoxy Silicone-8a]

[Epoxy silicone-8a] (200 g) reduced in low boiling-point compounds was obtained in the same manner as in Example 7 except that, in the hydrosilylation reaction time, 60 g of 1,3,5,7-tetramethylcyclotetrasiloxane (SiH unit: 0.998 mol) was used; vinyldimethylsiloxy-terminated polydimethylsiloxane (79.0 g, vinyl group: 0.250 mol) represented by the average composition formula (29) was used; 4-vinylcyclohexene oxide (99.2 g, 0.799 mol) was used; 1,4-dioxane (835 g) was used; the 1,4-dioxane solution (3.2 g) of a platinum divinyltetramethyldisilicone complex containing 500 ppm of platinum in terms of platinum element was used; and after the hydrosilylation reaction, the solution was cooled, and thereafter, acetonitrile (835 g) was added.

Immediately before termination of the hydrosilylation reaction, a sample was taken. As a result, the hydrosilylation reaction was found to proceed quantitatively and an unreacted SiH unit was not detected.

In the initiation time of the reaction, the ratio (r2/r1), which is the ratio of the total number of mole (r1) of the SiH unit of organohydrogensilicone to the number of mole (r2) of the carbon-carbon double bond of the silicone having a carbon-carbon double bond and used in combination, was 0.25; and the ratio (r4/r1), which is the ratio of the total number of mole (r1) of the SiH unit of organohydrogensilicone to the number of mole (r4) of the carbon-carbon double bond of a compound <A> having a carbon-carbon double bond and an epoxy group and used in combination, was 0.80. The total number of mole of the carbon-carbon double bond of the compound added based on the total number of mole of the SiH unit of organohydrogensilicone was 1.05 times.

The number of mole of a catalyst used at the time of initiating the hydrosilylation reaction in terms of metal atom based on the total number of mole of the SiH unit of organohydrogensilicone before the hydrosilylation reaction was 1/122,000 times.

The obtained [epoxy silicone-8a] had a number average molecular weight of 1,100 and a structure represented by the following average composition formula (32):

$$(Me_2YSiO_{1/2})_{1.19}(MeZSiO_{2/2})_{1.19}(Me_2SiO_{2/2})_{3.57}$$

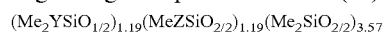

(32)

wherein in the average composition formula (32), Y represents a divalent organic group represented by —CH$_2$—CH$_2$— and Z represents a bond with the divalent hydrocarbon group Y. Furthermore, (Me[VCHO]SiO$_{2/2}$) represents a unit formed by adding vinylcyclohexene oxide to a hydrogenmethylsiloxy unit by the hydrosilylation reaction in the anti-Markownikoff addition manner.

Since an unreacted SiH unit was not detected, g=0 in the average composition formula (3) and a value of [g/(a+b+c+d+e+f+g+h+i+j)] was 0.

The compound represented by the general formula (1) and contained in [epoxy silicone-8a] was a compound (the total mass including the mass of sodium: 759) represented by the chemical formula (23). On the other hand, the compound represented by the general formula (2) was a compound represented by the chemical formula (31) where W is an integer of 1 to 9 (the total masses including the mass of sodium were 771, 845, 919, 993, 1,067, 1,141, 1,215, 1,289 and 1,363, respectively). The value of [WB]/[WA] was 0.53. The content of a component having a molecular weight of 800 or less in the epoxy silicone was 36%. The epoxy value was 0.32. The transition metal component contained was platinum alone. The content of the component was 1 ppm or less in terms of platinum element.

As the volatile compounds remaining in [epoxy silicone-8a], only 1,4-dioxane was detected. The total amount of remaining volatile compounds was 0.005% by mass or less. Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.003% by mass and 0.003% by mass, respectively. Other compounds were not detected.

<Production of [Curable Mix Composition-8a] and Evaluation of Physical Property>

The obtained [epoxy silicone-8a] (100 parts by mass), methyl hexahydrophthalicanhydride (53.8 parts by mass), 1,2-propanediol (3 parts by mass) and diazabicycloundecene octoate (0.3 parts by mass) were mixed under nitrogen. After stirring was performed until the whole solution was homogenized, the mixture was defoamed to obtain [curable mix composition-8a]. [Curable mix composition-8a] was poured into a mold having a depth of 3 mm under nitrogen and a hardening reaction was performed at 120° C. for one hour, further at 150° C. for two hours, and further continuously at 170° C. for one hour to obtain a hardened material. The performance of the obtained hardened material is shown in Table 1.

Example 9

Production of [Epoxy Silicone-9a]

[Epoxy silicone-9a] (205 g) reduced in low boiling-point compounds was obtained in the same manner as in Example 7 except that, in the hydrosilylation reaction time, 50 g of 1,3,5,7-tetramethylcyclotetrasiloxane (SiH unit: 0.832 mol) was used; vinyldimethylsiloxy-terminated polydimethylsiloxane (144.7 g, vinyl group: 0.457 mol) represented by the average composition formula (29) was used; 4-vinylcyclohexene oxide (52.8 g, 0.425 mol) was used; 1,4-dioxane (850 g) was used; the 1,4-dioxane solution (2.7 g) of a platinum divinyltetramethyldisilicone complex containing 500 ppm of platinum in terms of platinum element was used; and after the hydrosilylation reaction, the solution was cooled, and thereafter, acetonitrile (850 g) was added.

Immediately before termination of the hydrosilylation reaction, a sample was taken. As a result, the hydrosilylation reaction was found to proceed quantitatively and an unreacted SiH unit was not detected.

At the initiation of the reaction, the ratio (r2/r1), which is the ratio of the total number of mole (r1) of the SiH unit of organohydrogensilicone to the number of mole (r2) of the carbon-carbon double bond of the silicone having a carbon-carbon double bond and used in combination, was 0.55; and the ratio (r4/r1), which is the ratio of the total number of mole (r1) of the SiH unit of organohydrogensilicone to the number of mole (r4) of the carbon-carbon double bond of a compound <A> having a carbon-carbon double bond and an epoxy group and used in combination, was 0.51. The total number of mole of the carbon-carbon double bond of the compound added based on the total number of mole of the SiH unit of organohydrogensilicone was 1.05 times.

The number of mole of a catalyst used at the time of initiating the hydrosilylation reaction in terms of metal atom based on the total number of mole of the SiH unit of organohydrogensilicone before the hydrosilylation reaction was 1/120,000 times.

The obtained [epoxy silicone-9a] had a number average molecular weight of 1,300 and a structure represented by the following average composition formula (33):

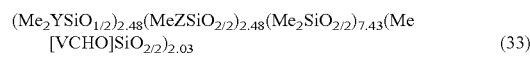

$$(Me_2YSiO_{1/2})_{2.48}(MeZSiO_{2/2})_{2.48}(Me_2SiO_{2/2})_{7.43}(Me[VCHO]SiO_{2/2})_{2.03} \quad (33)$$

wherein in the average composition formula (33), Y represents a divalent organic group represented by —CH$_2$—CH$_2$— and Z represents a bond with the divalent hydrocarbon group Y. Furthermore, (Me[VCHO]SiO$_{2/2}$) represents a unit formed by adding vinylcyclohexene oxide to a hydrogenmethylsiloxy unit by the hydrosilylation reaction in the anti-Markownikoff addition manner.

Since an unreacted SiH unit was not detected, g=0 in the average composition formula (3) and a value of [g/(a+b+c+d+e+f+g+h+i+j)] was 0.

The compound represented by the general formula (1) and contained in [epoxy silicone-9a] was a compound (the total mass including the mass of sodium: 759) represented by the chemical formula (23). On the other hand, the compound represented by the general formula (2) was a compound represented by the chemical formula (31) where W is an integer of 1 to 9 (the total masses including the mass of sodium were 771, 845, 919, 993, 1,067, 1,141, 1,215, 1,289 and 1,363, respectively). The value of [WB]/[WA] was 1.35. The content of a component having a molecular weight of 800 or less in the epoxy silicone was 13%. The epoxy value was 0.16. The transition metal component contained was platinum alone. The content of the component was 1 ppm or less in terms of platinum element.

As the volatile compounds remaining in [epoxy silicone-9a], only 1,4-dioxane was detected. The total amount of remaining volatile compounds was 0.005% by mass or less. Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.004% by mass and 0.004% by mass, respectively. Other compounds were not detected.

<Production of [Curable Mix Composition-9a] and Evaluation of Physical Property>

The obtained [epoxy silicone-9a] (100 parts by mass), methyl hexahydrophthalicanhydride (26.9 parts by mass), 1,2-propanediol (3 parts by mass) and diazabicycloundecene octoate (0.3 parts by mass) were mixed under nitrogen. After stirring was performed until the whole solution was homogenized, the mixture was defoamed to obtain [curable mix composition-9a]. [Curable mix composition-9a] was poured into a mold having a depth of 3 mm under nitrogen and a hardening reaction was performed at 100° C. for one hour, further at 110° C. for two hours, and further continuously at 120° C. for one hour to obtain a hardened material. The performance of the obtained hardened material is shown in Table 2.

Example 10

Production of [Epoxy Silicone-10a]

A 3 L reactor with a reflux condenser, a thermometer and a stirrer was purged with dry nitrogen. Under dry nitrogen conditions, the reactor was charged with 60 g of 1,3,5,7-tetramethylcyclotetrasiloxane (SiH unit: 0.998 mol) dehydrated, distilled and purified under dry nitrogen; 87.0 g (0.700 mol) of 4-vinylcyclohexene oxide dehydrated, distillated and purified under dry nitrogen; and 980 g of 1,4-dioxane dehydrated, distilled and purified under nitrogen. Thereafter, the mixture was heated in an oil bath increased to 70° C. while stirring under an atmospheric-pressure dry nitrogen atmosphere.

After the temperature of the interior solution exceeded 65° C., a 1,4-dioxane solution (3.3 g) of a platinum divinyltetramethyldisilicone complex containing 500 ppm of platinum in terms of platinum element was added to the solution under dry nitrogen. A hydrosilylation reaction was carried out for 3 hours. At this time, the temperature of the reaction solution was within the range from 65° C. to 100° C. After the 3-hour reaction, 4-vinylcyclohexene oxide was not detected in the reaction solution. Then, subsequently, vinyldimethylsiloxy-terminated polydimethylsiloxane (99.0 g, vinyl group: 0.313 mol), which is represented by the above average composition formula (29) and was treated under reduced pressure in a dry nitrogen atmosphere at 0.2 kPa or less for 2 hours while stirring, was added to the reaction solution. The reaction solution was heated in an oil bath increased to 70° C. while stirring under an atmospheric-pressure dry nitrogen atmosphere to carry out a hydrosilylation reaction for 7 hours. Heating of the reaction solution was terminated and the reaction solution was allowed to cool to room temperature. The solution was analyzed before heating was terminated. As a result, the hydrosilylation reaction was found to proceed quantitatively and an unreacted SiH unit was not detected.

In this example, a vinyl compound <B> except the compound <A> having a carbon-carbon double bond and an epoxy group was not used. In the initiation time of the reaction, the ratio (s2/s1), which is the ratio of the total number of mole (s1) of the SiH unit of organohydrogensilicone to the number of mole (s2) of a carbon-carbon double bond of the compound <A> having a carbon-carbon double bond and an epoxy group, was 0.70; and the ratio (s4/s1), which is the ratio of the total number of mole (s1) of the SiH unit of organohydrogensilicone to the number of mole (s4) of the carbon-carbon double bond of the silicone having a carbon-carbon double bond and added after addition of the compound <A> having a carbon-carbon double bond and an epoxy group was completed, was 0.31. The value of [s4/(s1−s2)] was 1.05.

The number of mole of a catalyst used at the time of initiating the hydrosilylation reaction in terms of metal atom based on the total number of mole of the SiH unit of organohydrogensilicone before the hydrosilylation reaction was 1/118,000 times.

After completion of cooling, the same treatment was performed in the same manner as in Example 7 except that, 980 g of acetonitrile dehydrated, distilled and purified under dry nitrogen was used in the reaction solution to obtain 212 g of [epoxy silicone-10a] reduced in the content of low boiling-point compounds.

The obtained [epoxy silicone-10a] had a number average molecular weight of 1,200 and a structure represented by the following average composition formula (34):

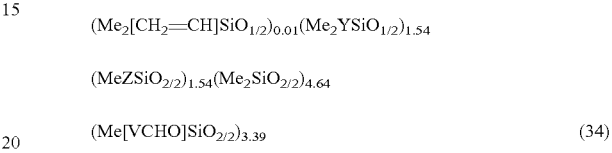

$$(Me[VCHO]SiO_{2/2})_{3.39} \quad (34)$$

wherein in the average composition formula (34), Y represents a divalent organic group represented by —CH$_2$—CH$_2$— and Z represents a bond with the divalent hydrocarbon group Y. Furthermore, (Me[VCHO]SiO$_{2/2}$) represents a unit formed by adding vinylcyclohexene oxide to a hydrogenmethylsiloxy unit by the hydrosilylation reaction in the anti-Markownikoff addition manner and (Me$_2$[CH$_2$=CH]SiO$_{1/2}$) represents vinyldimethylsiloxy-terminal.

Since an unreacted SiH unit was not detected, g=0 in the average composition formula (3) and a value of [g/(a+b+c+d+e+f+g+h+i+j)] was 0.

The compound represented by the general formula (1) and contained in [epoxy silicone-10a] was a compound (the total mass including the mass of sodium: 759) represented by the chemical formula (23). On the other hand, the compound represented by the general formula (2) was a compound represented by the chemical formula (31) where W is an integer of 1 to 9 (the total mass including the mass of sodium were 771, 845, 919, 993, 1,067, 1,141, 1,215, 1,289 and 1,363, respectively). The value of [WB]/[WA] was 0.65. The content of a component having a molecular weight of 800 or less in the epoxy silicone was 28%. The epoxy value was 0.28. The transition metal component contained was platinum alone. The content of the component was 1 ppm or less in terms of platinum element.

As the volatile compounds remaining in [epoxy silicone-10a], only 1,4-dioxane was detected. The total amount of remaining volatile compounds was 0.005% by mass or less. Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.003% by mass and 0.004% by mass, respectively. Other compounds were not detected.

<Production of [Curable Mix Composition-10a] and Evaluation of Physical Property>

The obtained [epoxy silicone-10a] (90 parts by mass), 3,4-epoxycyclohexylmethyl-3',4'-epoxycyclohexanedicarboxylate (10 parts by mass), methylhexahydrophthalicanhydride (42.3 parts by mass), 1,3-propanediol (3 parts by mass) and diazabicycloundecene octoate (0.3 parts by mass) were mixed under nitrogen. After stirring was performed until the whole solution was homogenized, the mixture was defoamed to obtain [curable mix composition-10a]. [Curable mix composition-10a] was poured into a mold having a depth of 3 mm under nitrogen and a hardening reaction was performed at 120° C. for one hour, further at 140° C. for two hours, and further continuously at 160° C. for one hour to obtain a hardened material. The performance of the obtained hardened material is shown in Table 2.

Example 11

Production of [Curable Mix Composition-11a] and Evaluation of Physical Property

The [epoxy silicone-7a] (100 parts by mass) obtained in Example 7, a thermosetting cationic polymerization catalyst (Adeka Optomer CP-66, manufactured by ADEKA Corporation) (0.1 part by mass) were mixed. After stirring was performed until the whole solution was homogenized, the mixture was defoamed to obtain [curable mix composition-11a]. [Curable mix composition-11a] was poured into a mold having a depth of 3 mm under nitrogen and a hardening reaction was performed at 120° C. for one hour, further at 150° C. for two hours, and further continuously at 170° C. for one hour to obtain a hardened material. The performance of the obtained hardened material is shown in Table 2.

Example 12

Production of [Epoxy Silicone-12a]

[Epoxy silicone-12a] (184 g) reduced in low boiling-point compounds was obtained in the same manner as in Example 1 except that, in the hydrosilylation reaction, 1,3-divinyltetramethyldisiloxane (94.2 g) was used; 4-vinylcyclohexene oxide (46 g) was used; 1,4-dioxane (850 g) was used; the 1,4-dioxane solution (3.6 g) of a platinum divinyltetramethyldisilicone complex containing 500 ppm of platinum in terms of platinum element was used; and after the hydrosilylation reaction, the solution was cooled, and thereafter, acetonitrile (850 g) was added.

Immediately before termination of the hydrosilylation reaction, a sample was taken. As a result, the hydrosilylation reaction was found to proceed quantitatively and an unreacted SiH unit was not detected.

At the initiation of the reaction, the ratio (r2/r1), which is the ratio of the total number of mole (r1) of the SiH unit of organohydrogensilicone to the number of mole (r2) of the carbon-carbon double bond of the silicone having a carbon-carbon double bond and used in combination, was 0.76; and the ratio (r4/r1), which is the ratio of the total number mole (r1) of the SiH unit of organohydrogensilicone to the number mole (r4) of the carbon-carbon double bond of a compound <A> having a carbon-carbon double bond and an epoxy group and used in combination, was 0.28. The total number of mole of the carbon-carbon double bond of the compound added based on the total number of mole of the SiH unit of organohydrogensilicone was 1.04 times.

The number of mole of a catalyst used at the time of initiating the hydrosilylation reaction in terms of metal atom based on the total number of mole of the SiH unit of organohydrogensilicone before the hydrosilylation reaction was 1/144,000 times.

The obtained [epoxy silicone-12a] had a number average molecular weight of 1,300 and a structure represented by the following average composition formula (35):

$(Me_2YSiO_{1/2})_{6.2}(MeZSiO_{2/2})_{6.2}$ $(Me[VCHO]SiO_{2/2})_{1.9}$  (35)

wherein in the average composition formula (35), Y represents a divalent organic group represented by —$CH_2$— and Z represents a bond with the divalent hydrocarbon group Y. Furthermore, $(Me[VCHO]SiO_{2/2})$ represents a unit formed by adding vinylcyclohexene oxide to a hydrogenmethylsiloxy unit by the hydrosilylation reaction in the anti-Markownikoff addition manner.

Since an unreacted SiH unit was not detected, g=0 in the average composition formula (3) and a value of [g/(a+b+c+d+e+f+g+h+i+j)] was 0.

The compound represented by the general formula (1) and contained in [epoxy silicone-12a] was a compound represented by the above chemical formula (23). On the other hand, the compound represented by the general formula (2) was a compound represented by the above chemical formula (24). The value of [WB]/[WA] was 3.40. The content of a component having a molecular weight of 800 or less in the epoxy silicone was 19%. The epoxy value was 0.15. The transition metal component contained was platinum alone. The content of the component was 1 ppm or less in terms of platinum element.

As the volatile compounds remaining in [epoxy silicone-12a], only 1,4-dioxane was detected. The total amount of remaining volatile compounds was 0.005% by mass or less. Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.002% by mass and 0.002% by mass, respectively. Other compounds were not detected.

<Production of [Curable Mix Composition-12a] and Evaluation of Physical Property>

The obtained [epoxy silicone-12a] (100 parts by mass), methyl hexahydrophthalicanhydride (25.2 parts by mass), 1,2-propanediol (3 parts by mass) and diazabicycloundecene octoate (0.3 parts by mass) were mixed under nitrogen. After stirring was performed until the whole solution was homogenized, the mixture was defoamed to obtain [curable mix composition-12a]. [Curable mix composition-12a] was poured into mold having a depth of 3 mm under nitrogen and a hardening reaction was performed at 100° C. for one hour, further at 110° C. for two hours, and further continuously at 120° C. for one hour to obtain a hardened material. The performance of the obtained hardened material is shown in Table 2.

Example 13

Production of [Epoxy Silicone-13a]

[Epoxy silicone-13a] (206 g) reduced in low boiling-point compound was obtained in the same manner as in Example 1 except that, in the hydrosilylation reaction, 1,3-divinyltetramethyldisiloxane (6.18 g) was used; 4-vinylcyclohexene oxide (163.68 g) was used; 1,4-dioxane (850 g) was used; the 1,4-dioxane solution (3.8 g) of a platinum divinyltetramethyldisilicone complex containing 500 ppm of platinum in terms of platinum element was used; and after the hydrosilylation reaction, the solution was cooled, and thereafter, acetonitrile (850 g) was added.

Immediately before termination of the hydrosilylation reaction, a sample was taken. As a result, the hydrosilylation reaction was found to proceed quantitatively and an unreacted SiH unit was not detected.

At the initiation of the reaction, the ratio (r2/r1), which is the ratio of the total number of mole (r1) of the SiH unit of organohydrogensilicone to the number of mole (r2) of the carbon-carbon double bond of the silicone having a carbon-carbon double bond and used in combination, was 0.05; and the ratio (r4/r1), which is the ratio of the total number of mole (r1) of the SiH unit of organohydrogensilicone to the number of mole (r4) of the carbon-carbon double bond of a compound <A> having a carbon-carbon double bond and an epoxy group and used in combination, was 0.99. The total number of mole of the carbon-carbon double bond of the compound added based on the total number of mole of the SiH unit of organohydrogensilicone was 1.04 times.

The number of mole of a catalyst used at the time of initiating the hydrosilylation reaction in terms of metal atom based on the total number of mole of the SiH unit of organohydrogensilicone before the hydrosilylation reaction was 1/136,500 times.

The obtained [epoxy silicone-13a] had a number average molecular weight of 850 and a structure represented by the following average composition formula (36):

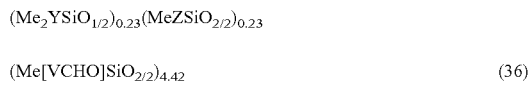

(36)

wherein in the average composition formula (36), Y represents a divalent organic group represented by —CH$_2$—CH$_2$— and Z represents a bond with the divalent hydrocarbon group Y. Furthermore, (Me[VCHO]SiO$_{2/2}$) represents a unit formed by adding vinylcyclohexene oxide to a hydrogenmethylsiloxy unit by the hydrosilylation reaction in the anti-Markownikoff addition manner.

Since an unreacted SiH unit was not detected, g=0 in the average composition formula (3) and a value of [g/(a+b+c+d+e+f+g+h+i+j)] was 0.

The compound represented by the general formula (1) and contained in [epoxy silicone-13a] was a compound represented by the above chemical formula (23). On the other hand, the compound represented by the general formula (2) was a compound represented by the above chemical formula (24). The value of [WB]/[WA] was 0.25. The content of a component having a molecular weight of 800 or less in the epoxy silicone was 72%. The epoxy value was 0.52. The transition metal component contained was platinum alone. The content of the component was 1 ppm or less in terms of platinum element.

As the volatile compounds remaining in [epoxy silicone-13a], only 1,4-dioxane was detected. The total amount of remaining volatile compounds was 0.004% by mass or less. Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.002% by mass and 0.002% by mass, respectively. Other compounds were not detected.

<Production of [Curable Mix Composition-13a] and Evaluation of Physical Property>

The obtained [epoxy silicone-13a] (100 parts by mass), methyl hexahydrophthalicanhydride (87.3 parts by mass), 1,2-propanediol (3 parts by mass) and diazabicycloundecene octoate (0.3 parts by mass) were mixed under nitrogen. After stirring was performed until the whole solution was homogenized, the mixture was defoamed to obtain [curable mix composition-13a]. [Curable mix composition-13a] was poured into a mold having a depth of 3 mm under nitrogen and a hardening reaction was performed at 100° C. for one hour, further at 110° C. for two hours, and further continuously at 120° C. for one hour to obtain a hardened material. The performance of the obtained hardened material is shown in Table 2.

Example 14

Production of [Epoxy Silicone-14a]

A 3 L reactor with a reflux condenser, a thermometer and a stirrer was purged with dry nitrogen. Under dry nitrogen conditions, the reactor was charged with 55.0 g of 1,3,5,7-tetramethylcyclotetrasiloxane (SiH unit: 0.915 mol, a reagent manufactured by Shin-Etsu Chemical Co., Ltd.) dehydrated, distilled and purified under dry nitrogen; vinyldimethylsiloxy-terminated polydimethylsiloxane (63.0 g, vinyl group: 0.110 mol), which is represented by the following average composition formula (37) and was treated under reduced pressure in a dry nitrogen atmosphere at 0.2 kPa or less for 2 hours while stirring; 110.0 g (0.886 mol) of 4-vinylcyclohexene oxide (a reagent manufactured by Aldrich) dehydrated, distilled and purified under dry nitrogen; and 1000 g of 1,4-dioxane (a reagent manufactured by Wako Pure Chemical Industries Ltd.) dehydrated, distilled and purified under nitrogen. Thereafter, the mixture was heated in an oil bath increased to 70° C. while stirring under an atmospheric-pressure dry nitrogen atmosphere.

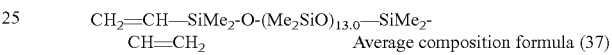

Average composition formula (37)

After the temperature of the interior solution exceeded 65° C., a 1,4-dioxane solution (3.5 g) of a platinum divinyltetramethyldisilicone complex containing 500 ppm of platinum in terms of platinum element was added to the solution under dry nitrogen. A hydrosilylation reaction was carried out for 8 hours. At this time, the temperature of the reaction solution was within the range from 65° C. to 100° C. After the 8-hour reaction, the hydrosilylation reaction was found to proceed quantitatively and an unreacted SiH unit was not detected. Subsequently, heating of the reaction solution was terminated and the reaction solution was allowed to cool to room temperature.

In the initiation time of the reaction, the ratio (r2/r1), which is the ratio of the total number of mole (r1) of the SiH unit of organohydrogensilicone to the number of mole (r2) of the carbon-carbon double bond of the silicone having a carbon-carbon double bond and used in combination, was 0.12; and the ratio (r4/r1), which is the ratio of the total number of mole (r1) of the SiH unit of organohydrogensilicone to the number of mole (r4) of the carbon-carbon double bond of a compound <A> having a carbon-carbon double bond and an epoxy group and used in combination, was 0.97. The total number of mole of the carbon-carbon double bond of the compound added based on the total number of mole of the SiH unit of organohydrogensilicone was 1.09 times.

The number of mole of a catalyst used at the time of initiating the hydrosilylation reaction in terms of metal atom based on the total number of mole of the SiH unit of organohydrogensilicone before the hydrosilylation reaction was 1/102,000 times.

After completion of cooling, 1000 g of acetonitrile (a reagent manufactured by Wako Pure Chemical Industries Ltd.) dehydrated, distilled and purified under dry nitrogen was added to the reaction solution. After the reaction solution was stirred for 2 hours under an atmospheric-pressure dry nitrogen atmosphere, stirring was terminated. Subsequently, 800 g of activated carbon (granular particle manufactured by Wako Pure Chemical Industries Ltd.), which was dried by heating at 150° C. for 3 hours under dry nitrogen airflow, was added. The reaction solution was treated with activated carbon for 48 hours under a dry nitrogen atmosphere. After completion of the treatment with activated carbon, the activated carbon was filtered off by a membrane filter formed of PTFE having a pore size of 1 μm and the filtrate was collected. Furthermore, the activated carbon separated by the aforementioned operation was washed with 1500 g of 1,4-dioxane (a reagent manufactured by Wako Pure Chemical Industries Ltd.) dehydrated, distillated and purified under nitrogen. The activated carbon was filtered off by a membrane filter in the same manner as above. The washing solution was collected and combined with the filtrate previously obtained. The solution mixture thus collected was subjected to an evaporator to evaporate 1,4-dioxane and acetonitrile at a heating temperature of 40° C. under reduced pressure conditions to obtain epoxy silicone.

An aliquot of the epoxy silicone obtained was taken and placed in a cylindrical Pyrex glass tube having an inner diameter of 70 mm and an effective length of 200 mm and set in a glass tube oven (GTO-350 manufactured by Shibata Scientific Technology Ltd.). Rotation of the cylindrical tube inside was initiated and the interior was purged with dry nitrogen in room temperature conditions. Thereafter, while introducing dry nitrogen at a temperature of 50° C. at a pressure of 0.2 kPa to the interior at a flow rate of 10 mL/minute in terms of atmospheric pressure, a treatment was performed with heating for 24 hours under reduced pressure to obtain epoxy silicone reduced in the content of low boiling-point compounds. The remaining epoxy silicone obtained above, from which 1,4-dioxane and acetonitrile were evaporated, was repeatedly subjected to this operation to obtain 180 g of [epoxy silicone-14a] reduced in the content of low boiling-point compounds.

The obtained [epoxy silicone-14a] had a number average molecular weight of 1,000 and a structure represented by the following average composition formula (38):

$$(Me_2YSiO_{1/2})_{0.50}(MeZSiO_{2/2})_{0.50}(Me_2SiO_{2/2})_{3.28}$$

$$(Me[VCHO]SiO_{2/2})_{3.69} \quad (38)$$

wherein in the average composition formula (38), Y represents a divalent organic group represented by —CH$_2$—CH$_2$— and Z represents a bond with the divalent hydrocarbon group Y. Furthermore, (Me[VCHO]SiO$_{2/2}$) represents a unit formed by adding vinylcyclohexene oxide to a hydrogenmethylsiloxy unit by the hydrosilylation reaction in the anti-Markownikoff addition manner.

Since an unreacted SiH unit was not detected, g=0 in the average composition formula (3) and a value of [g/(a+b+c+d+e+f+g+h+i+j)] was 0.

The compound represented by the general formula (1) and contained in [epoxy silicone-14a] was a compound (the total mass including the mass of sodium: 759) represented by the following chemical formula (23). On the other hand, the compound represented by the general formula (2) was a compound represented by the following chemical formula (31) where W is an integer of 1 to 20. The value of [WB]/[WA] was 0.35. The content of a component having a molecular weight of 800 or less in the epoxy silicone was 30%. The epoxy value was 0.37. The transition metal component contained was platinum alone. The content of the component was 1 ppm or less in terms of platinum element.

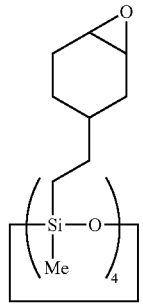

(23)

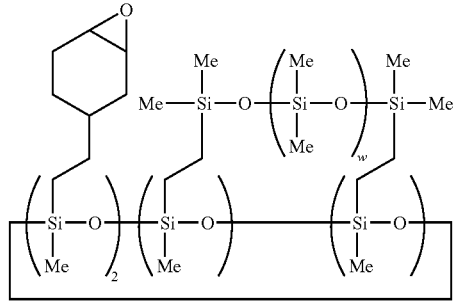

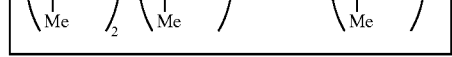

(31)

As the volatile compounds remaining in [epoxy silicone-14a], only 1,4-dioxane was detected. The total amount of remaining volatile compounds was 0.005% by mass or less. Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.002% by mass and 0.002% by mass, respectively. Other compounds were not detected.

<Production of [Curable Mix Composition-14a] and Evaluation of Physical Property>

The obtained [epoxy silicone-14a] (100 parts by mass), methyl hexahydrophthalicanhydride (62.1 parts by mass), 1,2-propanediol (3 parts by mass) and diazabicycloundecene octoate (0.3 parts by mass) were mixed under nitrogen. After stirring was performed until the whole solution was homogenized, the mixture was defoamed to obtain [curable mix composition-14a]. [Curable mix composition-14a] was poured into a mold having a depth of 3 mm under nitrogen and a hardening reaction was performed at 120° C. for one hour, further at 150° C. for two hours, and further continuously at 170° C. for one hour to obtain a hardened material. The performance of the obtained hardened material is shown in Table 2.

Comparative Example 1

Production of [Epoxy Silicone-1b]

A 3L reactor with a reflux condenser, a thermometer and a stirrer was purged with dry nitrogen. Under dry nitrogen conditions, the reactor was charged with 80 g of 1,3,5,7-tetramethylcyclotetrasiloxane (a reagent manufactured by Shin-Etsu Chemical Co., Ltd.) dehydrated, distillated and purified under dry nitrogen; 198.4 g of 4-vinylcyclohexene oxide (a reagent manufactured by Aldrich) dehydrated, distillated and purified under dry nitrogen and 925 g of 1,4-dioxane (a reagent manufactured by Wako Pure Chemical Industries Ltd.) dehydrated, distillated and purified under nitrogen. Thereafter, the mixture was heated in an oil bath increased to 70° C. while stirring under an atmospheric-pressure dry nitrogen atmosphere.

After the temperature of the interior solution exceeded 65° C., a 1,4-dioxane solution (3.9 g) of a platinum divinyltetramethyldisilicone complex containing 500 ppm of platinum in terms of platinum element was added to the solution under dry nitrogen. A hydrosilylation reaction was carried out for 8 hours. At this time, the temperature of the reaction solution was within the range from 65° C. to 100° C. After the 8-hour reaction, the hydrosilylation reaction was found to proceed quantitatively and an unreacted SiH unit was not detected. Subsequently, heating of the reaction solution was terminated and the reaction solution was allowed to cool to room temperature.

After completion of cooling, 925 g of acetonitrile (a reagent manufactured by Wako Pure Chemical Industries Ltd.) dehydrated, distilled and purified under dry nitrogen was added to the reaction solution. After the reaction solution was stirred for 2 hours under an atmospheric-pressure dry nitrogen atmosphere, stirring was terminated. Subsequently, 800 g of activated carbon (granular particle manufactured by Wako Pure Chemical Industries Ltd.), which was dried by heating at 150° C. for 3 hours under dry nitrogen airflow, was added. The reaction solution was treated with activated carbon for 48 hours under a dry nitrogen atmosphere. After completion of the treatment with activated carbon, the activated carbon was filtered off by a membrane filter formed of PTFE having a pore size of 1 μm and the filtrate was collected. Furthermore, the activated carbon separated by the aforementioned operation was washed with 1500 g of 1,4-dioxane (a reagent manufactured by Wako Pure Chemical Industries Ltd.) dehydrated, distilled and purified under nitrogen. The activated carbon was filtered off by a membrane filter in the same manner as above. The washing solution was collected and combined with the filtrate previously obtained. The solution mixture thus collected was subjected to an evaporator to evaporate 1,4-dioxane and acetonitrile at a heating temperature of 40° C. under reduced pressure conditions to obtain epoxy silicone.

An aliquot of the epoxy silicone obtained was taken and placed in a cylindrical Pyrex (registered trademark) glass tube having an inner diameter of 70 mm and an effective length of 200 mm and set in a glass tube oven (GTO-350 manufactured by Shibata Scientific Technology Ltd.). Rotation of the cylindrical tube inside was initiated and the interior was purged with dry nitrogen in room temperature conditions. Thereafter, while introducing dry nitrogen at a temperature of 50° C. at a pressure of 0.2 kPa to the interior at a flow rate of 10 mL/minute in terms of atmospheric pressure, a treatment was performed with heating for 24 hours under reduced pressure to obtain epoxy silicone reduced in the content of low boiling-point compounds. The remaining epoxy silicone obtained above, from which 1,4-dioxane and acetonitrile were evaporated, was repeatedly subjected to this operation to obtain 213 g of [epoxy silicone-1b] reduced in the content of low boiling-point compounds.

The obtained [epoxy silicone-1b] had a structure represented by the following structural formula (23). The epoxy value was 0.54. The transition metal component contained was platinum alone. The content of the component was 1 ppm or less in terms of platinum element.

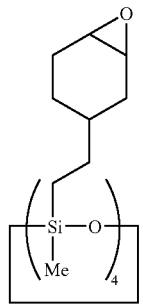

(23)

As the volatile compounds remaining in [epoxy silicone-1b], only 1,4-dioxane was detected. The total amount of remaining volatile compounds was 0.005% by mass or less. Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.003% by mass and 0.003% by mass, respectively. Other compounds were not detected.

<Production of [Curable Mix Composition-1b] and Evaluation of Physical Property>

The obtained [epoxy silicone-1b] (100 parts by mass), methyl hexahydrophthalicanhydride (90.7 parts by mass), 1,2-propanediol (3 parts by mass) and diazabicycloundecene octoate (0.3 parts by mass) were mixed under nitrogen. After stirring was performed until the whole solution was homogenized, the mixture was defoamed to obtain [curable mix composition-1b]. [Curable mix composition-1b] was poured into a mold having a depth of 3 mm under nitrogen and a hardening reaction was performed at 120° C. for one hour, further at 150° C. for two hours, and further continuously at 170° C. for one hour to obtain a hardened material. The performance of the obtained hardened material is shown in Table 2.

Comparative Example 2

Production of [Epoxy Silicone-2b]

A 3 L reactor with a reflux condenser, a thermometer and a stirrer was purged with dry nitrogen. Under dry nitrogen conditions, the reactor was charged with 80 g of 1,3,5,7-tetramethylcyclotetrasiloxane (a reagent manufactured by Shin-Etsu Chemical Co., Ltd.) dehydrated, distilled and purified under dry nitrogen; 37.2 g of 1,3-divinyltetramethyldisiloxane (a reagent manufactured by Shin-Etsu Chemical Co., Ltd.) dehydrated, distilled and purified under dry nitrogen; 110 g of 4-vinylcyclohexene oxide (a reagent manufactured by Aldrich) dehydrated, distilled and purified under dry nitrogen and 925 g of 1,4-dioxane (a reagent manufactured by Wako Pure Chemical Industries Ltd.) dehydrated, distilled and purified under nitrogen. Thereafter, the mixture was heated in an oil bath increased to 70° C. while stirring under an atmospheric-pressure dry nitrogen atmosphere.

After the temperature of the interior solution exceeded 65° C., a 1,4-dioxane solution (3.7 g) of a platinum divinyltetramethyldisilicone complex containing 500 ppm of platinum in terms of platinum element was added to the solution under dry nitrogen. A hydrosilylation reaction was carried out for 8 hours. At this time, the temperature of the reaction solution was within the range from 65° C. to 100° C. After the 8-hour reaction, $^1$H-NMR analysis was performed. The conversion rate of SiH units was 95%. It was confirmed that the remaining (5%) was unreacted SiH units. Subsequently, heating of the reaction solution was terminated and the reaction solution was allowed to cool to room temperature.

In the initiation time of the reaction, the ratio (r2/r1), which is the ratio of the total number of mole (r1) of the SiH unit of organohydrogensilicone to the number of mole (r2) of the carbon-carbon double bond of the silicone having a carbon-carbon double bond and used in combination, was 0.30; and the ratio (r4/r1), which is the ratio of the total number of mole (r1) of the SiH unit of organohydrogensilicone to the number of mole (r4) of the carbon-carbon double bond of a compound <A> having a carbon-carbon double bond and an epoxy group and used in combination, was 0.67. The total number of mole of the carbon-carbon double bond of the compound added based on the total number of mole of the SiH unit of organohydrogensilicone was 0.97 times.

After completion of cooling, the same treatment was performed in the same manner as in Example 1 except that 884 g of acetonitrile dehydrated, distilled and purified under dry nitrogen was used in the reaction solution to obtain 201 g of [epoxy silicone-2b] reduced in the content of low boiling-point compounds.

The obtained [epoxy silicone-2b] had a number average molecular weight of 900 and a structure represented by the following average composition formula (39):

$$(Me_2YSiO_{1/2})_{1.6}(MeZSiO_{2/2})_{1.6}$$

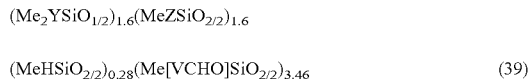

(39)

wherein in the average composition formula (39), Y represents a divalent organic group represented by —CH$_2$—CH$_2$— and Z represents a bond with the divalent hydrocarbon group Y. Furthermore, (Me[VCHO]SiO$_{2/2}$) represents a unit formed by adding vinylcyclohexene oxide to a hydrogenmethylsiloxy unit by the hydrosilylation reaction in the anti-Markownikoff addition manner.

When [g/(a+b+c+d+e+f+g+h+i+j)] in the average composition formula (3) was calculated from the composition, g=0.28/(1.6+1.6+0.28+3.46)=0.04.

Furthermore, the value of [WB]/[WA] of [epoxy silicone-2b] was 0.54. The content of a component having a molecular weight of 800 or less in the epoxy silicone was 36%. The epoxy value was 0.38. The transition metal component contained was platinum alone. The content of the component was 1 ppm or less in terms of platinum element.

As the volatile compounds remaining in [epoxy silicone-2b], only 1,4-dioxane was detected. The total amount of remaining volatile compounds was 0.004% by mass or less. Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.003% by mass and 0.003% by mass, respectively. Other compounds were not detected.

<Production of [Curable Mix Composition-2b] and Evaluation of Physical Property>

The obtained [epoxy silicone-2b] (100 parts by mass), methyl hexahydrophthalicanhydride (63.8 parts by mass), 1,2-propanediol (3 parts by mass) and diazabicycloundecene octoate (0.3 parts by mass) were mixed under nitrogen. After stirring was performed until the whole solution was homogenized, the mixture was defoamed to obtain [curable mix composition-2b]. [Curable mix composition-2b] was poured into mold having a depth of 3 mm under nitrogen and a hardening reaction was performed at 120° C. for one hour and further at 150° C. for two hours to obtain a hardened material. The performance of the obtained hardened material is shown in Table 2.

Comparative Example 3

Production of [Epoxy Silicone-3b]

A 3L reactor with a reflux condenser, a thermometer and a stirrer was purged with dry nitrogen. Under dry nitrogen conditions, the reactor was charged with 80 g of 1,3,5,7-tetramethylcyclotetrasiloxane (a reagent manufactured by Shin-Etsu Chemical Co., Ltd.) dehydrated, distilled and purified under dry nitrogen; 37.2 g of 1,3-divinyltetramethyldisiloxane (a reagent manufactured by Shin-Etsu Chemical Co., Ltd.) dehydrated, distilled and purified under dry nitrogen; 102 g of 4-vinylcyclohexene oxide (a reagent manufactured by Aldrich) dehydrated, distilled and purified under dry nitrogen and 925 g of 1,4-dioxane (a reagent manufactured by Wako Pure Chemical Industries Ltd.) dehydrated, distilled and purified under nitrogen. Thereafter, the mixture was heated in an oil bath increased to 70° C. while stirring under an atmospheric-pressure dry nitrogen atmosphere.

After the temperature of the interior solution exceeded 65° C., a 1,4-dioxane solution (3.7 g) of a platinum divinyltetramethyldisilicone complex containing 500 ppm of platinum in terms of platinum element was added to the solution under dry nitrogen. A hydrosilylation reaction was carried out for 8 hours. At this time, the temperature of the reaction solution was within the range from 65° C. to 100° C. After the 8-hour reaction, $^1$H-NMR analysis was performed. The conversion rate of SiH units was 90%. It was confirmed that the remaining (10%) was unreacted SiH units. Subsequently, heating of the reaction solution was terminated and the reaction solution was allowed to cool to room temperature.

In the initiation time of the reaction, the ratio (r2/r1), which is the ratio of the total number of mole (r1) of the SiH unit of organohydrogensilicone to the number of mole (r2) of the carbon-carbon double bond of the silicone having a carbon-carbon double bond and used in combination, was 0.30; and the ratio (r4/r1), which is the ratio of the total number of mole (r1) of the SiH unit of organohydrogensilicone to the number of mole (r4) of the carbon-carbon double bond of a compound <A> having a carbon-carbon double bond and an epoxy group and used in combination, was 0.62. The total number of mole of the carbon-carbon double bond of the compound added based on the total number of mole of the SiH unit of organohydrogensilicone was 0.92 times.

After completion of cooling, the same treatment was performed in the same manner as in Example 1 except that 884 g of acetonitrile dehydrated, distilled and purified under dry nitrogen was used in the reaction solution to obtain 195 g of [epoxy silicone-3b] reduced in the content of low boiling-point compounds.

The obtained [epoxy silicone-3b] had a number average molecular weight of 900 and a structure represented by the following average composition formula (40):

$$(Me_2YSiO_{1-2})_{1.67}(MeZSiO_{2/2})_{1.67}$$

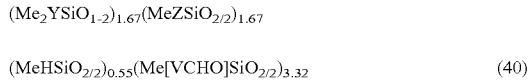

(40)

wherein in the average composition formula (40), Y represents a divalent organic group represented by —CH$_2$—CH$_2$— and Z represents a bond with the divalent hydrocarbon group Y. Furthermore, (Me[VCHO]SiO$_{2/2}$) represents a unit formed by adding vinylcyclohexene oxide to a hydrogenmethylsiloxy unit by the hydrosilylation reaction in the anti-Markownikoff addition manner.

When [g/(a+b+c+d+e+f+g+h+i+j)] in the average composition formula (3) was calculated from the composition, g=0.55/(1.67+1.67+0.55+3.32)=0.08.

Furthermore, the value of [WB]/[WA] of [epoxy silicone-3b] was 0.55. The content of a component having a molecular weight of 800 or less in the epoxy silicone was 39%. The epoxy value was 0.37. The transition metal component contained was platinum alone. The content of the component was 1 ppm or less in terms of platinum element.

As the volatile compounds remaining in [epoxy silicone-3b], only 1,4-dioxane was detected. The total amount of remaining volatile compounds was 0.005% by mass or less. Furthermore, as low boiling-point compounds, 4-vinylcyclohexene oxide and 4-ethylidenylcyclohexene oxide, which was generated by internal rearrangement of the carbon-carbon double bond of 4-vinylcyclohexene oxide, were detected. The remaining amounts thereof were 0.003% by mass and 0.004% by mass, respectively. Other compounds were not detected.

<Production of [Curable Mix Composition-3b] and Evaluation of Physical Property>

The obtained [epoxy silicone 2b] [epoxy silicone-3b] (100 parts by mass), methyl hexahydrophthalicanhydride (62.1 parts by mass), 1,2-propanediol (3 parts by mass) and diazabicycloundecene octoate (0.3 parts by mass) were mixed under nitrogen. After stirring was performed until the whole solution was homogenized, the mixture was defoamed to obtain [curable mix composition-3b]. [Curable mix composition-3b] was poured into mold having a depth of 3 mm under nitrogen and a hardening reaction was performed at 120° C. for one hour and further at 150° C. for two hours to obtain a hardened material. The performance of the obtained hardened material is shown in Table 2.

Production Example 1

[Curable mix composition-1a] obtained in Example 1 was poured in a cannonball frame mold having a diameter of 4 mm and a lead frame having a light-emitting device (400 nm in wavelength) immobilized therein, was soaked. After defoaming was performed in vacuum, a hardening reaction was performed at 120° C. for one hour, further at 150° C. for two hours and at 170° C. for one hour to obtain a light-emitting diode. Even if a current of 50 mA was supplied to the light-emitting diode obtained by this operation for 200 hours at room temperature, neither separation between the device and a sealing portion nor a decrease in brightness was observed.

Production Example 2

A light-emitting diode was obtained in the same manner as in Production Example 1 except that [curable mix composition-2a] obtained in Example 2 was used and that hardening was performed at 120° C. for one hour and 150° C. for one hour. Even if a current of 50 mA was supplied to the light-emitting diode obtained by this operation for 200 hours at room temperature, neither separation between the device and a sealing portion nor a decrease in brightness was observed.

Production Example 3

A light-emitting diode was obtained in the same manner as in Production Example 1 except that [curable mix composition-3a] obtained in Example 3 was used and that hardening was performed at 120° C. for one hour and 150° C. for two hours. Even if a current of 50 mA was supplied to the light-emitting diode obtained by this operation for 200 hours at room temperature, neither separation between the device and a sealing portion nor a decrease in brightness was observed.

Production Example 4

A light-emitting diode was obtained in the same manner as in Production Example 1 except that [curable mix composition-5a] obtained in Example 5 was used and that hardening was performed at 120° C. for one hour, 140° C. for two hours and 160° C. for one hour. Even if a current of 50 mA was supplied to the light-emitting diode obtained by this operation for 200 hours at room temperature, neither separation between the device and a sealing portion nor a decrease in brightness was observed.

Production Example 5

A light-emitting diode was obtained in the same manner as in Production Example 1 except that [curable mix composition-7a] obtained in Example 7 was used. Even if a current of 50 mA was supplied to the light-emitting diode obtained by this operation for 200 hours at room temperature, neither separation between the device and a sealing portion nor a decrease in brightness was observed.

Production Example 6

The [epoxy silicone-1a] (100 parts by mass) obtained in Example 1, methyl hexahydrophthalicanhydride (67.2 parts by mass), 1,2-propanediol (3 parts by mass) and diazabicycloundecene octoate (0.3 parts by mass) were mixed under nitrogen. After stirring was performed until the whole solution was homogenized, the mixture was defoamed to obtain [curable mix composition-1a].

The composition was loaded in a cartridge, which was installed in injection molding machine LS40 (manufactured by Sodick Plustech Co., Ltd.). Injection molding was performed in the conditions (a mold temperature: 180° C., retention time in the mold: 300 seconds) to obtain a dome-form lens material having a diameter of 10 mm. The lens material was free of coloration, crack and burr, and had a good appearance.

TABLE 1

|  |  | Ex. 1 | Ex. 2 | Ex. 3 | Ex. 4 | Ex. 5 | Ex. 6 | Ex. 7 | Ex. 8 |
| --- | --- | --- | --- | --- | --- | --- | --- | --- | --- |
| Epoxy silicone |  | 1a | 2a | 3a | 4a | 5a | 1a | 7a | 8a |
| Characteristic of Epoxy silicone | [WB]/[WA] | 0.64 | 0.53 | 0.95 | 2.83 | 0.87 | 0.64 | 0.50 | 0.53 |
|  | [g/(a + b + c + d + e + f + g + h + i + j)] | 0 | 0.007 | 0 | 0 | 0 | 0 | 0 | 0 |
|  | Content (%) of component (molecular weight: 800 or less) in epoxy silicone | 47 | 45 | 43 | 24 | 45 | 47 | 41 | 36 |

TABLE 1-continued

|  |  | Ex. 1 | Ex. 2 | Ex. 3 | Ex. 4 | Ex. 5 | Ex. 6 | Ex. 7 | Ex. 8 |
|---|---|---|---|---|---|---|---|---|---|
|  | Epoxy value | 0.40 | 0.40 | 0.32 | 0.17 | 0.34 | 0.40 | 0.38 | 0.32 |
| Curable mix composition (parts by mass) | Epoxy silicone | 100 | 100 | 100 | 100 | 90 | 100 | 100 | 100 |
|  | 3,4-Epoxycyclohexylmethyl-3',4'-epoxycyclohexanedicarboxylate | 0 | 0 | 0 | 0 | 10 | 0 | 0 | 0 |
|  | Methylhexahydrophthalicanhydride | 67.2 | 67.2 | 53.8 | 28.6 | 51.4 | 0 | 63.8 | 53.8 |
|  | 1,2-Propanediol | 0.3 | 0.3 | 0.3 | 0.3 | 0 | 0 | 3 | 3 |
|  | 1,3-Propanediol | 0 | 0 | 0 | 0 | 3 | 0 | 0 | 0 |
|  | Diazabicycloundecene octoate | 0.3 | 0.3 | 0.3 | 0.3 | 0.3 | 0 | 0.3 | 0.3 |
|  | CP-66 | 0 | 0 | 0 | 0 | 0 | 0.1 | 0 | 0 |
| Property of hardened material | Transparency | excellent | excellent | excellent | excellent | excellent | excellent | excellent | excellent |
|  | Heat resistance | excellent | excellent | excellent | goodt | excellent | excellent | excellent | excellent |
|  | Light resistance | excellent | excellent | excellent | excellent | excellent | excellent | excellent | excellent |
|  | Thermal discoloration resistance | excellent | excellent | excellent | excellent | excellent | excellent | excellent | excellent |
|  | Crack resistance | excellent | excellent | excellent | excellent | excellent | excellent | excellent | excellent |
|  | Adhesiveness | excellent | excellent | excellent | ○ | excellent | excellent | excellent | excellent |

TABLE 2

|  |  | Ex. 9 | Ex. 10 | Ex. 11 | Ex. 12 | Ex. 13 |
|---|---|---|---|---|---|---|
| Epoxy silicone |  | 9a | 10a | 7a | 12a | 13a |
| Characteristic of Epoxy silicone | [WB]/[WA] | 1.35 | 0.65 | 0.50 | 3.40 | 0.25 |
|  | [g/(a + b + c + d + e + f + g + h + i + j)] | 0 | 0 | 0 | 0 | 0 |
|  | Content (%) of component (molecular weight: 800 or less) in epoxy silicone | 13 | 28 | 41 | 19 | 72 |
|  | Epoxy value | 0.16 | 0.28 | 0.38 | 0.15 | 0.52 |
| Curable mix composition (parts by mass) | Epoxy silicone | 100 | 90 | 100 | 100 | 100 |
|  | 3,4-Epoxycyclohexylmethyl-3',4'-epoxycyclohexanedicarboxylate | 0 | 10 | 0 | 0 | 0 |
|  | Methylhexahydrophthalicanhydride | 26.9 | 42.3 | 0.0 | 25.2 | 87.3 |
|  | 1,2-Propanediol | 3 | 0 | 0 | 3 | 3 |
|  | 1,3-Propanediol | 0 | 3 | 0 | 0 | 0 |
|  | Diazabicycloundecene octoate | 0.3 | 0.3 | 0.0 | 0.3 | 0.3 |
|  | CP-66 | 0 | 0 | 0.1 | 0 | 0 |
| Property of hardened material | Transparency | excellent | excellent | excellent | excellent | excellent |
|  | Heat resistance | good | excellent | excellent | good | excellent |
|  | Light resistance | excellent | excellent | excellent | excellent | good |
|  | Thermal discoloration resistance | excellent | excellent | excellent | excellent | excellent |
|  | Crack resistance | excellent | excellent | excellent | bad | bad |
|  | Adhesiveness | good | excellent | excellent | bad | excellent |

|  |  | Ex. 14 | Com. Ex. 1 | Com. Ex. 2 | Com. Ex. 3 |
|---|---|---|---|---|---|
| Epoxy silicone |  | 14a | 1b | 2b | 3b |
| Characteristic of Epoxy silicone | [WB]/[WA] | 0.35 | — | 0.54 | 0.55 |
|  | [g/(a + b + c + d + e + f + g + h + i + j)] | 0 | — | 0.04 | 0.08 |
|  | Content (%) of component (molecular weight: 800 or less) in epoxy silicone | 30 | — | 36 | 39 |
|  | Epoxy value | 0.37 | 0.54 | 0.38 | 0.37 |
| Curable mix composition (parts by mass) | Epoxy silicone | 100 | 100 | 100 | 100 |
|  | 3,4-Epoxycyclohexylmethyl-3',4'-epoxycyclohexanedicarboxylate | 0 | 0 | 0 | 0 |
|  | Methylhexahydrophthalicanhydride | 62.1 | 90.7 | 63.8 | 62.1 |
|  | 1,2-Propanediol | 3 | 3 | 3 | 3 |
|  | 1,3-Propanediol | 0 | 0 | 0 | 0 |
|  | Diazabicycloundecene octoate | 0.3 | 0.3 | 0.3 | 0.3 |
|  | CP-66 | 0 | 0 | 0 | 0 |
| Property of hardened material | Transparency | good | excellent | excellent | excellent |
|  | Heat resistance | good | excellent | excellent | excellent |
|  | Light resistance | excellent | bad | excellent | excellent |
|  | Thermal discoloration resistance | excellent | good | excellent | excellent |
|  | Crack resistance | bad | bad | too bad | too bad |
|  | Adhesiveness | bad | excellent | too bad | too bad |

As is apparent from Table 1 and Table 2, the hardened materials (Examples 1 to 11) obtained by hardening the curable mix compositions containing the epoxy silicone of the present invention were excellent in all properties: transparency, light resistance, heat resistance, heat discoloration resistance, crack resistance and adhesiveness. The hardened materials of Examples 12 and 13 using epoxy silicone having a [WB]/[WA] value outside the preferable range were satisfactory in transparency, light resistance, heat resistance and heat discoloration resistance but inferior in crack resistance and adhesiveness.

The hardened material of Example 14 using epoxy silicone having an average value v in the general formula (2) of 13 was satisfactory in transparency, light resistance, heat resistance and heat discoloration resistance but inferior in crack resistance and adhesiveness.

In contrast, the hardened material of Comparative Example 1 using epoxy silicone-1b formed of a monocyclic structure was inferior in light resistance and crack resistance. The hardened materials of Comparative Examples 2 and 3 using epoxy silicones-2b and 3b having a value of [g/(a+b+c+d+e+f+g+h+i+j)] in the average composition formula (3) exceeding 0.020 (having an unreacted SiH unit) were extremely brittle and already had a crack at the hardening completion time and thus no evaluation was made.

Light-emitting diodes produced from the epoxy silicone of the present invention had excellent properties (Production Examples 1 to 5). In addition, the epoxy silicone of the present invention can be mold by injection molding to obtain a mold having a good appearance (Production Example 6).

The present application was based on Japanese Patent Application Nos. 2007-107713 and 2007-107714 filed on Apr. 17, 2007 with the Japanese Patent Office, and the contents thereof, which were incorporated herein by reference.

INDUSTRIAL APPLICABILITY

According to the present invention, it is possible to provide epoxy silicone having transparency, light resistance, heat resistance, heat discoloration resistance, crack resistance and adhesiveness and suitable for use in a light-emitting device sealing material; a curable mix composition containing the epoxy silicone for use in sealing a light-emitting device, and excellent light-emitting components such as a light-emitting diode formed of the resin composition and having excellent adhesiveness between the device and a packaging material, free of occurrence of a crack and having a slight decrease in brightness even if it is used for a long time.

Furthermore, according to the present invention, it is possible to provide a curable mix composition suitable for injection molding and rigid after hardened, excellent in dimensional stability and suitable as a lens material.

The invention claimed is:

1. An epoxy silicone, which comprises at least a compound represented by the following general formula (1), and a compound represented by the following general formula (2); and which is represented by an average composition formula (3), wherein a value of [g/(a+b+c+d+e+f+g+h+i+j)] falls within a range of 0.020 or less;

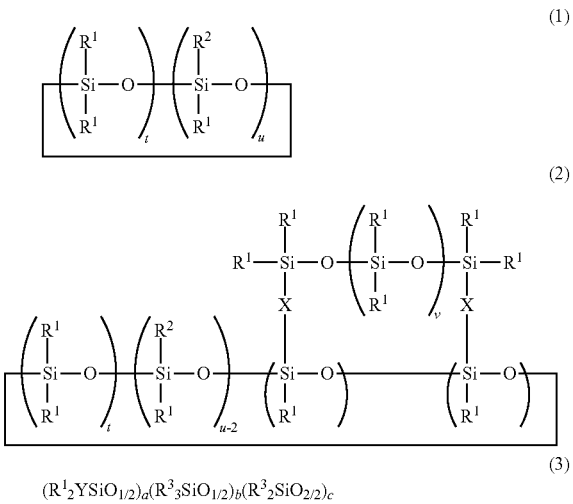

wherein $R^1$ each independently represents at least one organic group which is selected from the group consisting of A) a monovalent aliphatic organic group having an aliphatic hydrocarbon unit, which is formed of at least one structure which is selected from the group consisting of substituted or unsubstituted chain, branched and cyclic structures, and which has carbon atoms of 1 or more and 24 or less and oxygen atoms of 0 or more and 5 or less, B) a monovalent aromatic organic group, which is a substituted or unsubstituted aromatic hydrocarbon unit, having an aliphatic hydrocarbon unit, which is formed of at least one structure which is selected from the group consisting of optionally substituted or unsubstituted chain, branched and cyclic structures, and which has carbon atoms of 6 or more and 24 or less and oxygen atoms of 0 or more and 5 or less, and C) a monovalent organic group having an aliphatic and/or aromatic hydrocarbon unit, which is formed of at least one structure which is selected from the group consisting of a substituted or unsubstituted chain, branched and cyclic structures, and which has carbon atoms of 5 or more and 26 or less, oxygen atoms of 0 or more and 5 or less and a single silicon atom;

$R^2$ each independently represents D) an organic group containing an epoxy group having an aliphatic hydrocarbon unit, which is formed of at least one structure which is selected from the group consisting of substituted or unsubstituted chain, branched and cyclic structures, and which has carbon atoms of 4 or more and 24 or less and oxygen atoms of 1 or more and 5 or less;

$R^3$ each independently represents at least one organic group which is selected from the group consisting of A) a monovalent aliphatic organic group having an aliphatic hydrocarbon unit, which is formed of at least one structure which is selected from the group consisting of substituted or unsubstituted chain, branched and cyclic structures and which has carbon atoms of 1 or more and 24 or less and oxygen atoms of 0 or more and 5 or less, B) a monovalent aromatic organic group, which is a substituted or unsubstituted aromatic hydrocarbon unit, having an aliphatic hydrocarbon unit, which is formed of at least one structure which is selected from the group consisting of optionally substituted or unsubstituted chain, branched and cyclic structures, and which has carbon atoms of 6 or more and 24 or less and oxygen atoms of 0 or more and 5 or less, C) a monovalent organic group having an aliphatic and/or aromatic hydrocarbon unit, which is formed of at least one structure which is selected from the group consisting of a substituted or unsubstituted chain, branched and cyclic structures, and which has carbon atoms of 5 or more and 26 or less, oxygen atoms of 0 or more and 5 or less and a single silicon atom, and E) a monovalent aliphatic organic group formed of at least one structure which is selected from the group consisting of substituted or unsubstituted chain and branched structures, and which has carbon atoms, including carbon atoms of carbon-carbon double bond, of 2 or more and 6 or less;

X represents a divalent hydrocarbon group formed of at least one structure which is selected from the group consisting of substituted or unsubstituted chain and branched structures and which has carbon atoms of 2 or more and 6 or less;

Y each independently represents a divalent hydrocarbon group formed of at least one structure which is selected from the group consisting of substituted or unsubstituted chain and branched structures and which has carbon atoms of 2 or more and 6 or less;

Z represents a bond with the divalent hydrocarbon group Y;

wherein t each independently represents an integer of 0 or more; u each independently represents an integer of 3 or more; v represents an integer of 0 or more;

furthermore, a, b, c, d, e, f, g, h, i and j represent the numbers of moles of individual structural units present in epoxy silicone (1 mole); a, e and f are each a value beyond 0; and b, c, d, g, h, i and j are each a value of 0 or more; and e=a+d+i is satisfied; and the chain in the general formulas (1) and (2) may be random or block.

2. The epoxy silicone according to claim 1, wherein a ratio of the content [WB] of the compound represented by the general formula (2) to the content [WA] of the compound represented by the general formula (1), that is, a ratio of [WB]/[WA], which is calculated from the following formula (1) based on intensity values of peaks measured by the Matrix Assisted Laser Desorption/Ionization time-of-flight Mass Spectrometry, is 0.30 or more and 3.00 or less.

$$[WB]/[WA] = \frac{\text{Intensity of peak corresponding to the sum of the mass corresponding to a structure represented by the general formula (2) and the mass (23) of sodium}}{\text{Intensity of peak corresponding to the sum of the mass corresponding to a structure represented by the general formula (1) and the mass (23) of sodium}} \quad (I)$$

3. The epoxy silicone according to claim 1 or 2, wherein the value of v in the general formula (2) is 0 or more and 9 or less.

4. The epoxy silicone according to claim 1 or 2, wherein a value of [(h+i+j)/(a+b+c+d+e+f+g+h+i+j)] of the epoxy silicone represented by the average composition formula (3) falls within a range of 0.040 or less; and the ratio of the content of the compound represented by the general formula (2) to the content of the compound represented by the general formula (1), that is, the ratio of [WB]/[WA], which is defined by the formula (1), is 0.30 or more and 3.00 or less.

5. The epoxy silicone according to claim 1 or 2, wherein the content of a component having a molecular weight of 800 or less in the epoxy silicone represented by the average composition formula (3) falls within a range of 10% or more and 90% or less.

6. The epoxy silicone according to claim 1 or 2, wherein an epoxy value falls within a range of 0.15 or more and 0.50 or less.

7. A curable mix composition comprising:
the epoxy silicone according to claim 1 or 2 in an amount of 100 parts by mass; and
a hardening agent for an epoxy resin in an amount of 1 part by mass or more and 200 parts by mass or less.

8. The curable mix composition according to claim 7, further comprising:
a hardening accelerator in an amount of 0.001 part by mass or more and 10 parts by mass or less.

9. A curable mix composition, comprising:
the epoxy silicone according to claim 1 or 2 in an amount of 100 parts by mass; and
a cationic polymerization catalyst in an amount of 0.001 part by mass or more and 10 parts by mass or less.

10. An encapsulant for a light-emitting device, comprising the curable mix composition according to claim 7.

11. A light-emitting component sealed with the encapsulant for a light-emitting device according to claim 10.

12. A lens formed of the curable mix composition according to claim 7.

13. A process for producing the epoxy silicone according to claim 1 or 2, comprising:
a single step of adding a mixture of silicone having a carbon-carbon double bond represented by the following average composition formula (6) including at least one silicone having a carbon-carbon double bond represented by the following general formula (5), and a vinyl compound <B> including a compound <A> having a carbon-carbon double bond and an epoxy group, simultaneously to a SiH unit of organohydrogensilicone represented by the following general formula (4) in the presence of a hydrosilylation catalyst,

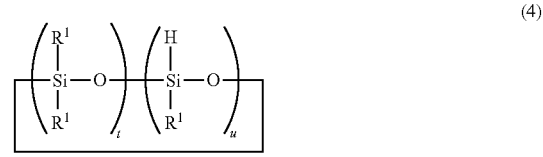

(4)

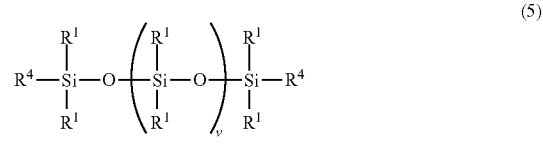

(5)

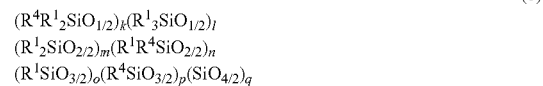

(6)

$(R^4R^1{}_2SiO_{1/2})_k(R^1{}_3SiO_{1/2})_l$
$(R^1{}_2SiO_{2/2})_m(R^1R^4SiO_{2/2})_n$
$(R^1SiO_{3/2})_o(R^4SiO_{3/2})_p(SiO_{4/2})_q$ wherein $R^1$, $R^2$ and $R^3$ are the same as defined above, $R^4$ each independently represents a monovalent aliphatic organic group formed of at least one structure which is selected from the group consisting of substituted or unsubstituted chain and branched structures and which has at least one carbon-carbon double bond and carbon atoms, including carbon atoms of the carbon-carbon double bond, of 2 or more and 6 or less;

wherein t, u and v are the same as defined above, k, l, m, n, o, p and q represent the numbers of moles of individual structural units present in silicone (1 mole) having a carbon-carbon double bond; k is a value beyond 0; and l, m, n, o, p and q are each a value of 0 or more; and the chain in the general formula (4) may be random or block.

14. The process for producing the epoxy silicone according to claim 13, wherein individual compounds are added in combination to a reaction system such that a number of mole (r1) of a SiH unit of organohydrogensilicone represented by the general formula (4);

a number of mole (r2) of the carbon-carbon double bond of silicone having a carbon-carbon double bond and represented by the general formula (5);

a number of mole (r3) of the carbon-carbon double bond of silicone having a carbon-carbon double bond represented by the average composition formula (6) except silicone having a carbon-carbon double bond and represented by the above general formula (5);

a number of mole (r4) of the carbon-carbon double bond of the compound <A> having a carbon-carbon double bond and an epoxy group; and a number of mole (r5) of the carbon-carbon double bond of a compound <B> except the compound <A> having a carbon-carbon double bond and an epoxy group, simultaneously satisfy the following formulas (A1) to (A5), and subjected to an addition reaction in the presence of a hydrosilylation catalyst, $$0.10 \leq r2/r1 \leq 0.75 \quad \text{formula (A1)}$$

$$0.25 \leq r4/r1 \quad \text{formula (A2)}$$

$$0 \leq r3 \quad \text{formula (A3)}$$

$$0 \leq < r5 \quad \text{formula (A4)}$$

$$1 \leq (r2+r3+r4+r5)/r1 \leq 5 \quad \text{formula (A5).}$$

15. The process for producing the epoxy silicone according to claim 1 or 2, comprising a two-stage process including:

a first step of adding a vinyl compound <B> including a compound <A> having a carbon-carbon double bond, and an epoxy group to a SiH unit of organohydrogensilicone represented by the following general formula (4); and a second step of adding silicone having a carbon-carbon double bond represented by the following average composition formula (6) including at least silicone having a carbon-carbon double bond represented by the following general formula (5), in the presence of a hydrosilylation catalyst,

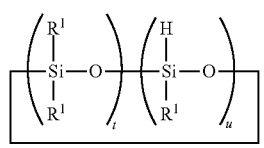

(4)

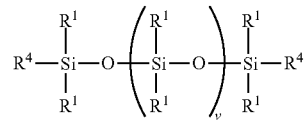

(5)

$$(R^4R^1_2SiO_{1/2})_k(R^1_3SiO_{1/2})_l$$
$$(R^1_2SiO_{2/2})_m(R^1R^4SiO_{2/2})_n$$
$$(R^1SiO_{3/2})_o(R^4SiO_{3/2})_p(SiO_{4/2})_q$$

(6)

wherein $R^1$, $R^2$, $R^3$ and $R^4$ are the same as defined above; t, u, v, k, l, m, n, o, p and q in the formula are the same as defined above; and the chain in the general formula (4) may be random or block.

16. The process for producing the epoxy silicone according to claim 15, wherein, in the first step, individual compounds are added in combination to a reaction system such that a number of mole (s1) of the SiH unit of organohydrogensilicone represented by the general formula (4);

a number of mole (s2) of the carbon-carbon double bond of the compound <A> having a carbon-carbon double bond and an epoxy group; and a number of mole (s3) of the carbon-carbon double bond of a vinyl compound <B> except the compound <A> having a carbon-carbon double bond and an epoxy group simultaneously satisfy the following formulas (B1) to (B3), and subjected to an addition reaction; and subsequently, in the second step, individual compounds are added in combination to the reaction system such that the numbers of mole (s1) to (s3);

a number of mole (s4) of the carbon-carbon double bond of silicone having a carbon-carbon double bond and represented by the general formula (5); and a number of mole (s5) of the carbon-carbon double bond of silicone having a carbon-carbon double bond and represented by the average composition formula (6) except the silicone having a carbon-carbon double bond and represented by the general formula (5), simultaneously satisfy the following formulas (B4) to (B6), and subjected to an addition reaction, in the presence of a hydrosilylation catalyst, $$0 \leq s3 \quad \text{(B1)}$$

$$0.25 \leq s2/s1 \leq 0.90 \quad \text{formula (B2)}$$

$$0.25 \leq (s2+s3)/s1 \leq 0.90 \quad \text{formula (B3)}$$

$$0 \leq s5 \quad \text{formula (B4)}$$

$$0.10 \leq s4/s1 \quad \text{formula (B5)}$$

$$1.0 \leq (s4+s5)/[s1-(s2+s3)] \leq 3.0 \quad \text{formula (B6).}$$

17. An encapsulant for a light-emitting device, comprising the curable mix composition according to claim 7.

18. A light-emitting component sealed with the encapsulant for a light-emitting device according to claim 17.

* * * * *